(12) United States Patent
Usami

(10) Patent No.: US 10,734,541 B2
(45) Date of Patent: Aug. 4, 2020

(54) METHOD OF MANUFACTURING SEMICONDUCTOR DEVICE

(71) Applicant: Renesas Electronics Corporation, Tokyo (JP)

(72) Inventor: Tatsuya Usami, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 91 days.

(21) Appl. No.: 16/057,858

(22) Filed: Aug. 8, 2018

(65) Prior Publication Data

US 2019/0123233 A1   Apr. 25, 2019

(30) Foreign Application Priority Data

Oct. 19, 2017 (JP) ................. 2017-202277

(51) Int. Cl.
| | |
|---|---|
| *H01L 31/18* | (2006.01) |
| *H01L 31/0216* | (2014.01) |
| *H01L 31/028* | (2006.01) |
| *H01L 31/109* | (2006.01) |
| *H01L 31/02* | (2006.01) |
| *H01L 31/0352* | (2006.01) |

(52) U.S. Cl.
CPC .... *H01L 31/1804* (2013.01); *H01L 31/02005* (2013.01); *H01L 31/028* (2013.01); *H01L 31/02161* (2013.01); *H01L 31/035281* (2013.01); *H01L 31/109* (2013.01)

(58) Field of Classification Search
CPC ....... C30B 25/005; C30B 25/02; C30B 25/00; H01L 21/0206; H01L 21/02065; H01L 21/02334; H01L 31/1804; H01L 31/02161; H01L 31/028; H01L 31/109; H01L 31/02005; H01L 31/035281
See application file for complete search history.

(56) References Cited

U.S. PATENT DOCUMENTS

| | | | |
|---|---|---|---|
| 6,228,728 B1 | 5/2001 | Furukawa et al. | |
| 2016/0099251 A1* | 4/2016 | Yamamoto | .............. H01L 21/84 257/350 |
| 2017/0012143 A1* | 1/2017 | Usami | ................. H01L 31/0288 |
| 2017/0031095 A1* | 2/2017 | Nakashiba | ............. G02B 6/122 |

FOREIGN PATENT DOCUMENTS

JP        2000-091570 A     3/2000

* cited by examiner

*Primary Examiner* — Latanya N Crawford
(74) *Attorney, Agent, or Firm* — Mattingly & Malur, PC

(57) ABSTRACT

A method of manufacturing the semiconductor device includes: (a) providing a substrate having a semiconductor layer; (b) forming a first insulating film over an insulating layer so as to cover the semiconductor layer; (c) forming an opening extending through the first insulating film and reaching the semiconductor layer; (d) forming, over the semiconductor layer exposed at a bottom surface of the opening, a semiconductor portion having a thickness smaller than that of the first insulating film over the semiconductor layer by a selective epitaxial growth method; (e) forming a second insulating film over the first insulating film and the semiconductor portion; (f) removing the second insulating film from over the first insulating film, while leaving the second insulating film in the opening; (g) removing a semiconductor particle formed over the first insulating film in the (d); and (h) forming a third insulating film over the first insulating film.

9 Claims, 31 Drawing Sheets

METHOD OF MANUFACTURING SEMICONDUCTOR DEVICE

CROSS-REFERENCE TO RELATED APPLICATIONS

The disclosure of Japanese Patent Application No. 2017-202277 filed on Oct. 19, 2017 including the specification, drawings and abstract is incorporated herein by reference in its entirety.

BACKGROUND

The present invention relates to a method of manufacturing a semiconductor device, and particularly to a manufacturing technique for a semiconductor device having a semiconductor layer formed by an epitaxial growth method.

Japanese Unexamined Patent Publication No. 2000-91570 (Patent Document 1) describes a method of manufacturing a semiconductor device which grows a semiconductor thin film by vapor-phase selective epitaxial growth.

RELATED ART DOCUMENT

Patent Document

[Patent Document 1] Japanese Unexamined Patent Publication No. 2000-91570

SUMMARY

The present inventors have studied a method of manufacturing a semiconductor device having a semiconductor layer formed by an epitaxial growth method. In this case, unless a manufacturing process of the semiconductor layer is inventively improved, the reliability of the semiconductor device is degraded. Accordingly, it is desired to improve the reliability of the semiconductor device by inventively improving the method of manufacturing the semiconductor device.

Other problems and novel features of the present invention will become apparent from a statement in the present specification and the accompanying drawings.

A method of manufacturing a semiconductor device according to an embodiment includes: (a) providing a substrate having a first layer made of a semiconductor layer or a conductor layer over a main surface thereof; (b) forming a first insulating film over the main surface of the substrate so as to cover the first layer therewith; and (c) forming an opening extending through the first insulating film and reaching the first layer. The method of manufacturing the semiconductor device further includes: (d) forming, over the first layer exposed at a bottom surface of the opening, a first semiconductor layer having a thickness smaller than that of the first insulating film over the first layer by a selective epitaxial growth method; and (e) forming a second insulating film over the first insulating film and over the first semiconductor layer. The method of manufacturing the semiconductor device further includes: (f) removing the second insulating film from over the first insulating film, while leaving the second insulating film over the first semiconductor layer in the opening; (g) removing a semiconductor particle formed over the first insulating film in the (d); and (h) forming a third insulating film over the first insulating film.

The embodiment can improve the reliability of the semiconductor device.

DETAILED DESCRIPTION

Figure 1:
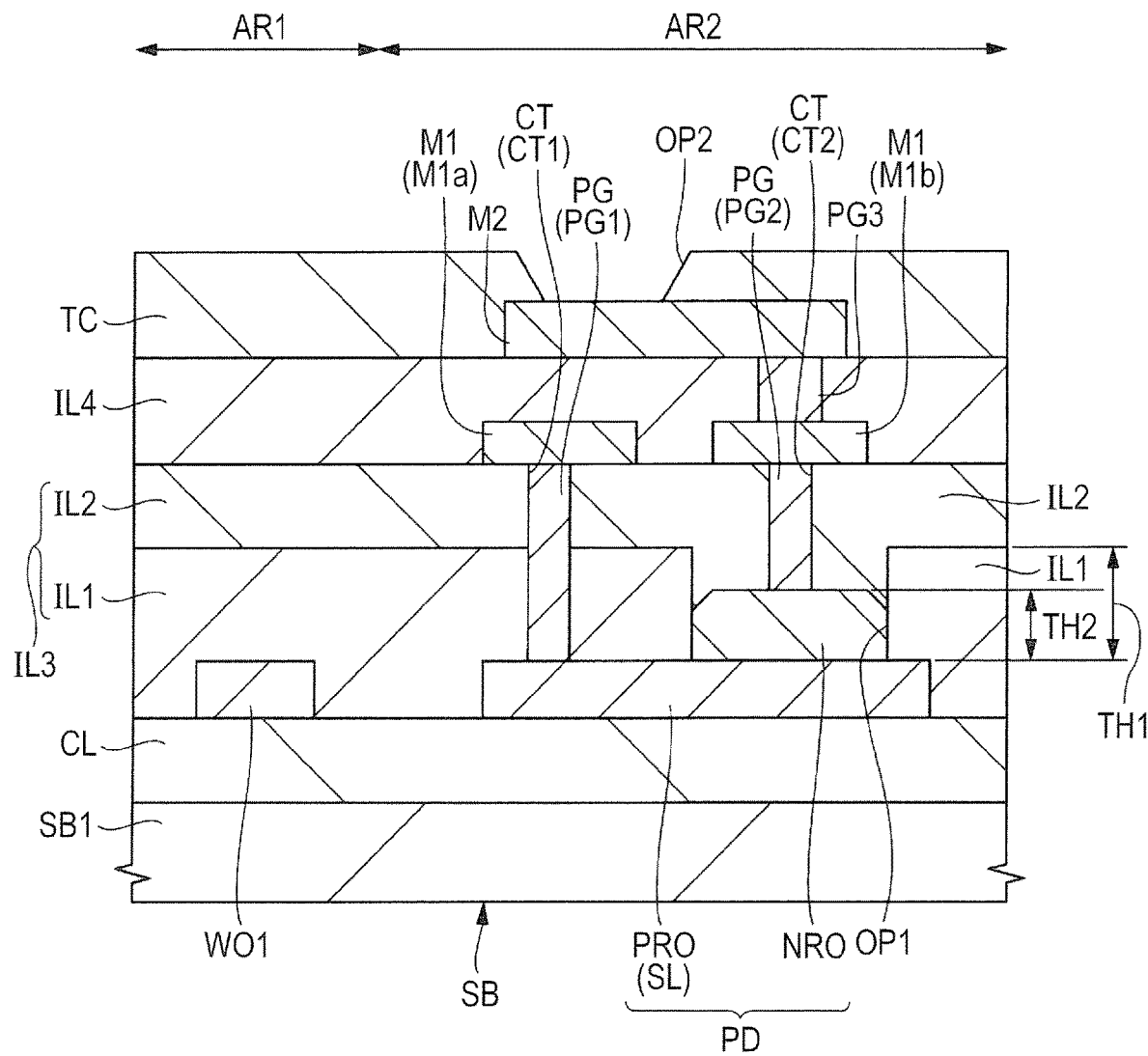
FIG. 1 is a main-portion cross-sectional view showing a semiconductor device in an embodiment.

In the following embodiments, a description of the same or like parts will not be repeated in principle unless particularly necessary.

Also, in the following embodiments, if necessary for the sake of convenience, each of the embodiments will be described by being divided into a plurality of sections or embodiments. However, they are by no means irrelevant to each other unless particularly explicitly described otherwise, but are in relations such that one of the sections or embodiments is modifications, details, supplementary explanation, and so forth of part or the whole of the others.

Also, in the following embodiments, when the number and the like (including the number, numerical value, amount, range, and the like) of elements are mentioned, they are not limited to the specified numbers unless particularly explicitly described otherwise or unless they are obviously limited to specified numbers in principle. The number and the like of the elements may be not less than or not more than the specified numbers.

Also, in the following embodiments, it goes without saying that the components (including also elements, steps, and the like) thereof are not necessarily indispensable unless particularly explicitly described otherwise or unless the components are considered to be obviously indispensable in principle.

It will also be appreciated that, when the wording "comprised of A", "comprising A", "having A", or "including A" is used for a component A, needless to say, it does not exclude a component other than the component A unless it is shown particularly explicitly that the component A is the only one component. Likewise, when the shapes, positional relationships, and the like of the components and the like are mentioned in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe the embodiments in detail on the basis of the drawings. Note that, throughout all the drawings for illustrating the embodiments, members having the same functions are designated by the same reference numerals, and a repeated description thereof is omitted. For improved clarity of illustration, even a plan view may be hatched.

First Embodiment

[About Structure of Semiconductor Device]

Figure 2:
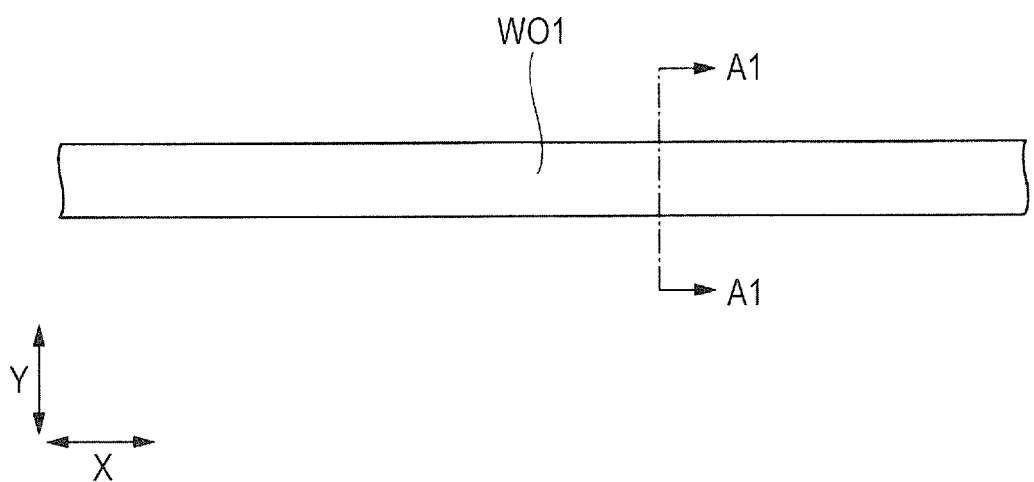
FIG. 2 is a main-portion plan view of the semiconductor device in the embodiment.
Figure 3:
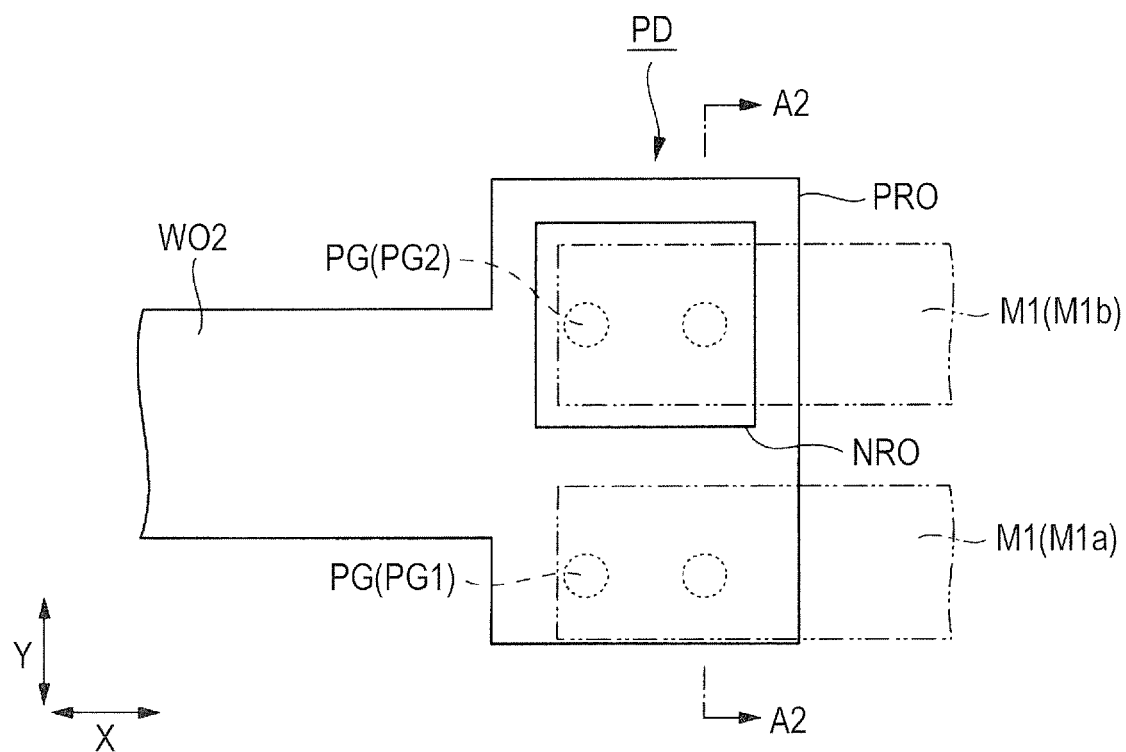
FIG. 3 is a main-portion plan view of the semiconductor device in the embodiment.

FIG. 1 is a main-portion cross-sectional view showing a semiconductor device in an embodiment. FIGS. 2 and 3 are main-portion plan views of the semiconductor device in the present first embodiment. FIG. 2 shows a plan view of an area AR1. FIG. 3 shows a plan view of an area AR2. A cross-sectional view at a position along the line A1-A1 in FIG. 2 corresponds to a cross section of the area AR1 in FIG. 1. A cross-sectional view at a position along the line A2-A2 in FIG. 3 corresponds to a cross section of the area AR2 in FIG. 1.

Note that, in FIG. 3, an optical waveguide WO2 and semiconductor portions PRO and NRO are shown by the solid lines, plugs PG1 and PG2 are shown by the broken lines, and wires M1a and M1b are shown by two-dot-dash lines.

As shown in FIG. 1, the semiconductor device in the present first embodiment has a base (supporting substrate) SB1, an insulating layer CL formed over the base SB1, and a semiconductor layer (second semiconductor layer) SL formed over the insulating layer CL. The base SB1, the insulating layer CL, and the semiconductor layer SL form an SOI (Silicon on Insulator) substrate SB.

The base SB1 is the supporting substrate supporting the insulating layer CL and a structure above the insulating layer CL, which is also a semiconductor substrate. The base SB1 is preferably made of a monocrystalline silicon substrate, which is, e.g., a p-type monocrystalline silicon substrate having a (100) plane orientation and a specific resistance of about 5 to 50 Ωcm. The insulating layer CL is preferably made of a silicon oxide film. The insulating layer CL can also be regarded as a BOX (Buried Oxide) layer. The semiconductor layer SL is preferably made of a silicon layer (more specifically, a monocrystalline silicon layer) and can also be regarded as an SOI (Silicon on Insulator) layer.

The SOI substrate SB has the area AR1 and the area AR2. The area AR1 and the area AR2 correspond to the different two-dimensional areas of the main surface of the same SOI substrate SB. In the area AR1, an optical signal transmission line (optical waveguide WO1) is formed while, in the area AR2, an optical receiver (germanium optical receiver PD) is formed, the details of which will be described later. Note that the area AR1 and the area AR2 may be or may not be adjacent to each other. However, for easier understanding, FIG. 1 shows the areas AR1 and AR2 which are adjacent in this order.

<Optical Signal Line>

As shown in FIGS. 1 and 2, in the area AR1, the optical waveguide WO1 as a transmission line for various optical signals (i.e., optical signal line) is formed.

The optical waveguide WO1 is made of the semiconductor layer (silicon layer) SL and formed over the insulating layer CL. The lower surface of the optical waveguide WO1 is in contact with the upper surface of the insulating layer CL. In the optical waveguide WO1, no impurity ion is implanted. In other words, the optical waveguide WO1 is made of an intrinsic semiconductor, i.e., an i (intrinsic) type semiconductor. In the case in FIG. 2, the optical waveguide WO1 has a linear pattern extending in an X-direction. The optical signal introduced into the optical waveguide WO1 travels in the optical waveguide WO1 along the extending direction of the optical waveguide WO1, which applies also to the optical waveguide WO2 described later.

Note that the X-direction and a Y-direction which are shown in FIGS. 2 and 3 are orthogonal to each other and are also generally parallel with the main surface of the SOI substrate SB (or with the main surface of the base SB1). In the cross-sectional view of FIG. 1, a direction perpendicular to the paper surface with FIG. 1 corresponds to the X-direction.

As shown in FIG. 1, over the insulating layer CL, an interlayer insulating film IL3 is formed so as to cover the optical waveguide WO1. Preferably, the interlayer insulating film IL3 is made of a silicon oxide film. Specifically, the interlayer insulating film IL3 is made of a multi-layer film including an insulating film IL1 and an insulating film IL2 over the insulating film IL1. Preferably, each of the insulating film IL1 and the insulating film IL2 is made of a silicon oxide film. Since the insulating film IL1 is in a lower layer and the insulating film IL2 is in an upper layer, the insulating film IL1 is in contact with the optical waveguide WO1. The optical waveguide WO1 is surrounded circumferentially (from upper and lower sides and from left and right sides) by the insulating layer CL and the interlayer insulating film IL3 (more specifically, the insulating film IL1). The optical waveguide WO1 can function as a core layer, while the insulating layer CL and the interlayer insulating film IL3 can function as a clad layer. The refractive indices of the insulating layer CL and the interlayer insulating film IL3 which serve as the clad layer are lower than the refractive indices of the optical waveguide WO1 and the optical waveguide WO2 described later.

By way of example, FIG. 1 shows the optical waveguide WO1 having a quadrilateral (rectangular) cross-sectional shape. However, it is also possible to provide an optical waveguide having a protruding (rib-shaped) cross-sectional shape over the insulating layer CL.

In the area AR1, over the interlayer insulating film, an interlayer insulating film IL4 is formed.

<Optical Receiver>

Referring to FIGS. 1 and 3, a description will be given of the germanium optical receiver (photoelectric conversion portion) PD formed in the area AR2. In the area AR2, the germanium optical receiver PD is formed. The germanium optical receiver PD is a photoelectric conversion element (photoelectric conversion portion or photodetector) which converts an optical signal to an electric signal.

The germanium optical receiver PD includes the p-type semiconductor portion (semiconductor layer) PRO and the n-type semiconductor portion (semiconductor layer) NRO.

The p-type semiconductor portion PRO and the n-type semiconductor portion NRO form an element with a pn junction structure (diode with a pn structure) and thus form the germanium optical receiver PD.

Note that, instead of germanium, a compound including germanium such as silicon germanium may also be used.

The p-type semiconductor portion PRO is made of the semiconductor layer (silicon layer) SL and formed over the insulating layer CL. The lower surface of the p-type semiconductor portion PRO is in contact with the upper surface of the insulating layer CL. In the p-type semiconductor portion PRO, a p-type impurity is introduced. The thickness (height) of the p-type semiconductor portion PRO is about the same as the thickness (height) of each of the waveguides WO1 and WO2.

The p-type semiconductor portion PRO is integrally coupled (connected) to the optical waveguide WO2. In the case in FIG. 3, to one end portion of the optical waveguide WO2 extending in the X-direction, the p-type semiconductor portion PRO is integrally coupled (connected). This allows the optical signal that has propagated in the optical waveguide WO2 to be introduced into the p-type semiconductor portion PRO. The optical waveguide WO2 is made of the semiconductor layer SL and formed over the insulating layer CL. The lower surface of the optical waveguide WO2 is in contact with the upper surface of the insulating layer CL. Note that the optical waveguide WO2 is shown in FIG. 3, but is not shown in the cross section of FIG. 1. In the optical waveguide WO2, no impurity ion is implanted so that the optical waveguide WO2 is made of an intrinsic semiconductor (i type semiconductor). In short, the optical waveguide WO2 and the p-type semiconductor portion PRO are integrally formed and are each formed over the insulating layer CL. However, no impurity is introduced in the optical waveguide WO2, while a p-type impurity is introduced in the p-type semiconductor portion PRO.

The n-type semiconductor portion NRO is formed over the p-type semiconductor portion PRO. The lower surface of the n-type semiconductor portion NRO is in contact with the upper surface of the p-type semiconductor portion PRO. Between the n-type semiconductor portion NRO and the p-type semiconductor portion PRO (at the interface therebetween), a pn junction (pn junction surface) is formed. The n-type semiconductor portion NRO is made of a germanium (Ge) layer (first semiconductor layer) in which an n-type impurity is introduced. The area (two-dimensional size) of the n-type semiconductor portion NRO is smaller than the area (two-dimensional size) of the p-type semiconductor portion PRO. In plan view, the n-type semiconductor portion NRO is included in the p-type semiconductor portion PRO. Germanium (Ge) has a forbidden band width smaller than that of silicon (Si). This allows for detection of, e.g., infrared light at wavelengths up to about 1.6 μm corresponding to a communication wavelength band using the pn junction formed between n-type germanium and p-type silicon.

It is stated above that the germanium layer is made of n-type germanium, but it is also possible to introduce an impurity only into a portion of the surface of the germanium layer. In this case, a non-doped germanium layer is present under a doped germanium layer so that a pin junction type is formed.

The germanium optical receiver PD has the p-type semiconductor portion PRO as a first semiconductor portion and a second semiconductor portion over the first semiconductor portion (p-type semiconductor portion PRO). The second semiconductor portion is made of the n-type semiconductor portion NRO. In short, the second semiconductor portion included in the germanium optical receiver PD includes the germanium layer (semiconductor portion NRO) formed over the first semiconductor portion (p-type semiconductor portion PRO). The second semiconductor portion is formed in an opening OP1 of the insulating film IL1. In particular, a thickness TH2 of the second semiconductor portion (n-type semiconductor portion NRO) is smaller than a thickness TH1 of the insulating film IL1 over the first semiconductor portion (p-type semiconductor portion PRO). A contact hole CT2 described later reaches the second semiconductor portion, and the plug PG2 described later is electrically coupled to the second semiconductor portion.

In the area AR2, over the insulating layer CL, the interlayer insulating film IL3 is formed so as to cover the germanium optical receiver PD (the p-type semiconductor portion PRO and the n-type semiconductor portion NRO). The insulating layer CL and the interlayer insulating film IL3 can function as the clad layer.

Note that, over the n-type semiconductor portion NRO, the insulating film IL1 is not formed, but the insulating film IL2 is formed. This is because, after the n-type semiconductor portion NRO is formed in the opening OP1 formed in the insulating film IL1, the insulating film IL2 is formed. As a result, the interlayer insulating film IL3 located over the n-type semiconductor portion NRO is made of the insulating film IL2, while the interlayer insulating film IL3 other than that located over the n-type semiconductor portion NRO is made of a multi-layer film including the insulating film IL1 and the insulating film IL2.

Note that, over the portion of the p-type semiconductor portion PRO which is uncovered with the n-type semiconductor portion NRO and over the n-type semiconductor portion NRO, respective contact holes CT extending through the interlayer insulating film IL3 are formed. In the contact holes CT, conductive plugs PG are embedded. It is assumed that the contact hole CT formed over the portion of the p-type semiconductor portion PRO which is uncovered with the n-type semiconductor portion NRO is referred to as a contact hole (opening) CT1, while the contact hole CT formed over the n-type semiconductor portion NRO is referred to as the contact hole (opening) CT2. The contact hole CT1 is formed in the interlayer insulating film IL3 (insulating films IL1 and IL2), while the contact hole CT2 is formed in the insulating film IL2. The contact hole CT1 formed in the interlayer insulating film IL3 reaches the portion of the p-type semiconductor portion PRO which is uncovered with the n-type semiconductor portion NRO. At the bottom portion of the contact hole CT1, a portion of the upper surface of the p-type semiconductor portion PRO is exposed. On the other hand, the contact hole CT2 formed in the insulating film IL2 reaches the n-type semiconductor portion NRO. At the bottom portion of the contact hole CT2, a portion of the upper surface of the n-type semiconductor portion NRO is exposed.

The plug PG embedded in the contact hole CT1 is referred to as the plug PG1, while the plug PG embedded in the contact hole CT2 is referred to as the plug PG2. Over the insulating film IL2 in which the plugs PG1 and PG2 are embedded, wires M1 are formed. The wires M1 are first-layer wires and include the wires M1a and M1b.

The lower surface of the plug PG1 is in contact with the p-type semiconductor portion PRO and electrically coupled to the p-type semiconductor portion PRO. The upper surface of the plug PG1 is in contact with the wire M1a and electrically coupled to the wire M1a. On the other hand, the lower surface of the plug PG2 is in contact with the n-type semiconductor portion NRO and electrically coupled to the n-type semiconductor portion NRO. The upper surface of the plug PG2 is in contact with the wire M1b and electrically coupled to the wire M1b. Consequently, the p-type semiconductor portion PRO is electrically coupled to the wire M1a via the plug PG1, while the n-type semiconductor portion NRO is electrically coupled to the wire M1b via the plug PG2.

As a result, a DC current allowed to flow by a photovoltaic effect in the pn junction portion included in the germanium optical receiver PD can be extracted to the outside via the plugs PG1 and PG2 and the wires M1a and M1b. In other words, an optical signal can be extracted as an electric signal.

Next, referring to FIG. 1, a description will be given of a structure located above the interlayer insulating film IL3 in the areas AR1 and AR2.

In the areas AR1 and AR2, over the interlayer insulating film IL3, the interlayer insulating film IL4 is formed so as to cover the wires M1. In the interlayer insulating film IL4, a through hole (through opening) is formed and, in the through hole, a conductive plug PG3 is embedded. Over the interlayer insulating film IL4 in which the plug PG3 is embedded, a wire M2 is formed. The wire M2 is a second-layer wire. The plug PG3 is disposed between the wires M1 and M2 to electrically couple the wire M1 and the wire M2 to each other.

Over the interlayer insulating film IL4, a protective film TC is formed so as to cover the wire M2. Note that the interlayer insulating film IL4 is made of, e.g., a silicon oxide film. Silicon oxide is appropriate as the material of the clad layer. The protective film TC is made of, e.g., silicon oxynitride. The refractive index n of silicon oxide is about 1.45, while the refractive index n of silicon oxynitride is about 1.82. In the protective film TC, an opening OP2 exposing a portion of the wire M2 is formed. The portion of the wire M2 which is exposed from the opening OP2 serves as a pad portion (bonding pad or external coupling portion).

[About Manufacturing Process of Semiconductor Device]

Next, a manufacturing process of the semiconductor device in the present first embodiment will be described, while a structure of the semiconductor device in the present first embodiment will be shown more clearly. FIGS. 4 to 18 are main-portion cross-sectional views of the semiconductor device in the present first embodiment during the manufacturing process thereof, which show cross sections equivalent to that shown in FIG. 1 described above.

Figure 4:
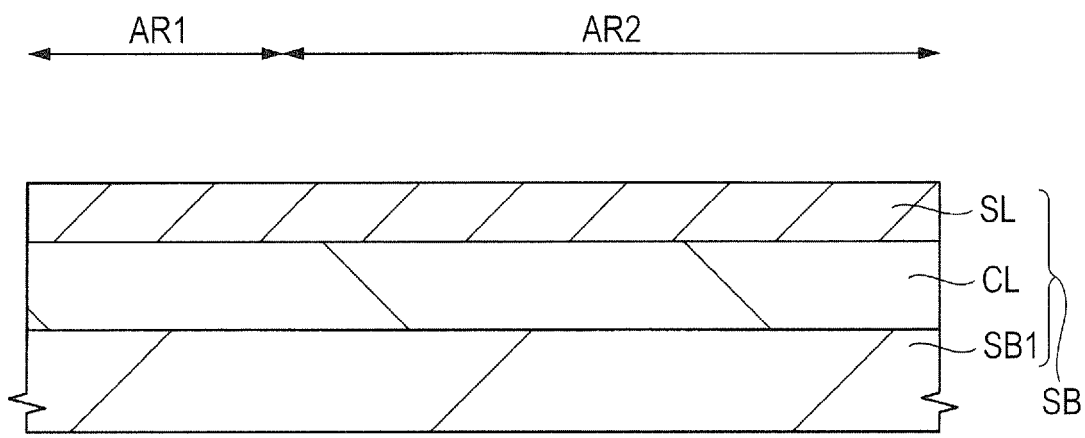
FIG. 4 is a main-portion cross-sectional view of the semiconductor device in the embodiment during the manufacturing process thereof.

First, as shown in FIG. 4, the SOI substrate SB including the base (supporting substrate) SB1, the insulating layer CL formed over the base SB1, and the semiconductor layer SL formed over the insulating layer CL is provided. The base SB1 is preferably made of a monocrystalline silicon substrate. The insulating layer CL is preferably made of a silicon oxide film and has a thickness of, e.g., about 2 to 3 µm. The semiconductor layer SL is preferably made of a silicon layer (more specifically, a monocrystalline silicon layer) and has a thickness of, e.g., about 180 to 250 nm. A method of manufacturing the SOI substrate SB is not limited, and the SOI substrate SB can be manufactured using, e.g., an SIMOX (Silicon Implanted Oxide) method, a bonding method, a smart cut process, or the like.

Figure 5:
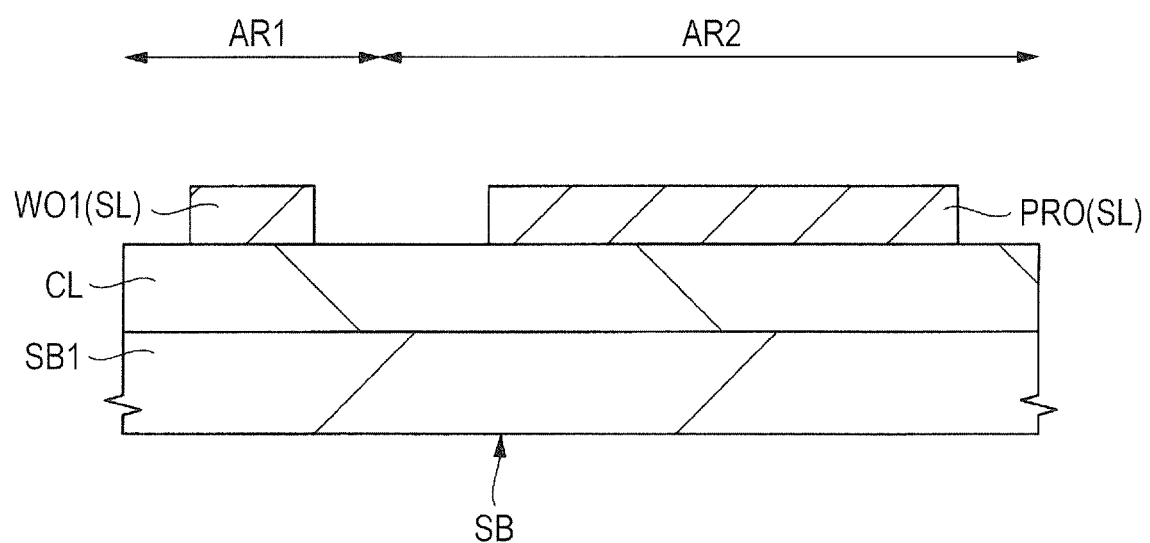
FIG. 5 is a main-portion cross-sectional view of the semiconductor device during the manufacturing process thereof, which is subsequent to FIG. 4.

Next, as shown in FIG. 5, the semiconductor layer SL is patterned using a photolithographic technique and an etching technique to form the optical waveguide WO1 and the semiconductor portion PRO.

For example, by forming a photoresist pattern (not shown) over the semiconductor layer SL using a photolithographic technique and then etching the semiconductor layer SL using the photoresist pattern as an etching mask, the optical waveguide WO1 and the semiconductor portion PRO can be formed. Subsequently, the photoresist pattern is removed by asking or the like. Each of the optical waveguide WO1 and the semiconductor portion PRO is made of the patterned semiconductor layer SL and formed over the insulating layer CL. At this stage, the optical waveguides WO1 and WO2 and the semiconductor portion PRO have not been doped with any impurity. Note that the optical waveguide WO2 is not shown in the cross sections of FIGS. 4 to 18, but is shown in FIG. 3 described above. The optical waveguide WO2 is formed integrally with the semiconductor portion PRO.

Next, by introducing a p-type impurity into the semiconductor PRO using an ion implantation method or the like, the semiconductor portion PRO is changed into the p-type semiconductor portion PRO. For example, using a photoresist pattern formed using a photolithographic technique as a mask (ion implantation inhibiting mask), a p-type impurity is ion-implanted into the semiconductor portion PRO. Thus, the p-type semiconductor portion PRO is formed. Note that, during the ion implantation, the optical waveguides WO1 and WO2 are covered with the photoresist pattern, and therefore the p-type impurity (or an n-type impurity) is not implanted therein. After the introduction of the p-type impurity (and the n-type impurity), heat treatment for activating the introduced impurities can also be performed.

Figure 6:
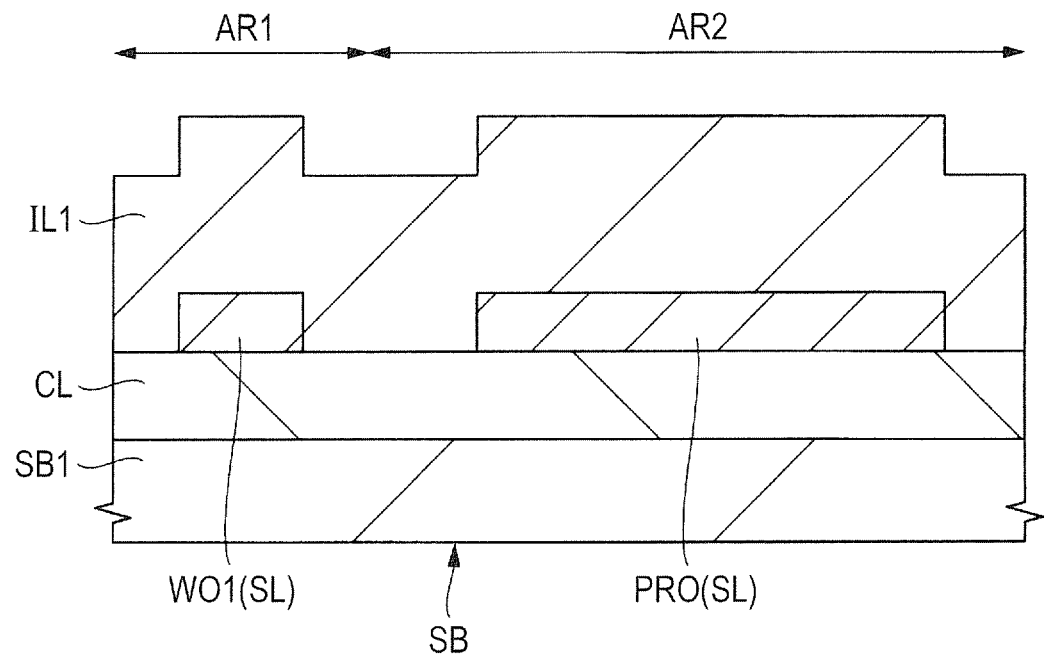
FIG. 6 is a main-portion cross-sectional view of the semiconductor device during the manufacturing process thereof, which is subsequent to FIG. 5.

Next, as shown in FIG. 6, over the SOI substrate SB, i.e., over the insulating layer CL, the insulating film IL1 is formed so as to cover the optical waveguides WO1 and WO2 and the semiconductor portion PRO. The insulating film IL1 is preferably made of a silicon oxide film, and is more preferably made of a high-quality (high-density) silicon oxide film. By forming the insulating film IL1 of the high-quality (high-density) silicon oxide film, it is possible to allow the insulating film IL1 to function as the clad layer, as described above. The insulating film IL1 is formed using, e.g., an LPCVD (Low-Pressure Chemical Vapor Deposition) method. The LPCVD method allows a high-quality (high-density) silicon oxide film to be formed. As a raw material gas for the LPCVD method, e.g., monosilane and dinitrogen monoxide, only TEOS (Tetraethyl orthosilicate), TEOS and oxygen, or the like is used. A deposition temperature for the insulating film IL1 is, e.g., 600 to 700° C. The thickness of the formed insulating film IL1 is larger than the thickness of the semiconductor layer SL and is about 1 µm. Since the silicon oxide film formed by the LPCVD method has a low throughput, as the insulating film IL1, a multi-layer film including the silicon oxide film formed by the LPCVD method and a silicon oxide film formed by a PECVD (Plasma-Enhanced Chemical Vapor Deposition) method and having a high throughput may also be used.

Figure 7:
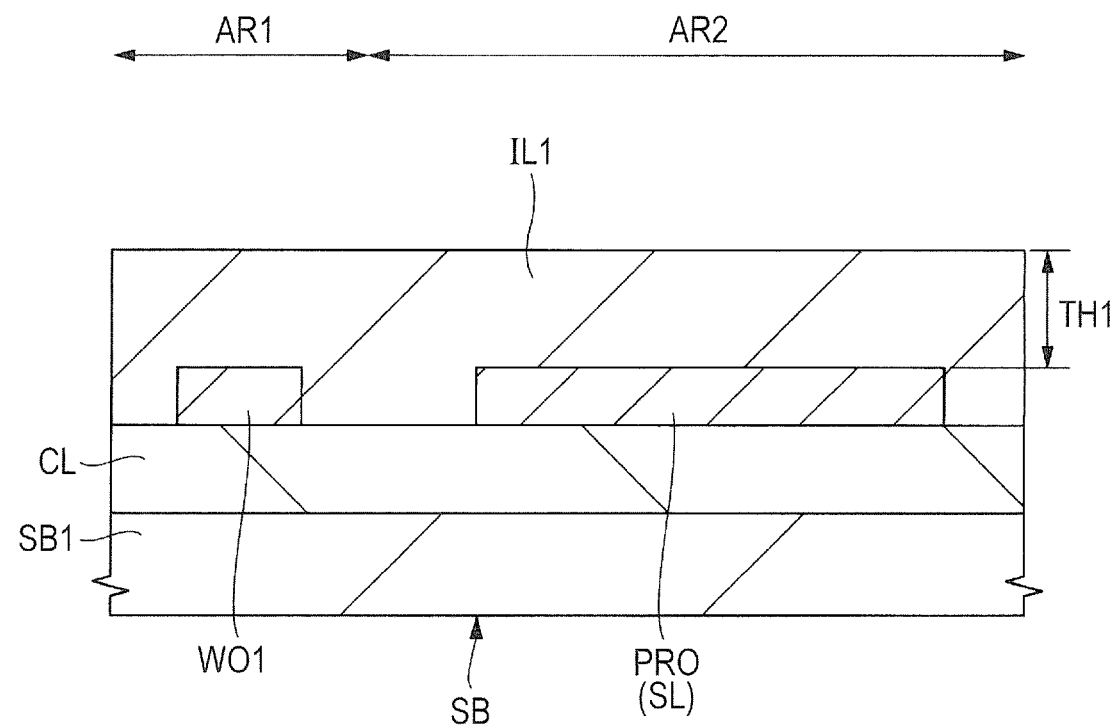
FIG. 7 is a main-portion cross-sectional view of the semiconductor device during the manufacturing process thereof, which is subsequent to FIG. 6.

Next, as shown in FIG. 7, after the formation of the insulating film IL1, the upper surface of the insulating film IL1 is subjected to polishing using a CMP (Chemical Mechanical Polishing) method or the like to be planarized. Even when the upper surface of the insulating film IL1 is polished, the optical waveguides WO1 and WO2 and the semiconductor portion PRO are not exposed. Note that the thickness TH1 of the insulating film IL1 over the p-type semiconductor portion PRO is a thickness after the insulating film IL1 is planarized. The thickness TH1 of the insulating film IL1 is about 700 nm.

Figure 8:
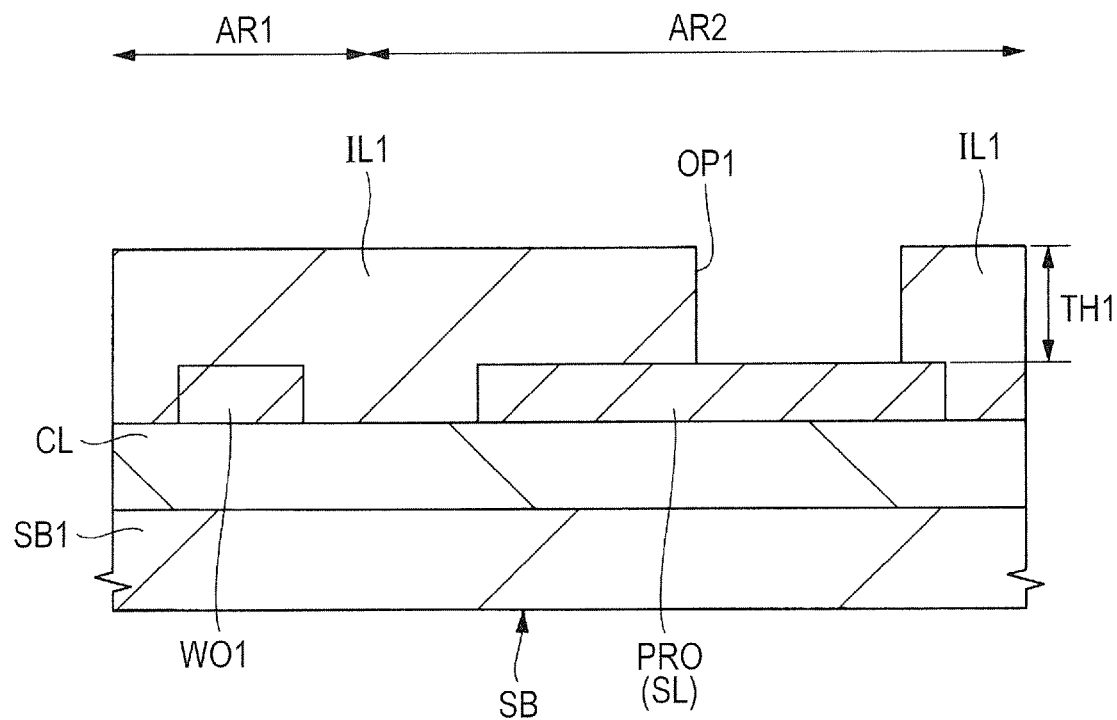
FIG. 8 is a main-portion cross-sectional view of the semiconductor device during the manufacturing process thereof, which is subsequent to FIG. 7.

Next, as shown in FIG. 8, using a photolithographic technique and an etching technique, the opening OP1 is formed in the insulating film IL1. The two-dimensional size (area) of the opening OP1 is smaller than the two-dimensional size of the p-type semiconductor portion PRO. The opening OP1 is included in the p-type semiconductor portion PRO in plan view. The opening OP1 extends through the insulating film IL1 to reach the semiconductor portion PRO. At the bottom portion of the opening OP1, a portion of the upper surface of the semiconductor portion PRO is exposed.

Figure 9:
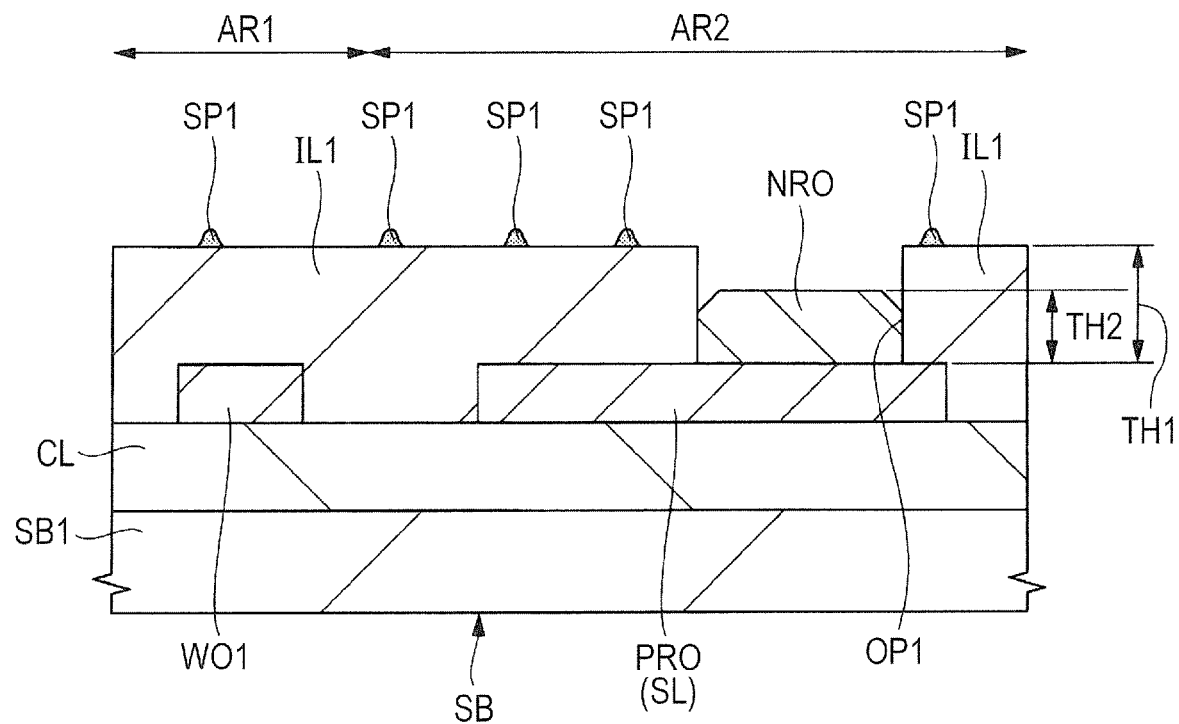
FIG. 9 is a main-portion cross-sectional view of the semiconductor device during the manufacturing process thereof, which is subsequent to FIG. 8.

Next, as shown in FIG. 9, over the p-type semiconductor portion PRO exposed at the bottom portion of the opening OP1, the n-type semiconductor portion (germanium layer) made of germanium (Ge) is formed. The n-type semiconductor portion NRO can be formed using an epitaxial growth method. In the opening OP1, the n-type semiconductor portion NRO is selectively formed over the p-type semiconductor portion PRO. Such a formation method is particularly referred to as a selective epitaxial growth method (the details of which will be described later). For example, the n-type semiconductor portion NRO can be formed by epitaxially growing a germanium layer containing an n-type impurity. However, in another form, the n-type semiconductor portion NRO can also be formed by epitaxially growing a germanium layer made of an intrinsic semiconductor and then introducing an n-type impurity into the germanium layer by an ion implantation method or the like. Thus, an element having a pn junction structure including the p-type semiconductor portion PRO made of silicon and the n-type semiconductor portion NRO made of germanium is formed.

As shown in FIG. 9, the n-type semiconductor portion (germanium layer) NRO formed by the epitaxial growth method has a generally trapezoidal cross-sectional shape. The thickness TH2 of the n-type semiconductor portion NRO is smaller than the thickness TH1 of the insulating film IL1 over the p-type semiconductor portion PRO. In other words, the upper surface of the n-type semiconductor potion NRO is lower in level than the upper surface of the insulating film IL1. In still other words, the insulating film IL1 is formed over the p-type semiconductor portion PRO such that the thickness TH1 thereof is larger than the thickness TH2 of the n-type semiconductor portion NRO. The thickness TH2 of the n-type semiconductor portion NRO is about 500 nm.

Note that, as shown in FIG. 9, when the n-type semiconductor portion (germanium layer) NRO is formed over the p-type semiconductor portion PRO, the selectivity of the selective epitaxial growth method collapses so that, over the insulating film IL1, semiconductor particles SP1 made of the same material as that of the n-type semiconductor portion NRO, i.e., germanium are formed.

Figure 10:
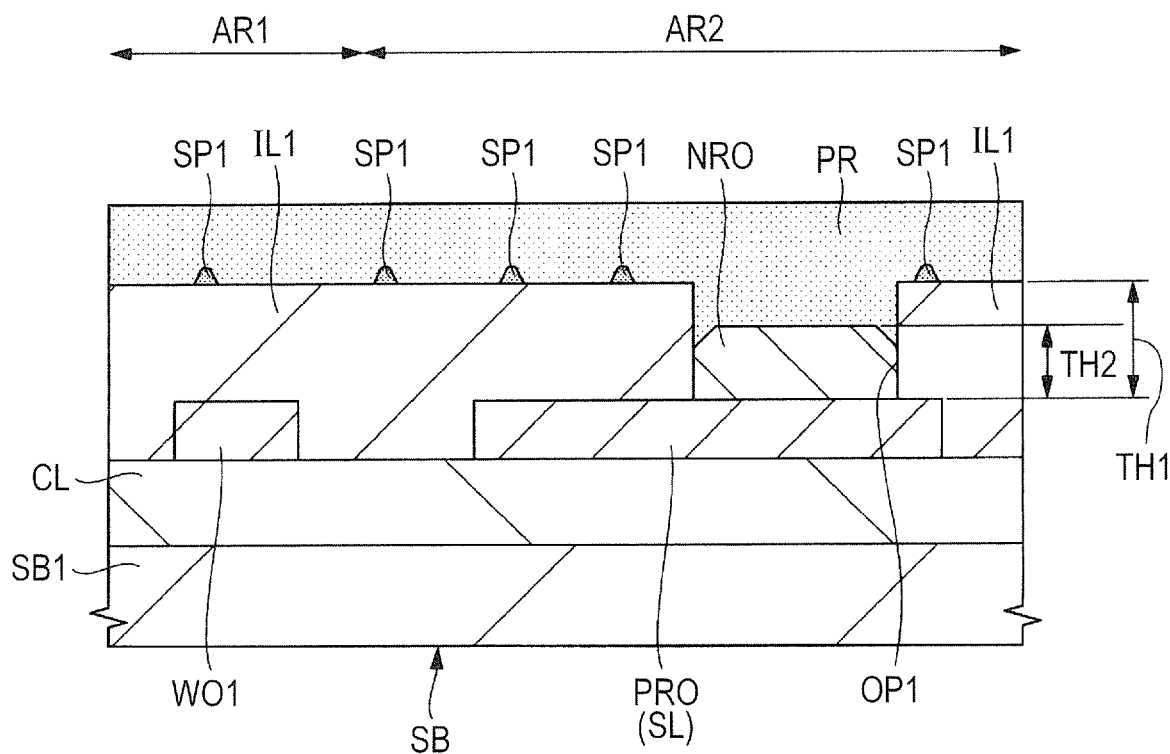
FIG. 10 is a main-portion cross-sectional view of the semiconductor device during the manufacturing process thereof, which is subsequent to FIG. 9.

Next, as shown in FIG. 10, over the insulating film IL1 including the n-type semiconductor portion NRO, a photoresist film (second insulating film) PR is formed. The photoresist film PR is embedded in the opening OP1 to overlie the n-type semiconductor portion NRO.

Figure 11:
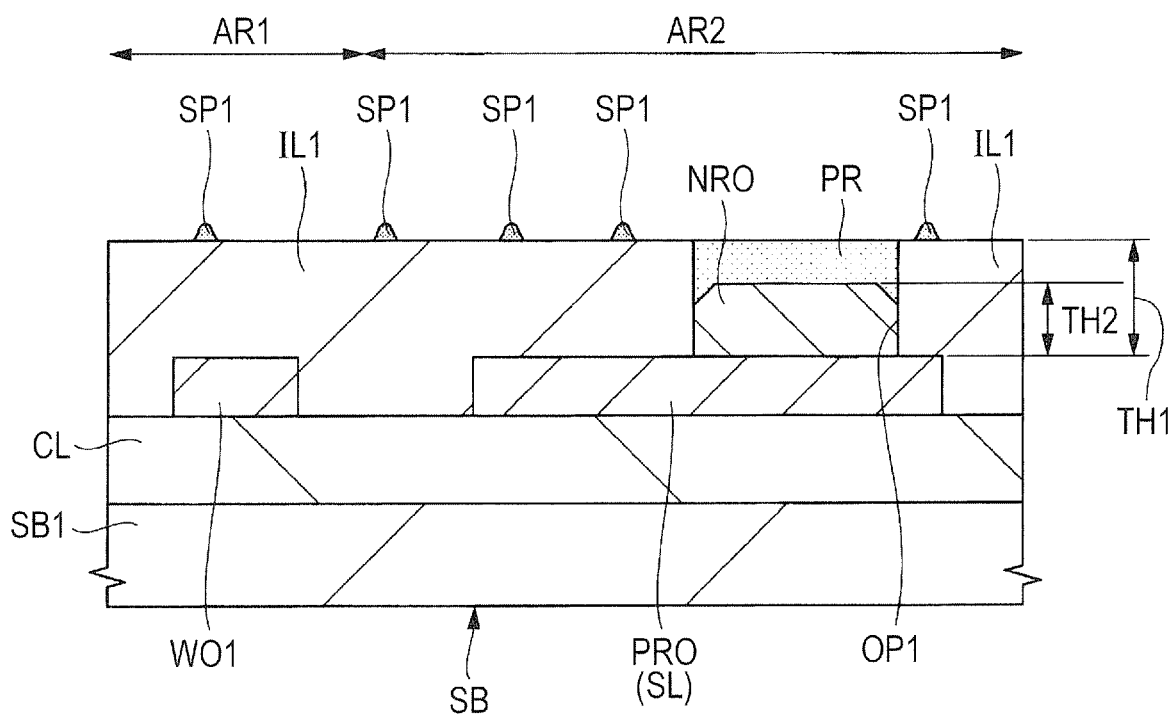
FIG. 11 is a main-portion cross-sectional view of the semiconductor device during the manufacturing process thereof, which is subsequent to FIG. 10.

Next, as shown in FIG. 11, the photoresist film PR is removed from over the insulating film IL1 to be left only over the n-type semiconductor portion NRO in the opening OP1. As a method of removing the photoresist film PR, a method which does not damage the insulating film IL1 is preferably used. For example, a resist etch-back process using an $O_2$ plasma or the like is used preferably. Note that the photoresist film PR over the insulating film IL1 may also be removed by a resist CMP method. In this case also, the photoresist film PR can be left only over the n-type semiconductor portion NRO in the opening OP1.

Figure 12:
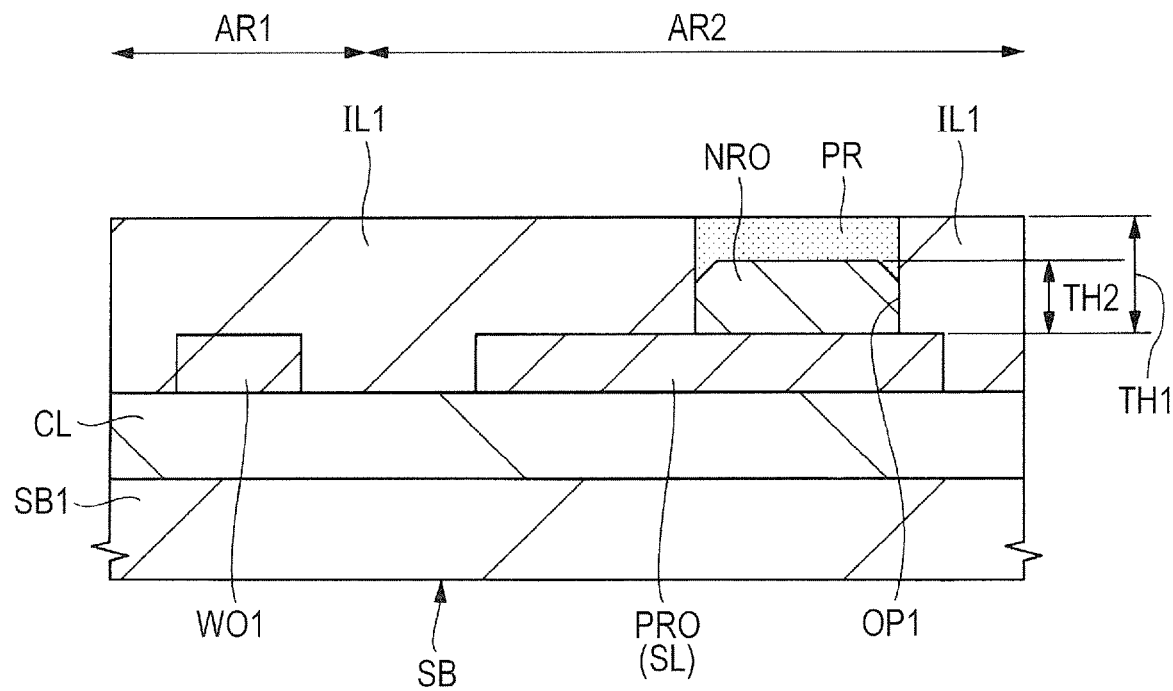
FIG. 12 is a main-portion cross-sectional view of the semiconductor device during the manufacturing process thereof, which is subsequent to FIG. 11.

Next, as shown in FIG. 12, the semiconductor particles SP1 are removed from over the insulating film IL1. The n-type semiconductor portion NRO made of the same material as that of the semiconductor particles SP1 is covered herein with the photoresist film PR and the insulating film IL1, and are therefore not removed. Examples of a method of removing the semiconductor particles SP1 include dry etching and wet etching. Preferably, dry etching using a halogen-based gas is used as a method which does not damage the insulating film IL1 and the photoresist film PR.

Figure 13:
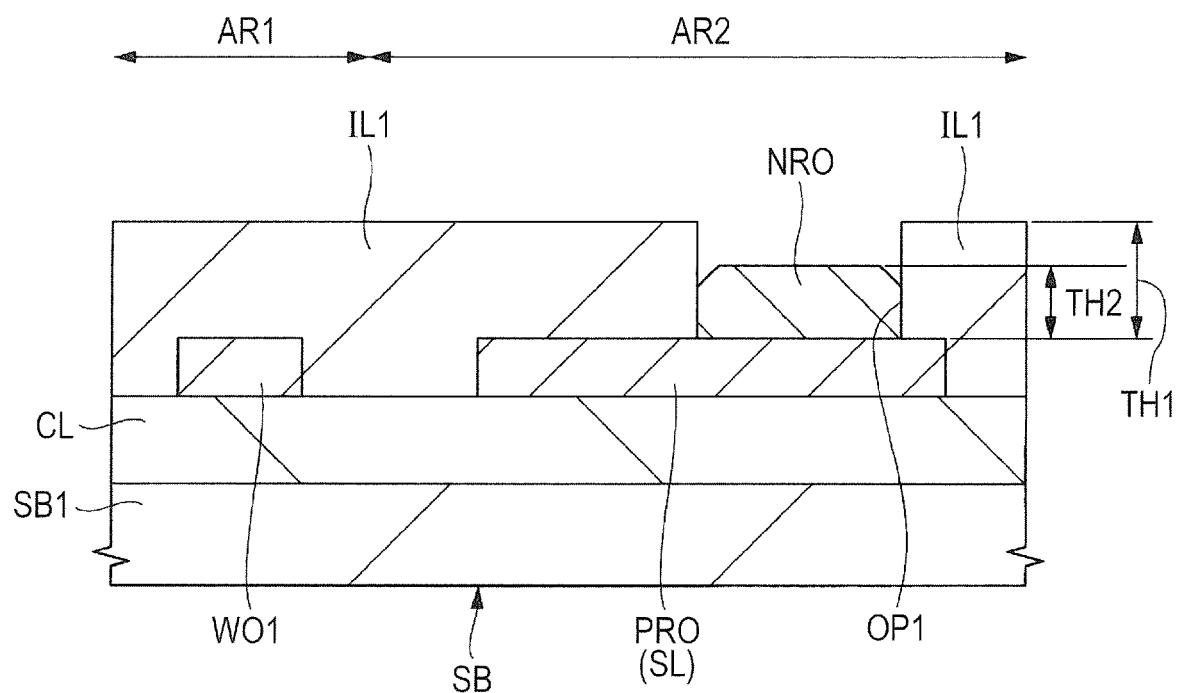
FIG. 13 is a main-portion cross-sectional view of the semiconductor device during the manufacturing process thereof, which is subsequent to FIG. 12.

Next, as shown in FIG. 13, the photoresist film PR in the opening OP1 is removed by asking or the like.

Figure 14:
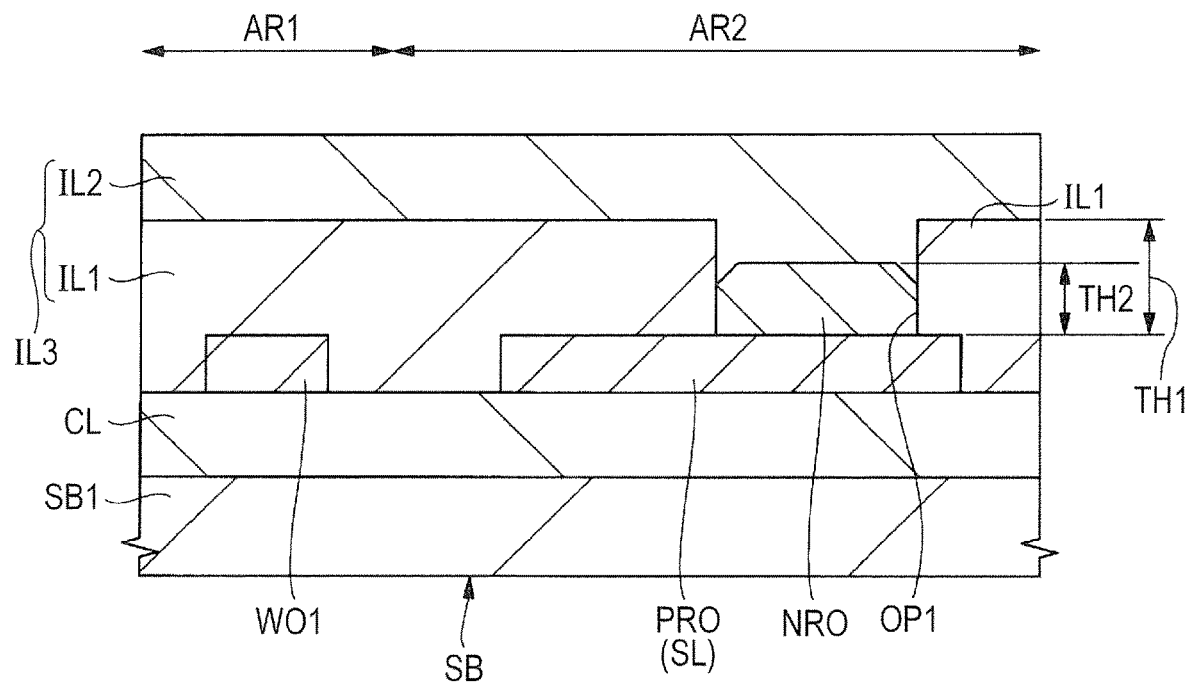
FIG. 14 is a main-portion cross-sectional view of the semiconductor device during the manufacturing process thereof, which is subsequent to FIG. 13.

Next, as shown in FIG. 14, over the insulating film IL1 including the n-type semiconductor portion NRO, the insulating film IL2 is formed. After the formation of the insulating film IL2, the upper surface of the insulating film IL2 is subjected to polishing using a CMP method or the like to be planarized.

The insulating film IL2 is preferably made of a silicon oxide film, and is more preferably made of a silicon oxide film with excellent embeddability. By forming the insulating film IL2 of a silicon oxide film with excellent embeddability, it is possible to reliably embed the silicon oxide film even in the gap between the n-type semiconductor portion NRO and the insulating film IL1 and prevent a loss in the optical property of the germanium optical receiver PD. The insulating film IL2 is preferably formed using an SACVD (Sub Atmosphere Chemical Vapor Deposition) method using $O_3$-TEOS as a raw material gas or an SOG (Spin On Glass) method. The SACVD method using $O_3$-TEOS as a raw material gas or the SOG method allows the silicon oxide film with excellent embeddability to be formed. In the SOG method, a silicon oxide film is formed by coating. Specifically, the main surface of a substrate is coated with a solution obtained by dissolving polysilazane or the like in an organic solvent such as dibutyl ether. Subsequently, baking treatment at about 150° C. is performed in the atmosphere to evaporate the organic solvent. Then, heat treatment at 300° C. or higher is performed in a water vapor atmosphere or the like to convert polysilazane to silicon oxide and thus form the silicon oxide film. As the material used for the SOG method, an inorganic material such as polysilazane mentioned above or HSQ (Hydrogen Silsesquioxane) or an organic material such as MSQ (Methyl Silsesquioxane) is used preferably.

Note that the interlayer insulating film IL3 is made of a multi-layer film including the insulating film IL1 and the insulating film IL2 over the insulating film IL1. Over the n-type semiconductor portion NRO, the insulating film IL2 is formed, but the insulating film IL1 is not formed. Consequently, the interlayer insulating film IL3 located over the n-type semiconductor portion NRO is made of the insulating film IL2, while the interlayer insulating film IL3 other than that located over the n-type semiconductor portion NRO is made of the multi-layer film including the insulating film IL1 and the insulating film IL2. The interlayer insulating film IL3 is formed over the insulating layer CL so as to cover the optical waveguide WO1, the optical waveguide WO2, the p-type semiconductor portion PRO, and the n-type semiconductor portion NRO.

Figure 15:
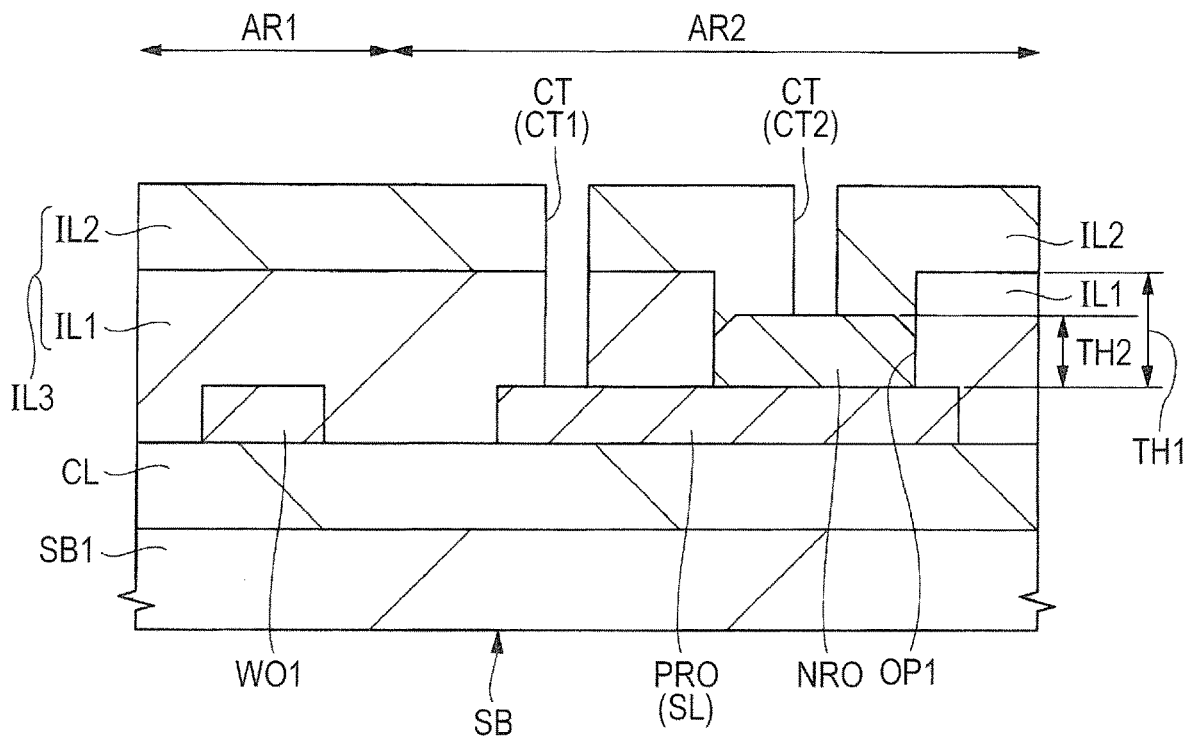
FIG. 15 is a main-portion cross-sectional view of the semiconductor device during the manufacturing process thereof, which is subsequent to FIG. 14.

Next, as shown in FIG. 15, using a photolithographic technique and an etching technique, the contact holes (openings) CT are formed in the interlayer insulating film IL3. The contact holes CT include the foregoing contact holes CT1 and CT2 and are formed so as to extend through the interlayer insulating film IL3. Specifically, in the area AR2, over the portion of the p-type semiconductor portion PRO which is uncovered with the n-type semiconductor portion NRO, the contact hole CT1 is formed while, over the n-type semiconductor portion NRO, the contact hole CT2 is formed.

The contact hole CT1 is included in the portion of the p-type semiconductor portion PRO which is uncovered with the n-type semiconductor portion NRO in plan view. The contact hole CT1 extends through the interlayer insulating film IL3 (insulating films IL2 and IL1) to reach the p-type semiconductor portion PRO. At the bottom portion of the contact hole CT1, a portion of the upper surface of the p-type semiconductor portion PRO is exposed. On the other hand, the contact hole CT2 is included in the n-type semiconductor portion NRO in plan view. The contact hole CT2 extends through the interlayer insulating film IL3 (insulating film IL2) to reach the n-type semiconductor portion NRO. At the bottom portion of the contact hole CT2, a portion of the upper surface of the n-type semiconductor portion NRO is exposed.

For example, the contact holes CT (CT1 and CT2) can be formed as follows. First, over the interlayer insulating film IL3, a photoresist pattern (not shown) is formed using a photolithographic technique. The photoresist pattern has respective openings for the contact holes CT1 and CT2. Then, by etching the interlayer insulating film IL3 using the photoresist pattern as an etching mask, the contact holes CT1 and CT2 can be formed in the interlayer insulating film IL3. Then, the photoresist pattern is removed by asking or the like. In this case, the contact holes CT1 and CT2 are formed together in the same step.

Figure 16:
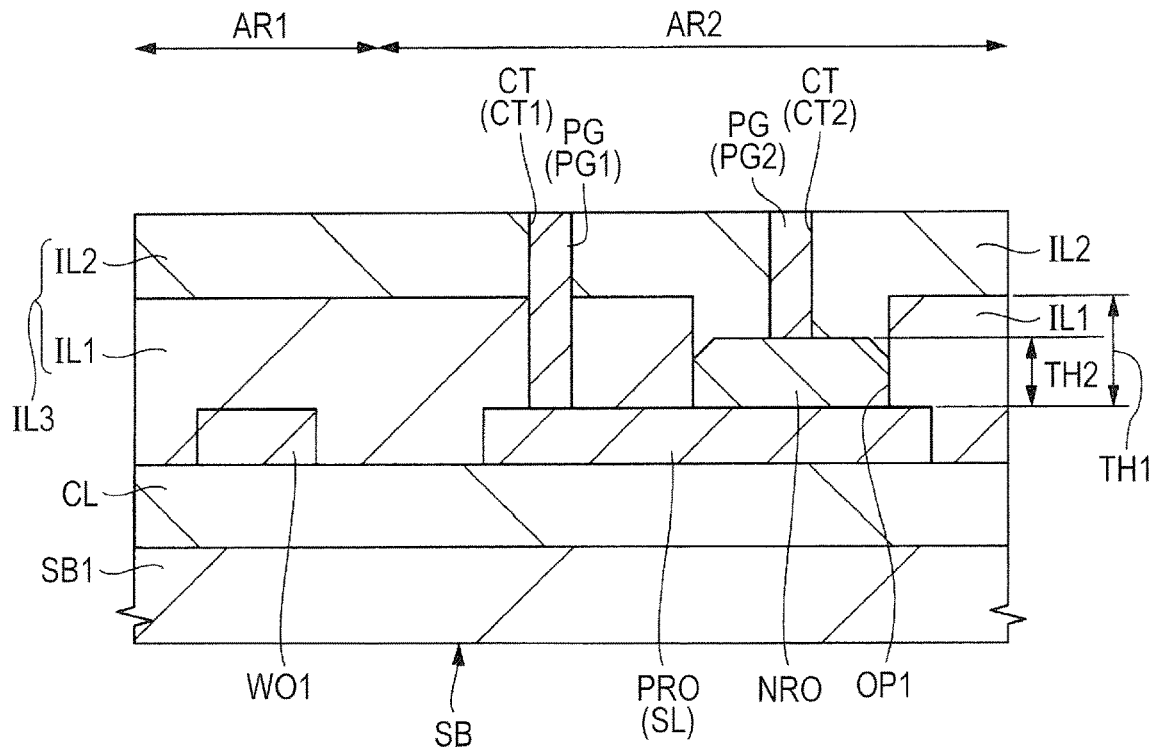
FIG. 16 is a main-portion cross-sectional view of the semiconductor device during the manufacturing process thereof, which is subsequent to FIG. 15.

Next, as shown in FIG. 16, in the contact holes CT (CT1 and CT2) of the interlayer insulating film IL3, the conductive plugs PG (PG1 and PG2) are formed (embedded).

For example, the plugs PG can be formed as follows. First, over the interlayer insulating film IL3 (insulating film IL2) including the bottom surfaces and side walls of the contact holes CT, a conductor film made of a tungsten film or the like is formed so as to be embedded in the contact holes CT. Then, the unneeded conductor film outside the contact holes CT is removed by a CMP method, an etchback method, or the like to allow the plugs PG to be formed. Note that the conductor film may also be a multi-layer film including a barrier conductor film such as a titanium film or a titanium nitride film and a tungsten film. In this case, the barrier conductor film is formed over the interlayer insulating film IL3 (insulating film IL2) including the bottom surfaces and side walls of the contact holes CT, and then a main conductor film made of a tungsten film is formed over the barrier conductor film so as to be embedded in the contact holes CT.

The plug PG embedded in the contact hole CT1 is the plug PG1. The plug PG1 is disposed over the p-type semiconductor portion PRO and is in contact with and electrically coupled to the p-type semiconductor portion PRO. On the other hand, the plug PG embedded in the contact hole CT2 is the plug PG2. The plug PG2 is disposed over the n-type semiconductor portion NRO and is in contact with and electrically coupled to the n-type semiconductor portion NRO.

Figure 17:
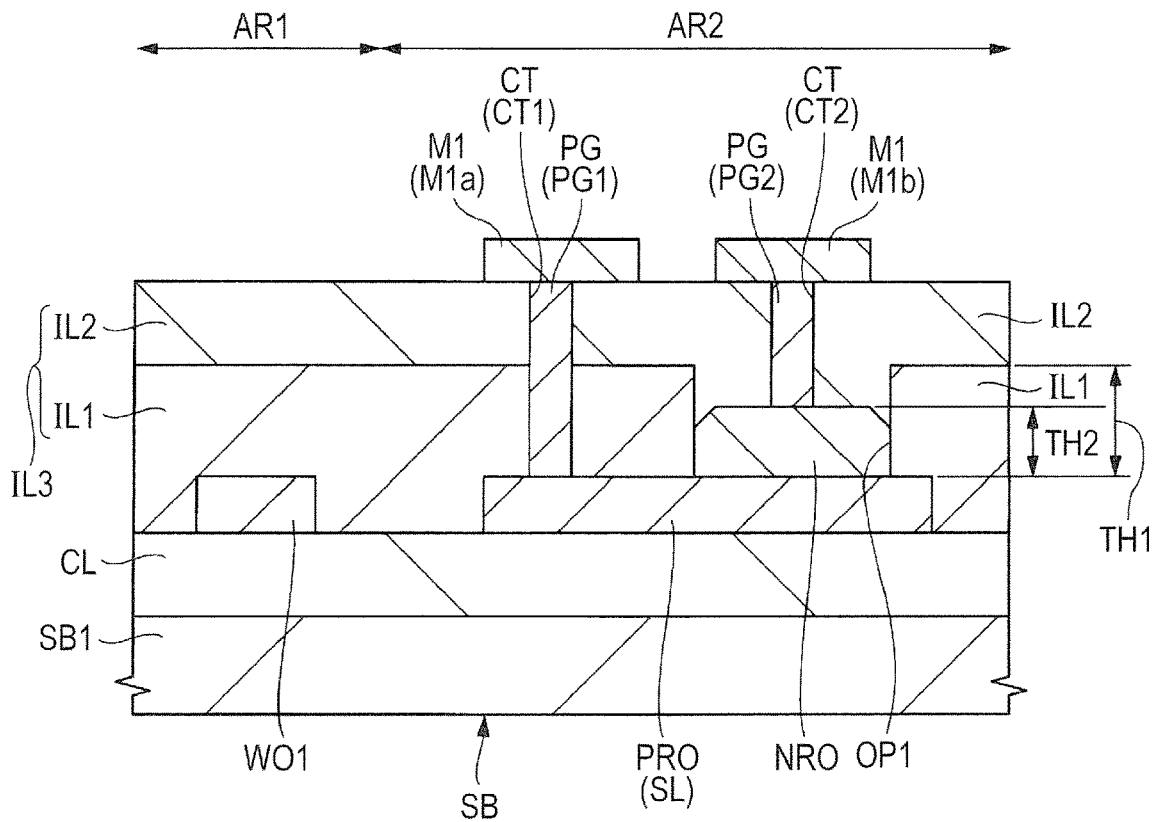
FIG. 17 is a main-portion cross-sectional view of the semiconductor device during the manufacturing process thereof, which is subsequent to FIG. 16.

Next, as shown in FIG. 17, over the interlayer insulating film IL3 (insulating film IL2) in which the plugs PG are embedded, the wires M1 are formed.

For example, the wires M1 can be formed as follows. First, over the interlayer insulating film IL3 in which the plugs PG are embedded, a conductive film for forming the wires M1 is formed. The conductive film is made of, e.g., a multi-layer film including a barrier conductor film, a main conductor film thereover, and a barrier conductor film thereover. The barrier conductor film is made of a titanium film, a titanium nitride film, or a multi-layer film thereof. The main conductor film is made of an aluminum film or an aluminum alloy film. Then, over the conductive film, a photoresist pattern is formed using a photolithographic technique. Then, by etching the conductive film using the photoresist pattern as an etching mask, the wires M1 can be formed. Subsequently, the photoresist pattern is removed by asking or the like. The wires M1 are made of the patterned conductive film. When the wires M1 are formed, the respective upper surfaces of the plugs PG come into contact with the wires M1 so that the plugs PG are electrically coupled to the wires M1 thereover.

The wires M1 include the foregoing wires M1a and M1b. The wire M1a is electrically coupled to the p-type semiconductor portion PRO via the plug PG1. On the other hand, the wire M1b is electrically coupled to the n-type semiconductor portion NRO via the plug PG2.

Figure 18:
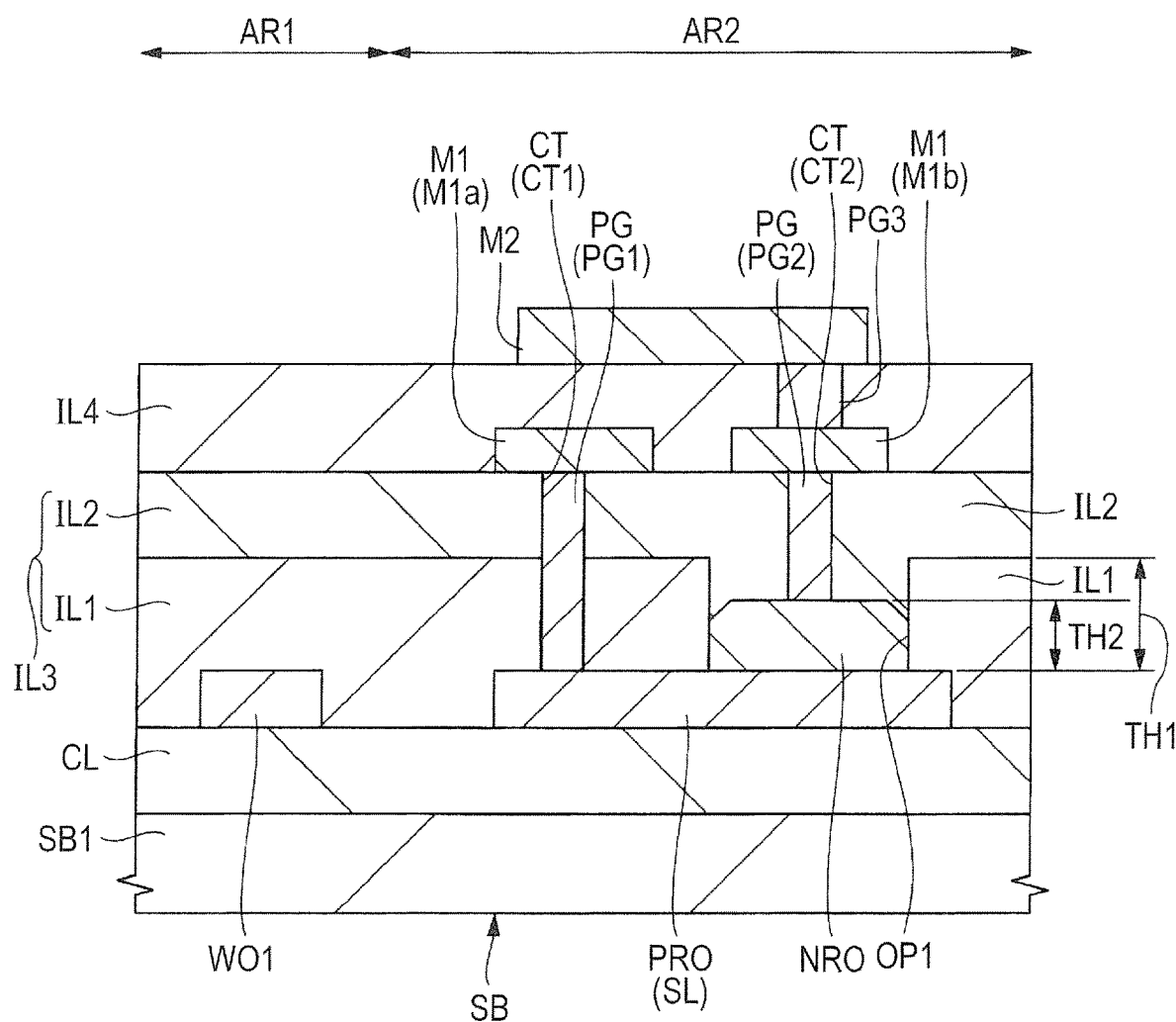
FIG. 18 is a main-portion cross-sectional view of the semiconductor device during the manufacturing process thereof, which is subsequent to FIG. 17.

Next, as shown in FIG. 18, over the insulating film IL2, the interlayer insulating film IL4 is formed so as to cover the wires M1. After the formation of the interlayer insulating film IL4, the upper surface of the interlayer insulating film IL4 is subjected to polishing using a CMP method or the like to be planarized. The interlayer insulating film IL4 is preferably made of a silicon oxide film and can be formed using, e.g., a CVD method.

Next, using a photolithographic technique and an etching technique, a through hole (through opening) is formed in the interlayer insulating film IL4. Then, in the through hole, the conductive plug PG3 is formed (embedded). The plug PG3 can be formed by substantially the same method as used to form the foregoing plugs PG.

Next, over the interlayer insulating film IL4 in which the plug PG3 is embedded, the wire M2 is formed. The wire M2 can be formed by substantially the same method as used to form the wires M1. Specifically, over the interlayer insulating film IL4 in which the plug PG3 is embedded, a conductive film for forming the wire M2 is formed. Then, by patterning the conductive film using a photolithographic technique and an etching technique, the wire M2 can be formed. The plug PG3 is disposed between the wire M2 and the wire M1 to electrically couple the wire M2 to the wire M1.

Next, as shown in FIG. 1, over the interlayer insulating film IL4, the protective film TC is formed so as to cover the wire M2. The protective film TC is made of, e.g., a silicon oxynitride film and can be formed using a CVD method or the like.

Next, using a photolithographic technique and an etching technique, the opening OP2 is formed in the protective film TC. From the opening OP2 of the protective film TC, a portion of the wire M2 is exposed. The portion of the wire M2 exposed from the opening OP2 serves as the pad portion (bonding pad or external coupling portion). Then, the SOI substrate SB is diced (cut) together with the structure located thereabove to be singulated, whereby semiconductor chips (semiconductor devices) are acquired.

In this manner, the semiconductor device in the present first embodiment can be manufactured.

[Background to Study]

Figure 19:
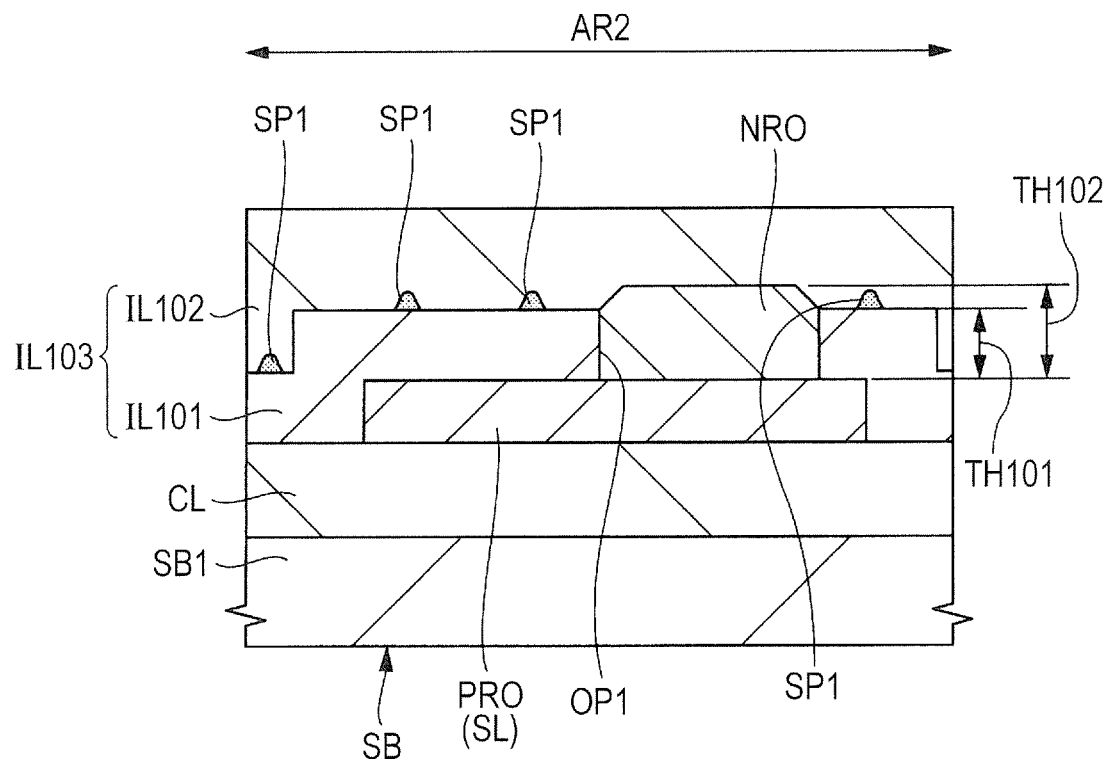
FIG. 19 is a main-portion cross-sectional view of a semiconductor device in a studied example.

Referring to FIG. 19, a description will be given of a semiconductor device in a studied example studied by the present inventors. FIG. 19 is a main-portion cross-sectional view of the semiconductor device in the studied example studied by the present inventors. In the semiconductor device in the studied example, the structure of the area AR1 which is included in the region equivalent to that in FIG. 1 described above is the same as in the semiconductor device in the present first embodiment. Accordingly, FIG. 19 shows only the cross-sectional view of the area AR2 which is included in the region equivalent to that in FIG. 1 described above. Note that, in FIG. 19, for simpler illustration, the depiction of the foregoing contact holes CT, the plugs PG, the interlayer insulating film IL4, and the structure located thereabove is omitted.

The semiconductor device in the studied example shown in FIG. 19 includes the base SB1, the insulating layer CL formed over the base SB1, the optical waveguides WO1 and WO2 and the semiconductor portion PRO which are formed over the insulating layer CL, and the semiconductor portion NRO formed over the semiconductor portion PRO, similarly to the semiconductor device in the present first embodiment. Note that the depiction of the optical waveguide WO1 is omitted. The optical waveguide WO2 is shown in FIG. 3 described above, but is not shown in FIGS. 1 and 19 described above.

In the semiconductor device in the studied example shown in FIG. 19, over the insulating layer CL, an interlayer insulating film IL103 (insulating films IL101 and IL102) is formed, and the semiconductor device in the studied example is different from that in the present first embodiment in the insulating films IL101 and IL102.

Specifically, in the present first embodiment shown in FIG. 1, the thickness TH2 of the n-type semiconductor portion NRO is smaller than the thickness TH1 of the insulating film IL1 over the p-type semiconductor portion PRO. By contrast, in the studied example shown in FIG. 19, a thickness TH102 of the n-type semiconductor portion NRO is larger than a thickness TH101 of the insulating film IL101 over the p-type semiconductor portion PRO.

Next, referring to FIGS. 20 to 23, a description will be given of a manufacturing process of the semiconductor device in the studied example shown in FIG. 19. FIGS. 20 to 23 are main-portion cross-sectional views of the semiconductor device in the studied example during the manufacturing process thereof, which show cross sections equivalent to that shown in FIG. 19 described above. That is, FIGS. 20 to 23 show only the cross-sectional views of the area AR2, similarly to FIG. 19.

The manufacturing process of the semiconductor device in the studied example is also substantially the same as the manufacturing process of the semiconductor device in the present first embodiment described above until the structure in FIG. 20 equivalent to FIG. 5 described above is obtained by patterning the semiconductor layer SL to form the semiconductor portion PRO and then introducing a p-type impurity into the semiconductor portion PRO using an ion implantation method or the like to change the semiconductor portion PRO into the p-type semiconductor portion PRO.

Figure 20:
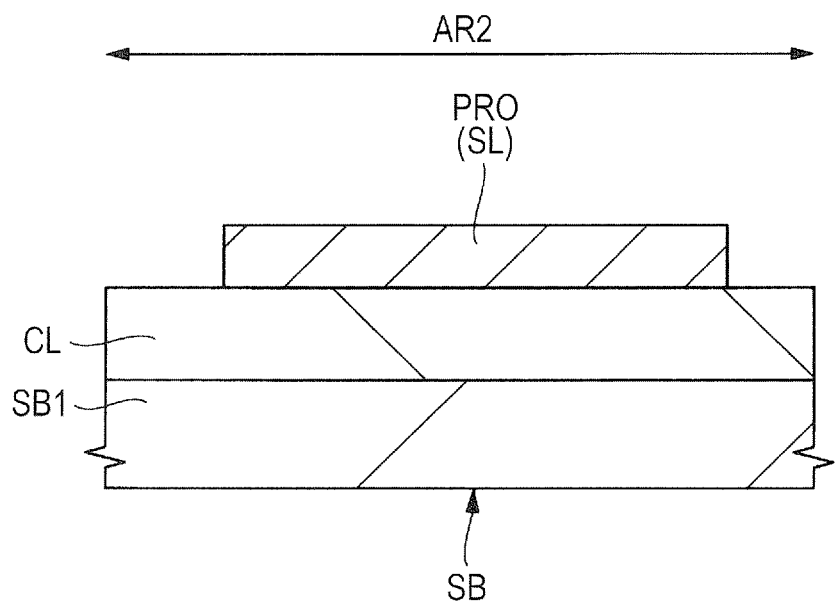
FIG. 20 is a main-portion cross-sectional view of the semiconductor device in the studied example during the manufacturing process thereof.
Figure 21:
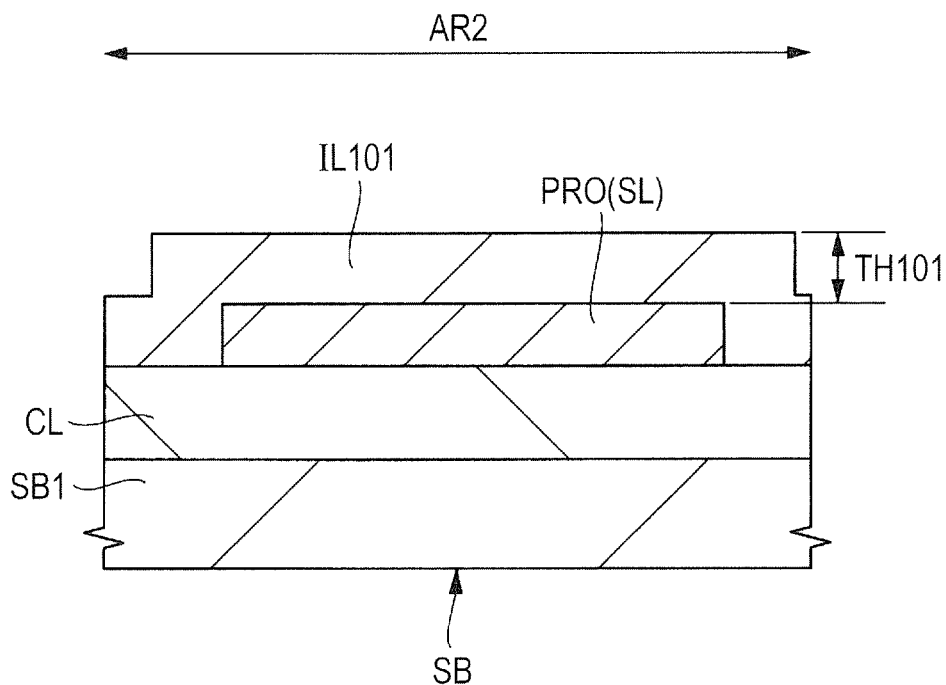
FIG. 21 is a main-portion cross-sectional view of the semiconductor device during the manufacturing process thereof, which is subsequent to FIG. 20.

In the case in the studied example, after the structure in FIG. 20 described above is obtained, over the SOI substrate SB, i.e., over the insulating layer CL, the insulating film IL101 is formed so as to cover the optical waveguides WO1 and WO2 and the semiconductor portion PRO, as shown in FIG. 21. The thickness of the insulating film IL101 is about 200 nm.

Figure 22:
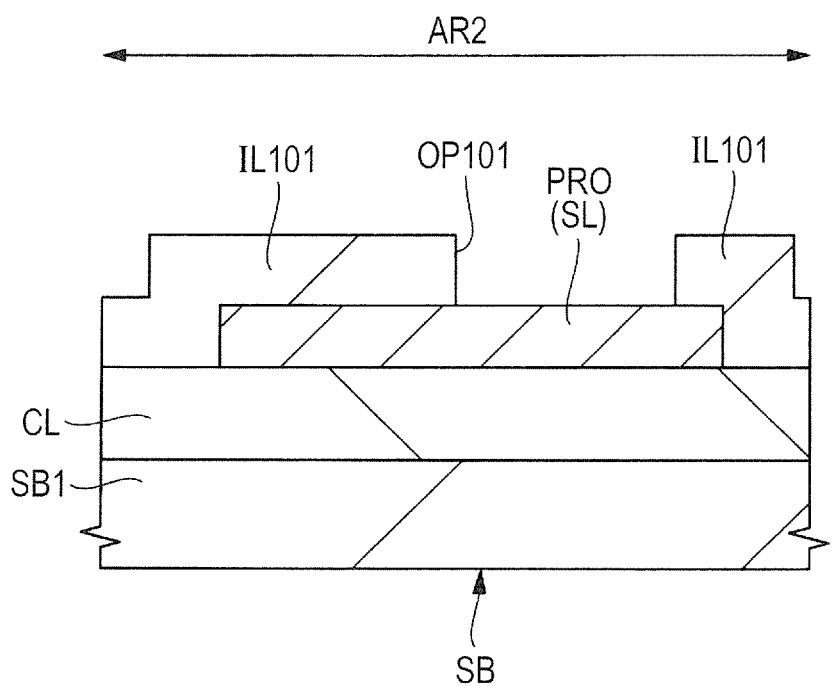
FIG. 22 is a main-portion cross-sectional view of the semiconductor device during the manufacturing process thereof, which is subsequent to FIG. 21.

Next, as shown in FIG. 22, using a photolithographic technique and an etching technique, an opening OP101 is formed in the insulating film IL101. The two-dimensional size (area) of the opening OP101 is smaller than the two-dimensional size of the p-type semiconductor portion PRO. The opening OP101 is included in the p-type semiconductor portion PRO in plan view. The opening OP101 extends through the insulating film IL101 to reach the semiconductor portion PRO. At the bottom portion of the opening OP101, a portion of the upper surface of the semiconductor portion PRO is exposed.

Figure 23:
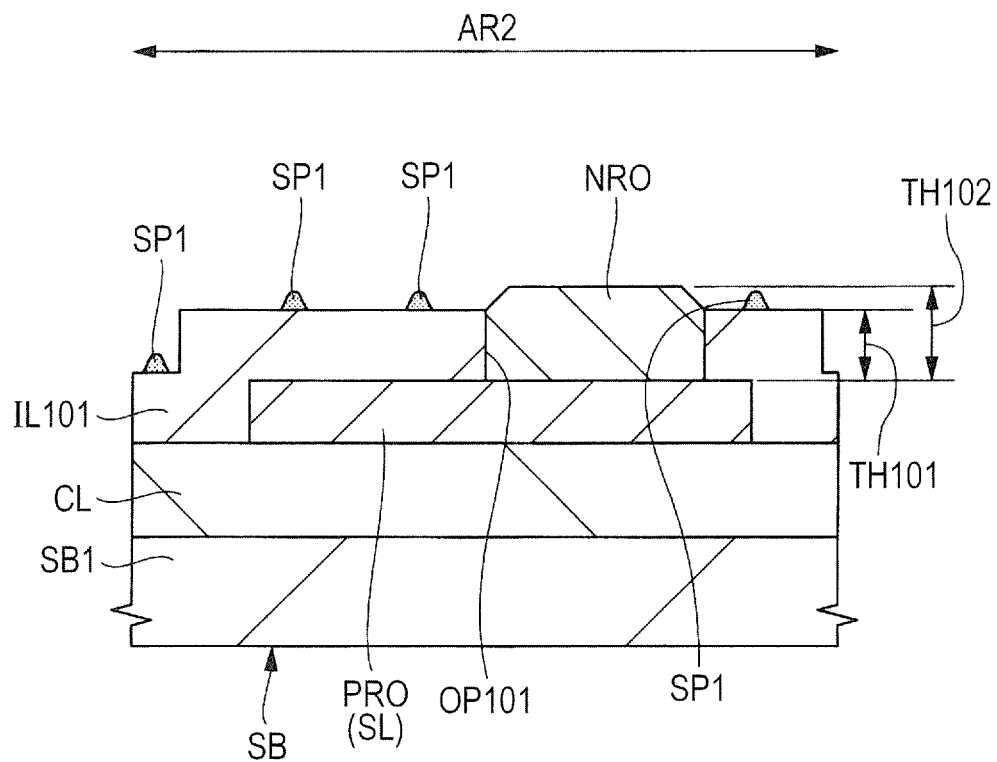
FIG. 23 is a main-portion cross-sectional view of the semiconductor device during the manufacturing process thereof, which is subsequent to FIG. 22.

Next, as shown in FIG. 23, over the p-type semiconductor portion PRO exposed at the bottom portion of the opening OP101, the n-type semiconductor portion (germanium layer) NRO made of germanium (Ge) is formed. The n-type semiconductor portion NRO can be formed using an epitaxial growth method. In the opening OP101, the n-type semiconductor portion NRO is formed selectively over the p-type semiconductor portion PRO. Thus, an element having a pn junction structure including the p-type semiconductor portion PRO made of a silicon layer and the n-type semiconductor portion NRO made of the germanium layer is formed.

As shown in FIG. 23, the n-type semiconductor portion (germanium layer) NRO formed by the epitaxial growth method has a generally trapezoidal cross-sectional shape. The thickness TH2 of the n-type semiconductor portion NRO formed herein is about 500 nm and larger than the thickness TH101 of the insulating film IL101 over the p-type semiconductor portion PRO.

As shown in FIG. 23, when the n-type semiconductor portion (germanium layer) NRO is formed over the p-type semiconductor portion PRO, the selectivity of the selective epitaxial growth method collapses so that the semiconductor particles SPI made of germanium are formed over the insulating film IL101.

Next, as shown in FIG. 19, over the insulating film IL101 including the n-type semiconductor portion NRO, the insulating film IL102 is formed. Then, the upper surface of the insulating film IL102 is planarized by a CMP method or the like. A combination of the insulating film IL101 and the insulating film IL102 corresponds to the interlayer insulating film IL103. Then, in the interlayer insulating film IL103, contact holes are formed and, in the contact holes, conductive plugs are formed. The plugs couple the p-type semiconductor portion PRO and the n-type semiconductor portion NRO to wires in layers located thereabove. The depiction and description of the contact holes, the plugs, and the wires is omitted herein.

Next, a description will be given of the problem to be solved that has been found by the present inventors.

The present inventors have considered introducing the germanium optical receiver PD into a semiconductor device to which a silicon photonics technique is applied. This entails the need to form the n-type semiconductor portion NRO made of germanium over the p-type semiconductor portion PRO made of silicon. As a method of forming the n-type semiconductor portion NRO, a selective epitaxial growth method is used preferably. As described above, the selective epitaxial growth method allows for selective epitaxial growth of only a portion of a surface. For example, over a surface where a semiconductor layer made of silicon or germanium and an insulating film made of an oxide thereof (e.g., silicon oxide or germanium oxide) are simultaneously present, a mixture gas obtained by mixing an appropriate amount of hydrogen chloride as an etching gas in a raw material gas made of germanium hydride is allowed to flow. By doing so, over the insulating film, hydrogen chloride inhibits nuclear growth of germanium so that single crystal growth of a germanium layer selectively proceeds only over the semiconductor layer. Thus, the germanium layer forming the n-type semiconductor portion NRO can be formed over the p-type semiconductor layer PRO made of silicon.

However, as shown in FIG. 23, due to the collapsed selectivity of the selective epitaxial growth method, the semiconductor particles SP1 made of the same material (which is germanium herein) as that of the n-type semiconductor portion NRO are undesirably formed over the insulating film IL101. Then, as shown in FIG. 19, over the insulating film IL101 including the n-type semiconductor portion NRO, the insulating film IL102 is formed, resulting in a state where the semiconductor particles SP1 remain between the insulating film IL101 and the insulating film IL102. As a result, the presence of the semiconductor particles SP1 between the insulating film IL101 and the insulating film IL102 may cause a problem. For example, in the semiconductor device to which the silicon photonics technique is applied, the probability is increased that diffused reflection by the semiconductor particles SP1 and the degraded adhesion between the insulating film IL101 and the insulating film IL102 cause a loss in the optical property of the germanium optical receiver PD (e.g., light leaks from the p-type semiconductor portion PRO and the n-type semiconductor portion NRO to the surroundings), resulting in the degraded reliability of the semiconductor device. Accordingly, it is desired to improve the reliability of the semiconductor device by controlling formation conditions in the epitaxial growth and thus preventing the semiconductor particles SP1 from being formed or by removing the formed semiconductor particles SP1.

When consideration is given to variation in a mass production process, it is difficult herein to avoid the collapse of the selectivity by controlling the formation conditions in the selective epitaxial growth method. For example, when the ratio of the etching gas is increased, the probability is increased that the germanium layer formed over the p-type semiconductor portion PRO does not have a high quality. Accordingly, it is necessary to remove the semiconductor particles SP1 formed due to the collapsed selectivity by inventively improving the manufacturing process of the semiconductor device.

As a method of removing the semiconductor particles SP1, there are a method which performs wet etching on the insulating film IL101 on which the semiconductor particles SP1 are deposited to remove the semiconductor particles SP1 together with the insulating film IL101 and a method which performs direct etching on the semiconductor particles SP1. However, when the wet etching is performed on the insulating film IL101, the semiconductor particles SP1 may be deposited again on the insulating film IL101 after the etching. In addition, since the insulating film IL101 covers the p-type semiconductor portion PRO as shown in FIG. 23, the upper surface of the insulating film IL101 is not planar. As a result, the speed of etching the insulating film IL101 varies in a plane to cause a problem such as deformation of the insulating film IL101 or variation in the thickness of the insulating film IL101 after the etching.

When the semiconductor particles SP1 are removed by the direct etching, in the studied example, the n-type semiconductor portion NRO made of the same material (germanium) as that of the semiconductor particles SP1 is exposed, as shown in FIG. 19. Accordingly, when the semiconductor particles SP1 are to be removed by the etching, the n-type semiconductor portion NRO is also etched.

It can be considered herein to mask the n-type semiconductor portion NRO with a resist film or the like and then remove the semiconductor particles SP1. However, the thickness TH102 of the n-type semiconductor portion NRO is larger than the thickness TH101 of the insulating film IL101 over the p-type semiconductor portion PRO. If the n-type semiconductor portion NRO is to be masked with a resist film or the like, the semiconductor particles SP1 over the insulating film IL101 are also covered with a resist film or the like and, in that state, the semiconductor particles SP1 cannot be removed. To prevent this, it can also be considered to form a photoresist pattern using a photolithographic technique to cover the n-type semiconductor portion NRO using the formed photoresist pattern as an etching mask and etch the semiconductor particles SP1 over the insulating film IL101. However, this causes the need to newly provide a photomask for forming the photoresist pattern, resulting in the increased manufacturing cost of the semiconductor device. Moreover, when the semiconductor particles SP1 are present around the opening OP101, the semiconductor particles SP1 are covered with the etching mask made of the photoresist pattern and therefore may not be able to be removed. Accordingly, it is desired to reliably remove the semiconductor particles SP1 without increasing the manufacturing cost of the semiconductor device, while protecting the n-type semiconductor portion NR.

The foregoing description has been given using silicon photonics as an example. However, the same problem is also encountered in a typical semiconductor device when a semiconductor layer is formed in the opening formed in an insulating film over the surface of a substrate by a selective epitaxial growth method and then the formed semiconductor layer is covered with an insulating film. Specifically, when the semiconductor layer is formed in the opening of the insulating film by the selective epitaxial growth method, due to the collapsed selectivity, semiconductor particles made of the same material as that of the semiconductor layer are formed over the insulating film. At this time, it is desired to remove the semiconductor particles, while protecting the semiconductor layer.

[About Main Characteristic Feature and Effect]

The main characteristic feature of the present first embodiment is that, as shown in FIGS. 1 and 9, the thickness TH2 of the n-type semiconductor portion (first semiconductor layer) NRO formed in the opening OP1 of the insulating film (first insulating film) IL1 is set smaller than the thickness TH1 of the insulating film IL1 over the p-type semiconductor portion PRO. In other words, the upper surface of the n-type semiconductor portion NRO is set lower in level than the upper surface of the insulating film IL1. In still other words, the thickness TH1 of the insulating film IL1 over the p-type semiconductor portion PRO is set larger than the thickness TH2 of the n-type semiconductor portion NRO. In addition, as shown in FIG. 10, the photoresist film (second insulating film) PR is formed over the insulating film IL1 and the n-type semiconductor portion NRO and, as shown in FIG. 11, the photoresist film PR is removed from over the insulating film IL1, while being left over the n-type semiconductor portion NRO in the opening OP1 of the insulating film IL1.

In the present first embodiment, by adopting such a configuration, the reliability of the semiconductor device can be improved. The following is a specific description of the reason for this.

As shown in FIG. 9, by setting the thickness TH2 of the n-type semiconductor portion (first semiconductor layer) NRO formed in the opening OP1 of the insulating film (first insulating film) IL1 smaller than the thickness TH1 of the insulating film IL1 over the p-type semiconductor portion PRO, as shown in FIG. 10, the photoresist film PR is embedded in the opening OP1 of the insulating film IL1 to overlie the n-type semiconductor portion NRO. Subsequently, the photoresist film PR is etched (etched back) in accordance with the upper surface of the insulating film IL1. By doing so, as shown in FIG. 11, it is possible to expose the semiconductor particles SP1 over the insulating film IL1 and leave the photoresist film PR only over the n-type semiconductor portion NRO in the opening OP1 of the insulating film IL1. Since the n-type semiconductor portion NRO is covered with the photoresist film PR, when the semiconductor particles SP1 are etched in this state, it is possible to remove only the semiconductor particles SP1 without etching the n-type semiconductor portion NRO made of the same material as that of the semiconductor particles SP1.

Then, as shown in FIG. 14, when the insulating film I1L2 is formed over the insulating film IL1, a state is established in which the semiconductor particles SP1 are not present between the insulating film IL1 and the insulating film IL2. As a result, unlike in the semiconductor device in the studied example, it is possible to prevent a problem resulting from the presence of the semiconductor particles SP1 between the insulating film IL1 and the insulating film IL2. In other words, it is possible to eliminate the probability of a loss in the optical property of the germanium optical receiver PD due to diffused reflection by the semiconductor particles SP1 or the degraded adhesion between the insulating film IL101 and the insulating film IL102 and improve the reliability of the semiconductor device.

In addition, unlike in the studied example, it is possible to leave the photoresist film PR only over the n-type semiconductor portion NRO in the opening OP1 of the insulating film IL1 without using a photolithographic technique. As a result, there is no need to newly provide a photomask for forming a photoresist pattern and there is no increase in the number of manufacturing process steps. Therefore, it is possible to reliably remove the semiconductor particles SP1 without increasing the manufacturing cost of the semiconductor device, while protecting the n-type semiconductor portion NRO.

Note that, in the present first embodiment, as shown in FIG. 7, after the formation of the insulating film IL1, the upper surface of the insulating film IL1 is subjected to polishing using a CMP method or the like to be planarized. If the upper surface of the insulating film IL1 is not planarized, when the opening OP1 is subsequently formed in the insulating film IL1 and the n-type semiconductor portion NRO is formed in the opening OP1 by an epitaxial growth method, the semiconductor particles SP1 are formed concurrently in and over the depressed portion and the protruding portion of the upper surface of the insulating film IL1 (see FIG. 6).

Even when the photoresist film PR is formed over the insulating film Il1 and then etched (etched back) in accordance with the protruding portion of the upper surface of the insulating film IL1, the photoresist film PR remains in the depressed portion of the upper surface of the insulating film IL1. As a result, the semiconductor particles SP1 formed in the depressed portion of the upper surface of the insulating film IL1 cannot be removed by the subsequent etching. On the other hand, when the photoresist film PR is to be etched (etched back) in accordance with the depressed portion of the upper surface of the insulating film IL1, the photoresist film PR in the opening OP1 is also etched. Consequently, it becomes difficult to control the amount of etching of the photoresist film PR so as to leave the photoresist film PR only over the n-type semiconductor portion NRO in the opening OP1 of the insulating film IL1.

Thus, in the present first embodiment, as shown in FIG. 7, after the insulating film IL1 is formed, the upper surface of the insulating film IL1 is planarized to allow the amount of etching of the photoresist film PR to be easily controlled. Specifically, as shown in FIG. 11, by etching (etching back) the photoresist film PR in accordance with the upper surface of the insulating film IL1, the photoresist film PR can be left only over the n-type semiconductor portion NRO in the opening OP1 of the insulating film IL1.

Note that, in the present first embodiment, as shown in FIG. 10, the photoresist film PR is formed over the insulating film IL1 including the n-type semiconductor portion NRO, but the film formed over the insulating film IL1 including the n-type semiconductor portion NRO is not limited to the photoresist film PR. Specifically, as shown in FIG. 12, it is sufficient to form an insulating film which is not etched when the semiconductor particles SP1 are removed. For example, as will be described later in a third embodiment, a silicon oxide film may also be formed over the insulating film IL1 including the n-type semiconductor portion NRO by an SOG method with excellent embeddability.

(First Modification)

Figure 24:
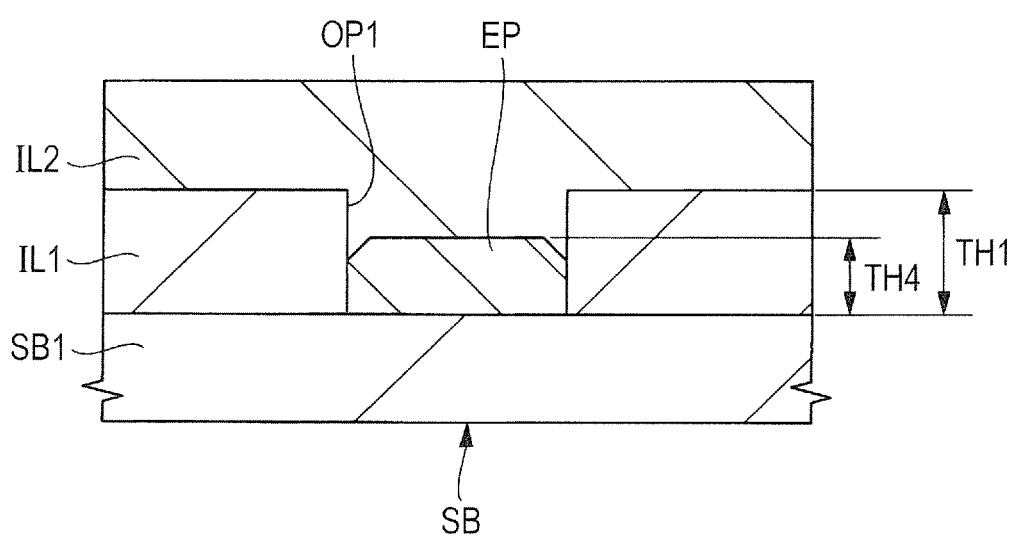
FIG. 24 is a main-portion cross-sectional view of a semiconductor device in a first modification.

Referring to FIG. 24, a description will be given of a semiconductor device in a first modification of the foregoing first embodiment. FIG. 24 is a main-portion cross-sectional view of the semiconductor device in the first modification. The semiconductor device in the first modification is a higher-concept version of the semiconductor device in FIG. 1 described above. Specifically, the semiconductor device in the first embodiment has been described as the semiconductor device to which a silicon photonics technique is applied by way of example. However, the semiconductor device in the first embodiment is applicable to a versatile semiconductor device. Specifically, the semiconductor device in the first modification includes the base (supporting substrate) SB1, the insulating film IL1 formed over the base SB1, and a semiconductor layer (first semiconductor layer) EP formed over the base SB1. The semiconductor layer EP is formed in the opening OP1 of the insulating film IL1. In particular, a thickness TH4 of the semiconductor layer EP is smaller than the thickness TH1 of the insulating film IL1. Also, over the insulating film IL1, the insulating film IL2 is formed so as to cover the semiconductor layer EP. Note that, between the base SB1 and the insulating film IL1, another layer may also be formed, though not shown.

The depiction and description of the contact holes, the plugs, and the wires which are formed in the semiconductor device in the first modification is omitted.

Next, referring to FIGS. 25 to 32, a description will be given of a manufacturing process of the semiconductor device in the first modification shown in FIG. 24. FIGS. 25 to 32 are main-portion cross-sectional views of the semiconductor device in the first modification during the manufacturing process thereof, which show cross sections equivalent to that shown in FIG. 24 described above.

Figure 25:
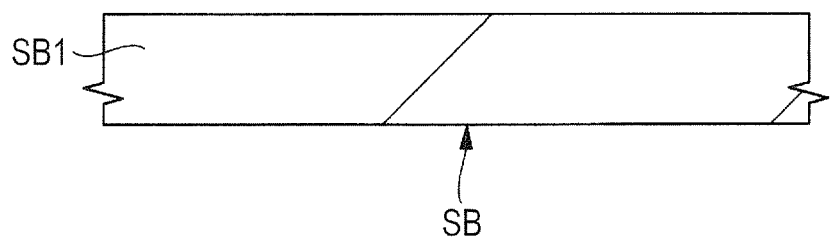
FIG. 25 is a main-portion cross-sectional view of the semiconductor device in the first modification during the manufacturing process thereof.

First, as shown in FIG. 25, the semiconductor substrate SB including the base (supporting substrate) SB1 is provided. As the base SB1, any substrate may be used as long as the semiconductor layer EP can be epitaxially grown over the main surface thereof. For example, the base SB1 is made of a conductor substrate or a semiconductor substrate. Note that the substrate SB may also be a substrate having another layer formed over a base and having a conductor layer or a semiconductor layer (first layer) in the uppermost layer (upper surface) thereof. In this case, the semiconductor layer is epitaxially grown over the upper surface of the conductor layer or the semiconductor layer.

Figure 26:
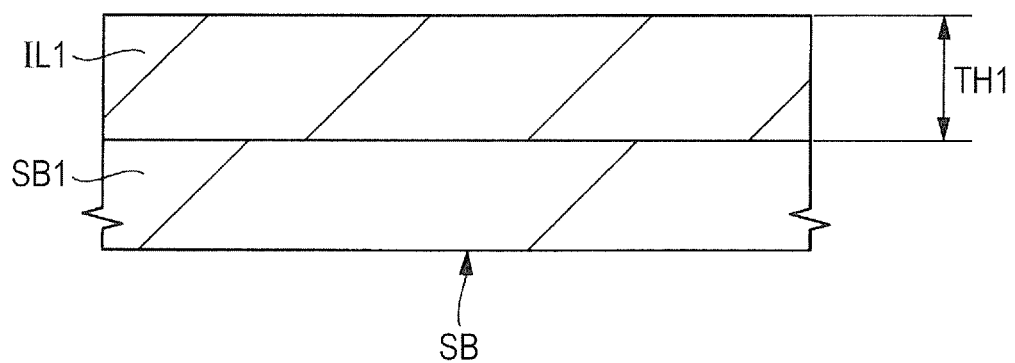
FIG. 26 is a main-portion cross-sectional view of the semiconductor device during the manufacturing process thereof, which is subsequent to FIG. 25.

Next, as shown in FIG. 26, over the base SB1, the insulating film IL1 is formed. The insulating film IL1 is preferably made of a silicon oxide film and can be formed using, e.g., a CVD method.

Figure 27:
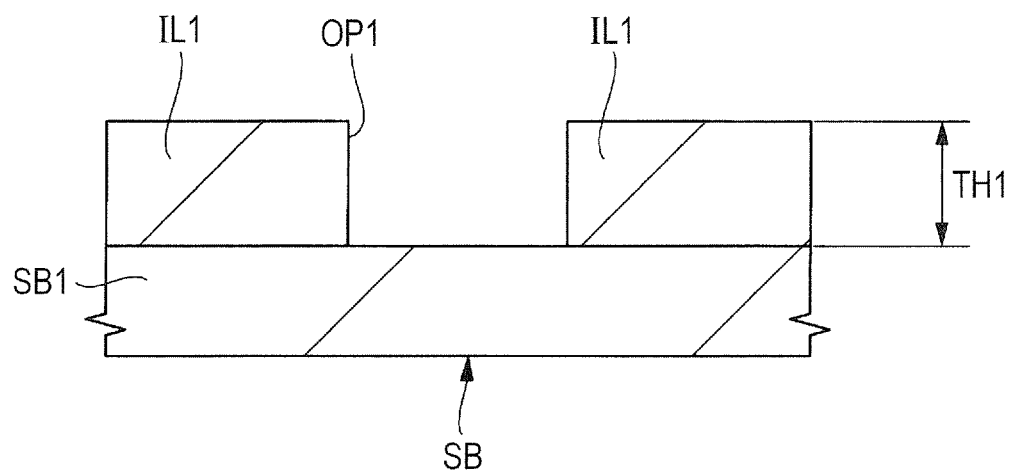
FIG. 27 is a main-portion cross-sectional view of the semiconductor device during the manufacturing process thereof, which is subsequent to FIG. 26.

Next, as shown in FIG. 27, using a photolithographic technique and an etching technique, the opening OP1 is formed in the insulating film IL1. The opening OP1 extends through the insulating film IL1 to reach the base SB1. At the bottom portion of the opening OP1, a portion of the upper surface of the base SB1 is exposed.

Figure 28:
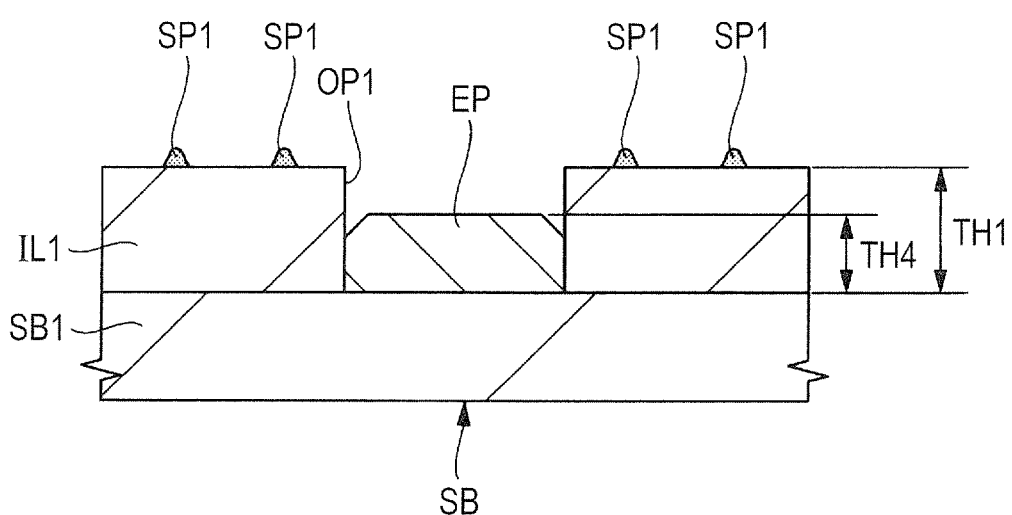
FIG. 28 is a main-portion cross-sectional view of the semiconductor device during the manufacturing process thereof, which is subsequent to FIG. 27.

Next, as shown in FIG. 28, over the base SB1 exposed at the bottom portion of the opening OP1, the semiconductor layer EP is formed. The semiconductor layer EP is made of, e.g., silicon, silicon germanium, or germanium. The semiconductor layer EP can be formed using an epitaxial growth method. In the opening OP1, the semiconductor layer EP is selectively formed over the base SB1.

As shown in FIG. 28, the thickness TH4 of the semiconductor layer EP is smaller than the thickness TH1 of the insulating film IL1. In other words, the upper surface of the semiconductor layer EP is lower in level than the upper surface of the insulating film IL1. In still other words, the insulating film IL1 is formed such that the thickness TH1 thereof is larger than the thickness TH4 of the semiconductor layer EP.

As shown in FIG. 28, when the semiconductor layer EP is formed over the base SB1, the selectivity of the selective epitaxial growth method collapses so that, over the insulating film IL1, the semiconductor particles SP1 made of the same material as that of the semiconductor layer EP are formed.

Figure 29:
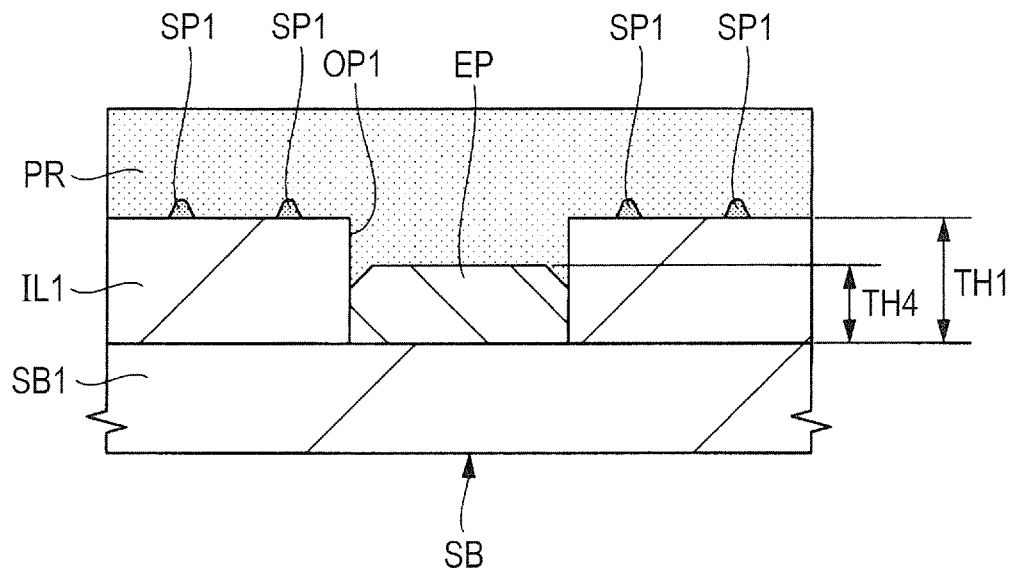
FIG. 29 is a main-portion cross-sectional view of the semiconductor device during the manufacturing process thereof, which is subsequent to FIG. 28.

Next, as shown in FIG. 29, over the insulating film IL1 including the semiconductor layer EP, the photoresist film (second insulating film) PR is formed. The photoresist film PR is embedded in the opening OP1 to overlie the semiconductor layer EP.

Figure 30:
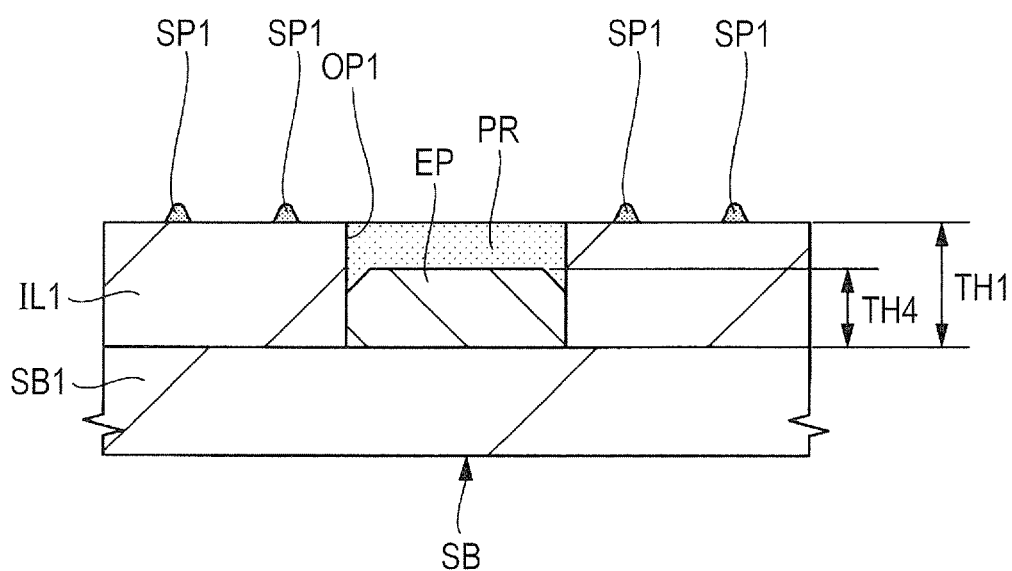
FIG. 30 is a main-portion cross-sectional view of the semiconductor device during the manufacturing process thereof, which is subsequent to FIG. 29.

Next, as shown in FIG. 30, the photoresist film PR is removed from over the insulating film IL1 to be left only over the semiconductor portion EP in the opening OP1. As a method of removing the photoresist film PR, a method which does not damage the insulating film IL1 is used preferably. For example, a resist etch-back process using an $O_2$ plasma or the like is used preferably. Note that the photoresist film PR may also be removed from over the insulating film IL1 by a resist CMP method. In this case also, the photoresist film PR can be left only over the semiconductor portion EP in the opening OP1.

Figure 31:
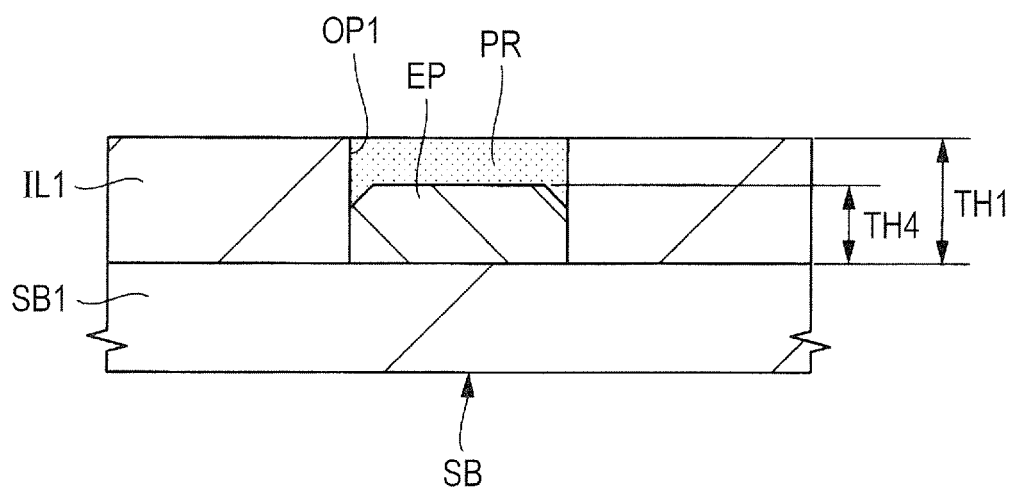
FIG. 31 is a main-portion cross-sectional view of the semiconductor device during the manufacturing process thereof, which is subsequent to FIG. 30.

Next, as shown in FIG. 31, the semiconductor particles SP1 are removed from over the insulating film IL1. At this stage, the semiconductor layer EP made of the same material as that of the semiconductor particles SP1 is covered with the photoresist film PR and the insulating film IL1, and is therefore not removed. Examples of the method of removing the semiconductor particles SP1 include dry etching and wet etching. Preferably, dry etching using a halogen-based gas is used as a method which does not damage the insulating film IL1 and the photoresist film PR.

Figure 32:
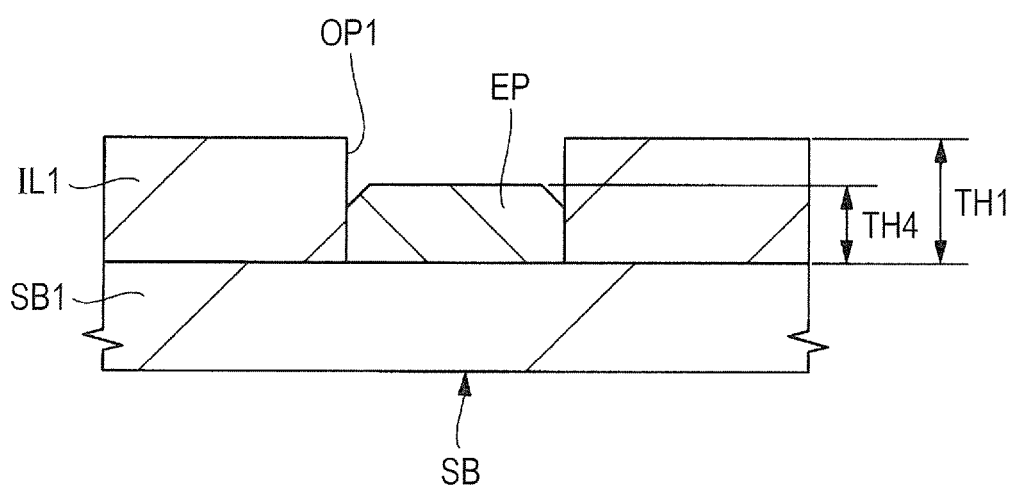
FIG. 32 is a main-portion cross-sectional view of the semiconductor device during the manufacturing process thereof, which is subsequent to FIG. 31.

Next, as shown in FIG. 32, the photoresist film PR in the opening OP1 is removed by asking or the like.

Next, as shown in FIG. 24, over the insulating film IL1 including the semiconductor layer EP, the insulating film IL2 is formed. After the formation of the insulating film IL2, the upper surface of the insulating film IL2 is subjected to polishing using a CMP method or the like to be planarized. Preferably, the insulating film IL2 is made of a silicon oxide film and can be formed using, e.g., a CVD method.

Subsequently, as necessary, the contact holes, the plugs, and the wires are formed, but the depiction and illustration thereof is omitted.

As shown in FIG. 28, the thickness TH4 of the semiconductor layer EP formed in the opening OP1 of the insulating film IL1 is set smaller than the thickness TH1 of the insulating film IL1. As a result, as shown in FIG. 29, the photoresist film PR is embedded in the opening OP1 of the insulating film IL1 to overlie the semiconductor layer EP. Subsequently, the photoresist film PR is etched (etched back) in accordance with the upper surface of the insulating film IL1. Thus, as shown in FIG. 30, it is possible to expose the semiconductor particles SP1 over the insulating film IL1 and leave the photoresist film PR only over the semiconductor layer EP in the opening OP1 of the insulating film IL1. Since the semiconductor layer EP is covered with the photoresist film PR, when the semiconductor particles SP1 are etched in this state, it is possible to remove only the semiconductor particles SP1 without etching the semiconductor layer EP made of the same material as that of the semiconductor particles SP1. Then, as shown in FIG. 24, when the insulating film IL2 is formed over the insulating film IL1, a state is established in which the semiconductor particles SP1 are not present between the insulating film IL1 and the insulating film IL2. Thus, in the same manner as in the semiconductor device in the first embodiment, it is possible to prevent a problem resulting from the presence of the semiconductor particles SP1 between the insulating film IL1 and the insulating film IL2 and improve the reliability of the semiconductor device.

Thus, the manufacturing method of the semiconductor device in the first modification is widely applicable to the case where the semiconductor layer is formed in the opening of the insulating film by the epitaxial growth method.

(Second Modification)

Figure 33:
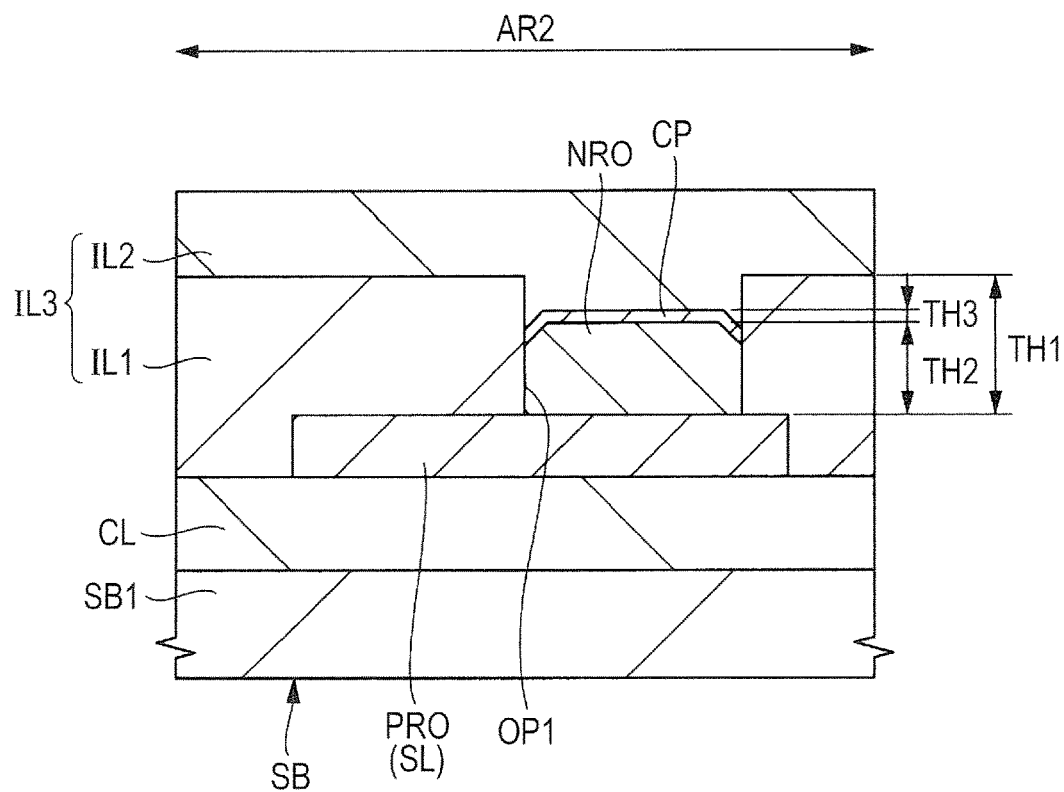
FIG. 33 is a main-portion cross-sectional view of a semiconductor device in a second modification.

Referring to FIG. 33, a description will be given of a semiconductor device in a second modification of the foregoing first embodiment. FIG. 33 is a main-portion cross-sectional view of the semiconductor device in the second modification. The configuration of the semiconductor device in the second modification is the same as that of the semiconductor device in the foregoing first embodiment except for the germanium optical receiver formed in the area AR2 shown in FIG. 1. Accordingly, a repeated description is omitted, and a description will be given herein of the configuration of the area AR2. For this reason, FIG. 33 shows only the cross-sectional view of the area AR2. Note that, in FIG. 33, for simpler illustration, the depiction of the contact holes CT, the plugs PG, the interlayer insulating film IL4, and the structure located thereabove is omitted.

The semiconductor device in the second modification shown in FIG. 33 includes the base SB1, the insulating layer CL formed over the base SB1, the optical waveguides WO1 and WO2 and the p-type semiconductor portion PRO which are formed over the insulating layer CL, and the n-type semiconductor portion NRO formed over the p-type semiconductor portion PRO, similarly to the semiconductor device in the foregoing first embodiment. Note that the optical waveguide WO2 is shown in FIG. 3 described above, but is not shown in FIGS. 1 and 33 described above.

The semiconductor device in the second modification shown in FIG. 33 is different from the semiconductor device in the first embodiment in that, over the n-type semiconductor portion NRO, i.e., between the n-type semiconductor portion NRO and the insulating film IL2, a cap layer CP is formed. The cap layer CP is made of silicon (Si) or silicon germanium (SiGe). More preferably, the cap layer CP is made of silicon (Si). The two-dimensional shape of the cap layer CP substantially coincides with the two-dimensional shape of the n-type semiconductor portion NRO. A thickness TH3 of the cap layer CP is, e.g., not more than 50 nm, and is preferably about 10 to 30 nm. It is also possible to regard a combination of the n-type semiconductor portion NRO and the cap layer CP thereover as a semiconductor portion.

The germanium optical receiver PD in the second modification includes the p-type semiconductor portion PRO as the first semiconductor portion and the second semiconductor portion over the first semiconductor portion (p-type semiconductor portion PRO). The second semiconductor portion has a multi-layer structure including the n-type semiconductor portion NRO and the cap layer CP. Specifically, the second semiconductor portion included in the germanium optical receiver PD includes the germanium layer (semiconductor portion NRO) formed over the first semiconductor portion (p-type semiconductor portion PRO), and further includes the silicon layer (cap layer CP) formed over the germanium layer (semiconductor portion NRO). The second semiconductor portion is formed in the opening OP1 of the insulating film IL1. In particular, the total thickness of the thickness TH2 of the n-type semiconductor portion NRO and the thickness TH3 of the cap layer CP is smaller than the thickness TH1 of the insulating film IL1 over the p-type semiconductor portion PRO.

In the area AR2, over the insulating layer CL, the interlayer insulating film IL3 is formed so as to cover the germanium optical receiver PD (the p-type semiconductor portion PRO, the n-type semiconductor portion NRO, and the cap layer CP). The insulating layer CL and the interlayer insulating film IL3 are allowed to function as a clad layer.

Note that, over the multi-layer structure including the n-type semiconductor portion NRO and the cap layer CP, the insulating film IL1 is not formed, but the insulating film IL2 is formed. This is because, after the multi-layer structure including the n-type semiconductor portion NRO and the cap layer CP is formed in the opening OP1 formed in the insulating film IL1, the insulating film IL2 is formed. Consequently, the interlayer insulating film IL3 located over the cap layer CP is made of the insulating film IL2, while the interlayer insulating film IL3 other than that located over the cap layer CP is made of the multi-layer film including the insulating film IL1 and the insulating film IL2.

Note that, over the portion of the p-type semiconductor portion PRO which is uncovered with the n-type semiconductor portion NRO and over the cap layer CP over the n-type semiconductor portion NRO, respective contact holes extending through the interlayer insulating film IL3 are formed. In the contact holes, conductive plugs are embedded. The contact hole formed in the interlayer insulating film IL3 reaches the portion of the p-type semiconductor portion PRO which is uncovered with the n-type semiconductor portion NRO. At the bottom portion of the contact hole, a portion of the upper surface of the p-type semiconductor portion PRO is exposed. On the other hand, the contact hole formed in the insulating film IL2 reaches the cap layer CP. At the bottom portion of the contact hole, a portion of the upper surface of the cap layer CP is exposed. The lower surfaces of the plugs embedded in the contact holes come into contact with the p-type semiconductor portion PRO and the cap layer CP to be electrically coupled to the wires formed in the upper layers. Consequently, the p-type semiconductor portion PRO is electrically coupled to the wires formed in the upper layers via the plugs, while the n-type semiconductor portion NRO is electrically coupled to the wires formed in the upper layers via the cap layer CP and the plugs.

Next, referring to FIGS. 34 to 40, a description will be given of a manufacturing process of the semiconductor device in the second modification shown in FIG. 33. FIGS. 34 to 40 are main-portion cross-sectional views of the semiconductor device in the second modification during the manufacturing process thereof, which show cross sections equivalent to that shown in FIG. 33 described above. In other words, FIGS. 34 to 40 show only the cross-sectional views of the area AR2, similarly to FIG. 33.

In the second modification, in the same manner as in the first embodiment, the semiconductor layer SL is patterned to form the semiconductor portion PRO and, using an ion implantation method or the like, a p-type impurity is introduced into the semiconductor portion PRO to change the semiconductor portion PRO into the p-type semiconductor portion PRO. Then, over the insulating layer CL, the insulating film IL1 is formed so as to cover the optical waveguides WO1 and WO2 and the semiconductor portion PRO. After the formation of the insulating film IL1, the upper surface of the insulating film IL1 is planarized, and the opening OP1 is formed in the insulating film IL1. In short, the manufacturing process of the semiconductor device in the second modification is also substantially the same as the manufacturing process of the semiconductor device in the first embodiment described above until the structure in FIG. 34 equivalent to FIG. 8 described above is obtained.

Figure 34:
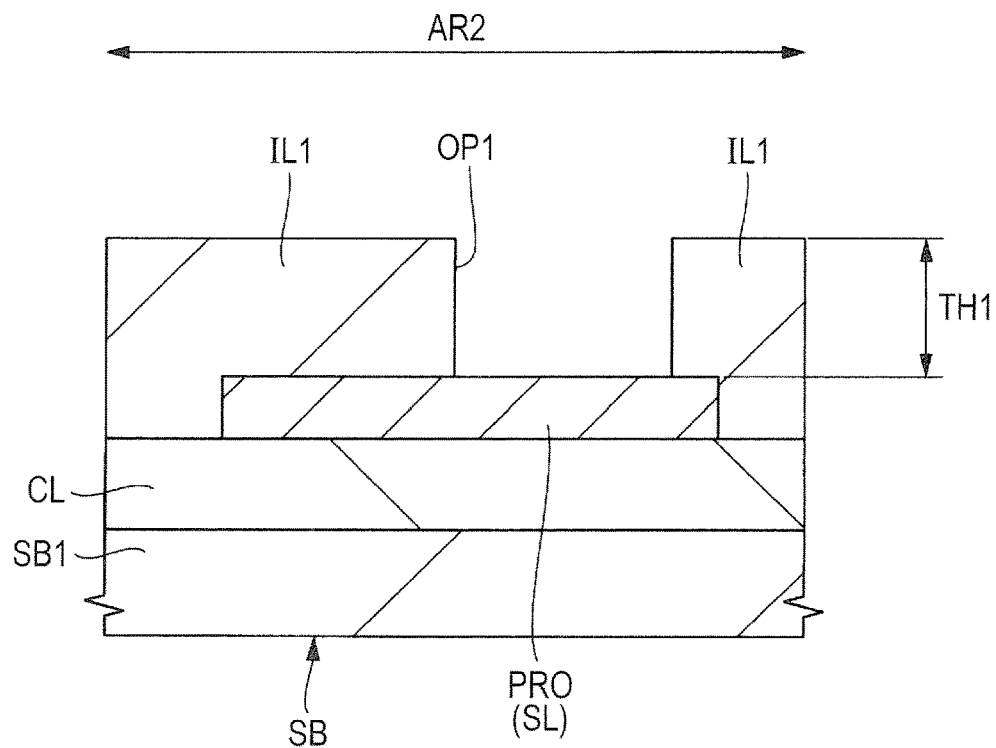
FIG. 34 is a main-portion cross-sectional view of the semiconductor device in the second modification during the manufacturing process thereof.

In the case in the second modification, after the structure in FIG. 34 described above is obtained, as shown in FIG. 35, over the p-type semiconductor portion PRO exposed at the bottom portion of the opening OP1, the n-type semiconductor portion (germanium layer) NRO made of germanium (Ge) is formed. The n-type semiconductor portion NRO can be formed using an epitaxial growth method. In the opening OP1, the n-type semiconductor portion NRO is selectively formed over the p-type semiconductor portion PRO. As a result, an element having a pn junction structure including the p-type semiconductor portion PRO made of silicon and the n-type semiconductor portion NRO made of germanium is formed.

Figure 35:
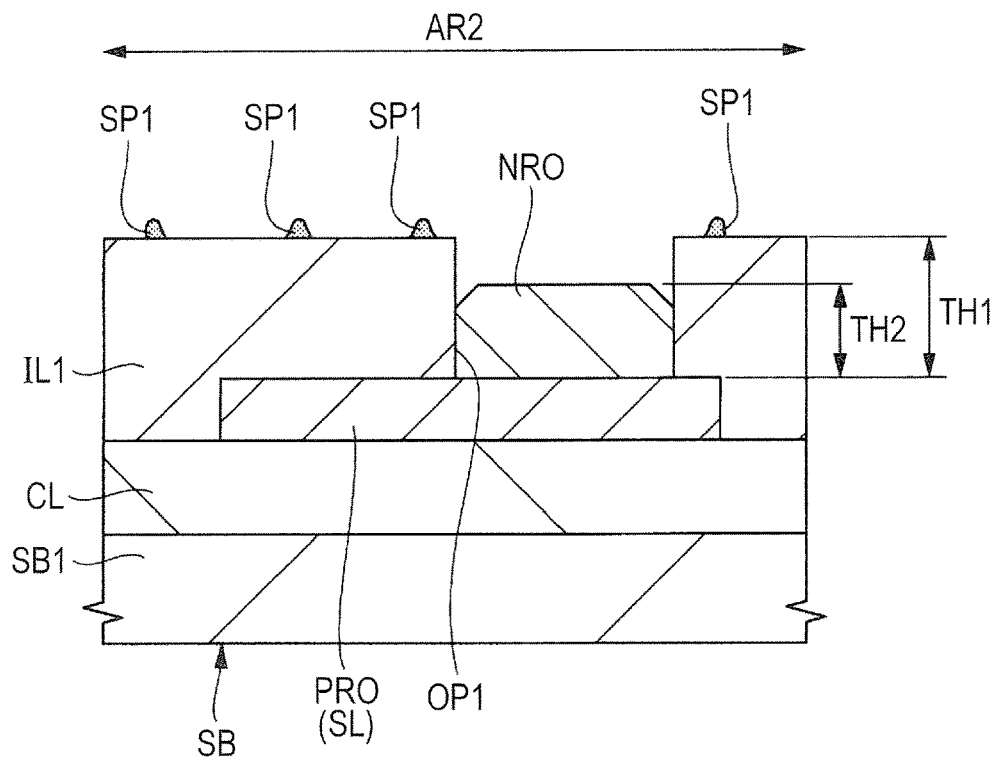
FIG. 35 is a main-portion cross-sectional view of the semiconductor device during the manufacturing process thereof, which is subsequent to FIG. 34.

As shown in FIG. 35, the n-type semiconductor portion (germanium layer) NRO formed by the epitaxial growth method has a generally trapezoidal cross-sectional shape.

Note that, as shown in FIG. 35, when the n-type semiconductor portion (germanium layer) NRO is formed over the p-type semiconductor portion PRO, the selectivity of the selective epitaxial growth method collapses so that the semiconductor particles SP1 made of the same material as that of the n-type semiconductor portion NRO, i.e., germanium are formed over the insulating film IL1.

Figure 36:
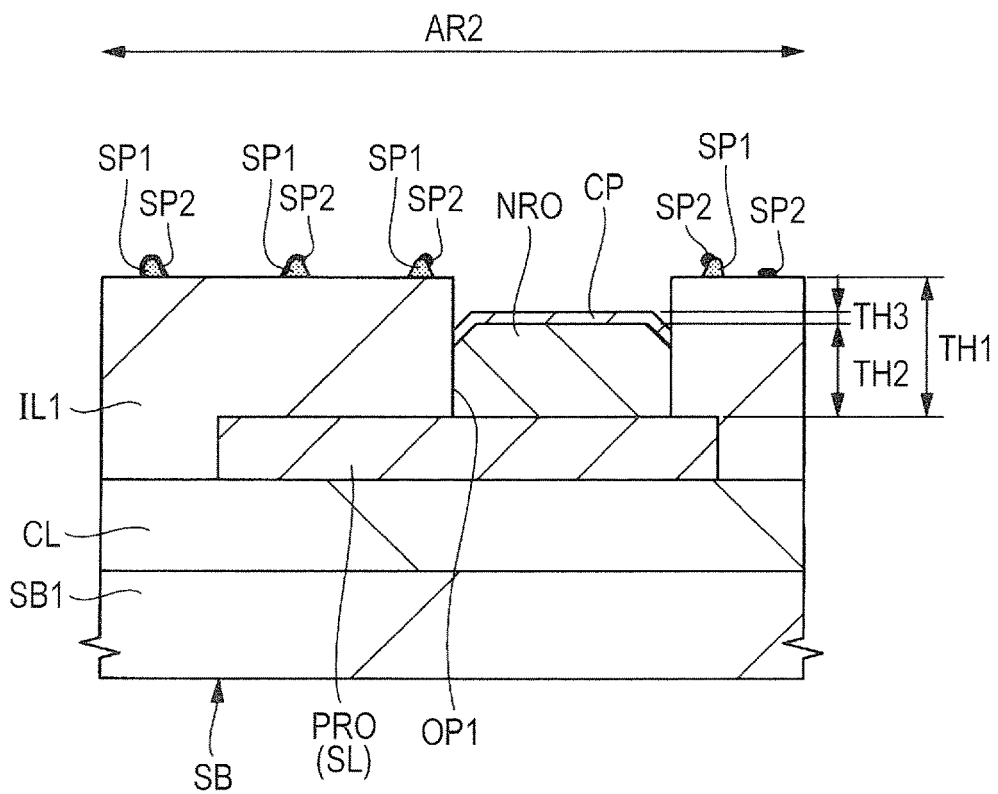
FIG. 36 is a main-portion cross-sectional view of the semiconductor device during the manufacturing process thereof, which is subsequent to FIG. 35.

Next, as shown in FIG. 36, over the n-type semiconductor portion NRO, the cap layer CP is selectively formed. The cap layer CP can be formed by, e.g., epitaxially growing a semiconductor layer (semiconductor layer for the cap layer CP) made of silicon (Si) over the n-type semiconductor portion NRO, and then introducing an n-type impurity into the semiconductor layer using an ion implantation method. In this case, the cap layer CP is made of an n-type silicon layer.

The total thickness of the thickness TH2 of the n-type semiconductor portion NRO and the thickness TH3 of the cap layer CP is smaller than the thickness TH1 of the insulating film IL1 over the p-type semiconductor portion PRO. In other words, the upper surface of the cap layer CP is lower in level than the upper surface of the insulating film IL1. In still other words, the insulating film IL1 is formed over the p-type semiconductor portion PRO such that the thickness TH1 thereof is larger than the total thickness of the thickness TH2 of the n-type semiconductor portion NRO and the thickness TH3 of the cap layer CP.

Note that, as shown in FIG. 36, when the cap layer CP is formed over the n-type semiconductor portion NRO, in the same manner as described above, the selectivity of the selective epitaxial growth method collapses so that semiconductor particles SP2 made of the same material (which is silicon herein) as that of the cap layer CP are formed over the insulating film IL1. Note that the semiconductor particles SP2 come in two types, i.e., the semiconductor particles SP2 formed directly over the insulating film IL1 and the semiconductor particles SP2 formed over the semiconductor particles SP1 using the semiconductor particles SP1 over the insulating film IL1 as nucleus.

Figure 37:
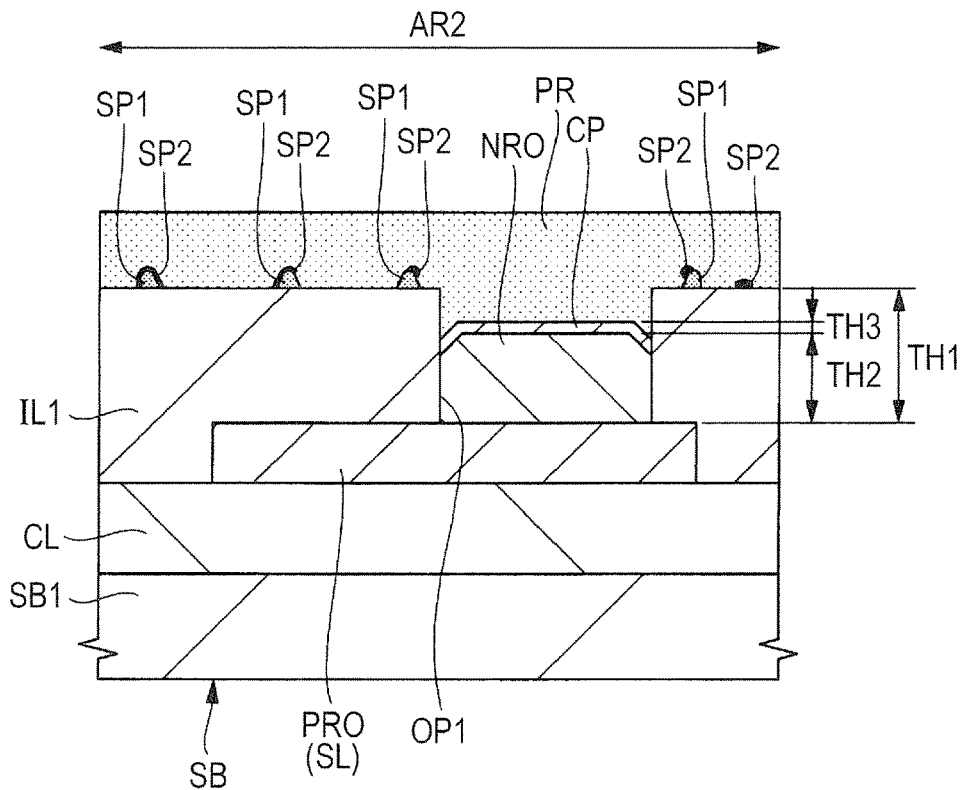
FIG. 37 is a main-portion cross-sectional view of the semiconductor device during the manufacturing process thereof, which is subsequent to FIG. 36.

Next, as shown in FIG. 37, over the insulating film IL1 including the cap layer CP, the photoresist film (second insulating film) PR is formed. The photoresist film PR is embedded in the opening OP1 to overlie the cap layer CP.

Figure 38:
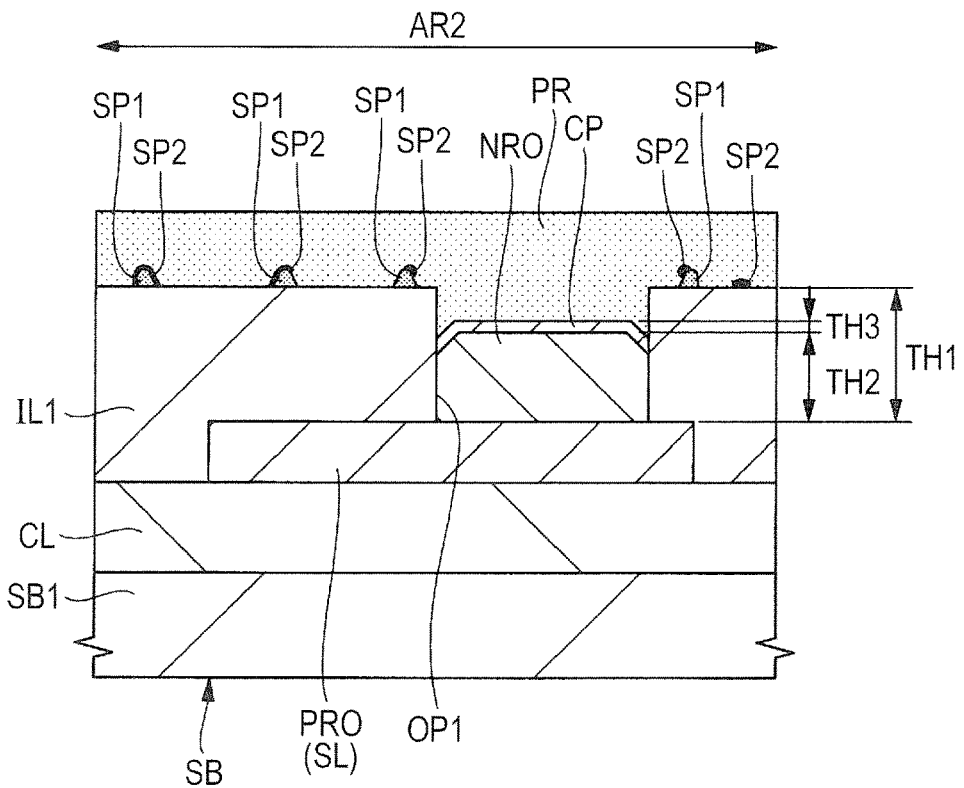
FIG. 38 is a main-portion cross-sectional view of the semiconductor device during the manufacturing process thereof, which is subsequent to FIG. 37.

Next, as shown in FIG. 38, the photoresist film PR is removed from over the insulating film IL1 to be left only over the cap layer CP in the opening OP1. As a method of removing the photoresist film PR, a method which does not affect the insulating film IL1 and the cap layer CP is used preferably. For example, a resist etch-back process using an $O_2$ plasma or the like is used preferably. It may also be possible to remove the photoresist film PR from over the insulating film IL1 by a resist CMP method. In this case also, the photoresist film PR can be left only over the cap layer CP in the opening OP1.

Figure 39:
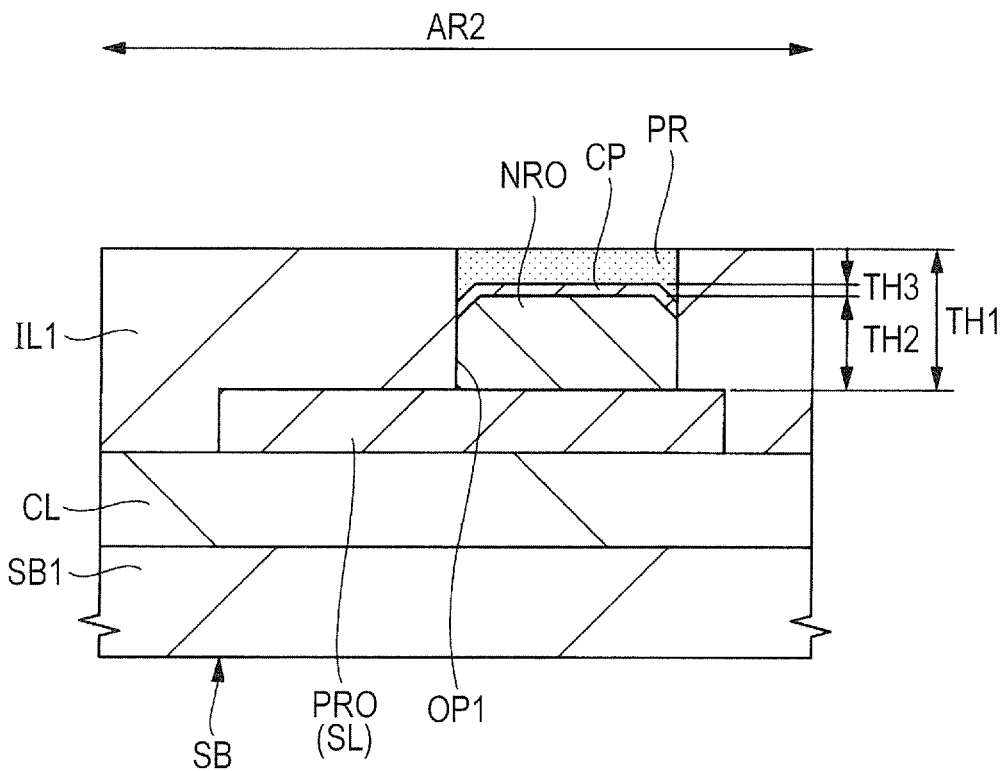
FIG. 39 is a main-portion cross-sectional view of the semiconductor device during the manufacturing process thereof, which is subsequent to FIG. 38.

Next, as shown in FIG. 39, the semiconductor particles SP1 and the semiconductor particles SP2 are removed from over the insulating film IL1. At this time, the n-type semiconductor portion NRO made of the same material as that of the semiconductor particles SP1 is covered with the cap layer CP and the insulating film IL1, while the cap layer CP made of the same material as that of the semiconductor particles SP2 are covered with the photoresist film PR and the insulating film IL1. Accordingly, the n-type semiconductor portion NRO and the cap layer CP are not removed. As a method of removing the semiconductor particles SP1 and the semiconductor particles SP2, a method which does not damage the insulating film IL1 and the photoresist film PR and which also allows simultaneous removal of the semiconductor particles SP1 and the semiconductor particles SP2 is used preferably.

Figure 40:
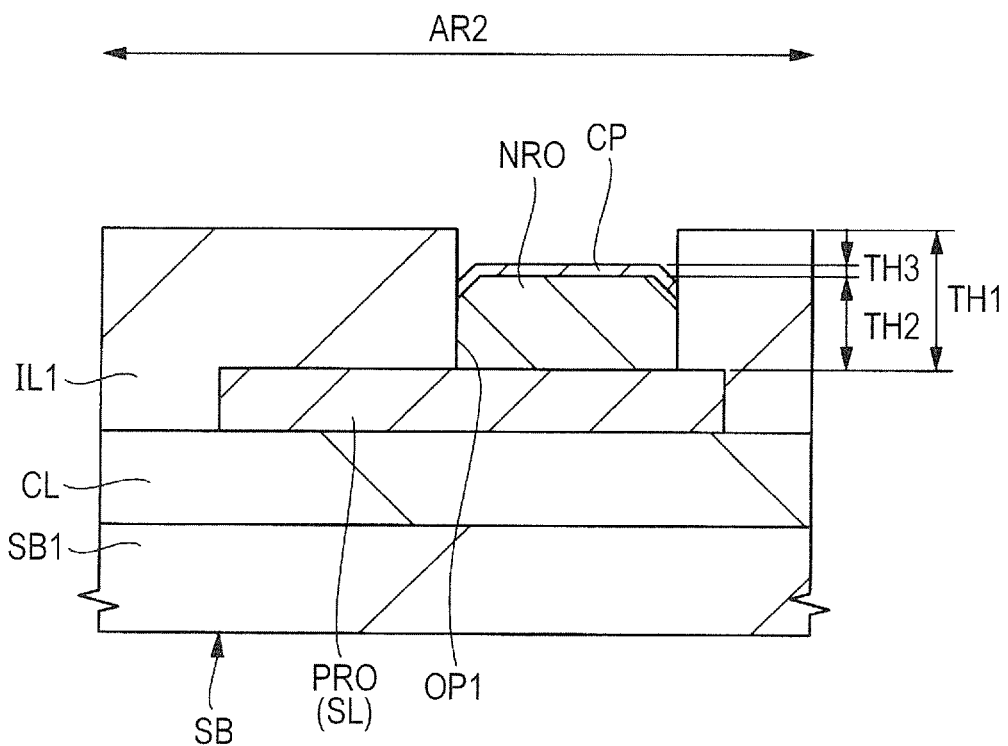
FIG. 40 is a main-portion cross-sectional view of the semiconductor device during the manufacturing process thereof, which is subsequent to FIG. 39.

Next, as shown in FIG. 40, the photoresist film PR in the opening OP1 is removed by asking or the like.

Next, as shown in FIG. 33, over the insulating film IL1 including the cap layer CP, the insulating film IL2 is formed. After the formation of the insulating film IL2, the upper surface of the insulating film IL2 is subjected to polishing using a CMP method or the like to be planarized. The insulating film IL2 is preferably made of a silicon oxide film, and is more preferably made of a silicon oxide film with excellent embeddability. The insulating film IL2 is preferably formed using an SACVD method using $O_3$-TEOS as a raw material gas or an SOG method.

Then, as necessary, the contact holes, the plugs, and the wires are formed, but the depiction and description thereof is omitted.

The semiconductor device in the second modification shown in FIG. 33 is different from the semiconductor device in the first embodiment in that, over the n-type semiconductor portion NRO, i.e., between the n-type semiconductor portion NRO and the insulating film IL2, the cap layer CP is formed. By forming the cap layer CP, it is possible to improve damage when a silicon oxide film formed in a layer located above the germanium layer included in the n-type semiconductor portion NRO or the like is formed directly over the germanium layer and suppress an increase in dark current or the like.

Note that, as shown in FIG. 36, when the cap layer CP is formed over the n-type semiconductor portion NRO, in the same manner as described above, the selectivity of the selective epitaxial growth method collapses so that the semiconductor particles SP2 made of silicon are formed over the insulating film IL1. Since the thickness of the formed cap layer CP is smaller the thickness of the formed n-type semiconductor portion NRO, it seems that the quantity of the formed semiconductor particles SP2 is smaller than that of the formed semiconductor particles SP1 and presents no problem. However, since the semiconductor particles SP1 are present over the insulating film IL1, the semiconductor particles SP2 are likely to grow using the semiconductor particles SP1 as nucleus and therefore cannot be ignored. Accordingly, to improve the reliability of the semiconductor device, it is necessary to reliably remove both of the semiconductor particles SP1 and the semiconductor particles SP2 which are generated over the insulating film IL1.

To satisfy the necessity, as shown in FIG. 36, the total thickness of the thickness TH2 of the n-type semiconductor portion NRO and the thickness TH3 of the cap layer CP is set smaller than the thickness TH1 of the insulating film IL1 over the p-type semiconductor portion PRO. As a result, as shown in FIG. 37, the photoresist film PR is embedded in the opening OP1 of the insulating film IL1 to overlie the cap layer CP. Subsequently, in accordance with the upper surface of the insulating film IL1, the photoresist film PR is etched (etched back). Thus, as shown in FIG. 38, it is possible to expose the semiconductor particles SP1 and the semiconductor particles SP2 over the insulating film IL1 and leave the photoresist film PR only over the cap layer CP in the opening OP1 of the insulating film IL1. The n-type semiconductor portion NRO is covered with the cap layer CP and the insulating film IL1. The cap layer CP is further covered with the photoresist film PR and the insulating film IL1. Accordingly, by etching the semiconductor particles SP1 and the semiconductor particles SP2 in this state, it is possible to remove only the semiconductor particles SP1 and the semiconductor particles SP2 without etching the cap layer CP and the n-type semiconductor portion NRO. Then, as shown in FIG. 33, when the insulating film IL2 is formed over the insulating film IL1, a state is established in which, between the insulating film IL1 and the insulating film IL2, the semiconductor particles SP1 and the semiconductor particles SP2 are not present. Consequently, in the same manner as in the semiconductor device in the first embodiment, it is possible to prevent a problem resulting from the presence of the semiconductor particles SP1 and the semiconductor particles SP2 between the insulating film IL1 and the insulating film IL2 and improve the reliability of the semiconductor device.

Also, in the second modification, as shown in FIG. 40, when the photoresist film PR in the opening OP1 is removed by ashing or the like, the cap layer CP formed over the n-type semiconductor portion NRO can prevent a situation in which the upper surface of the n-type semiconductor portion NRO is damaged by the ashing of the photoresist film PR. In this respect also, it is possible to improve the reliability of the manufactured semiconductor device.

Also, in the second modification, by using a method which allows simultaneous removal of the semiconductor particles SP1 and the semiconductor particles SP2, such as, e.g., dry etching using a halogen-based gas, the semiconductor particles SP1 and the semiconductor particles SP2 can be removed in one step.

Second Embodiment

Figure 41:
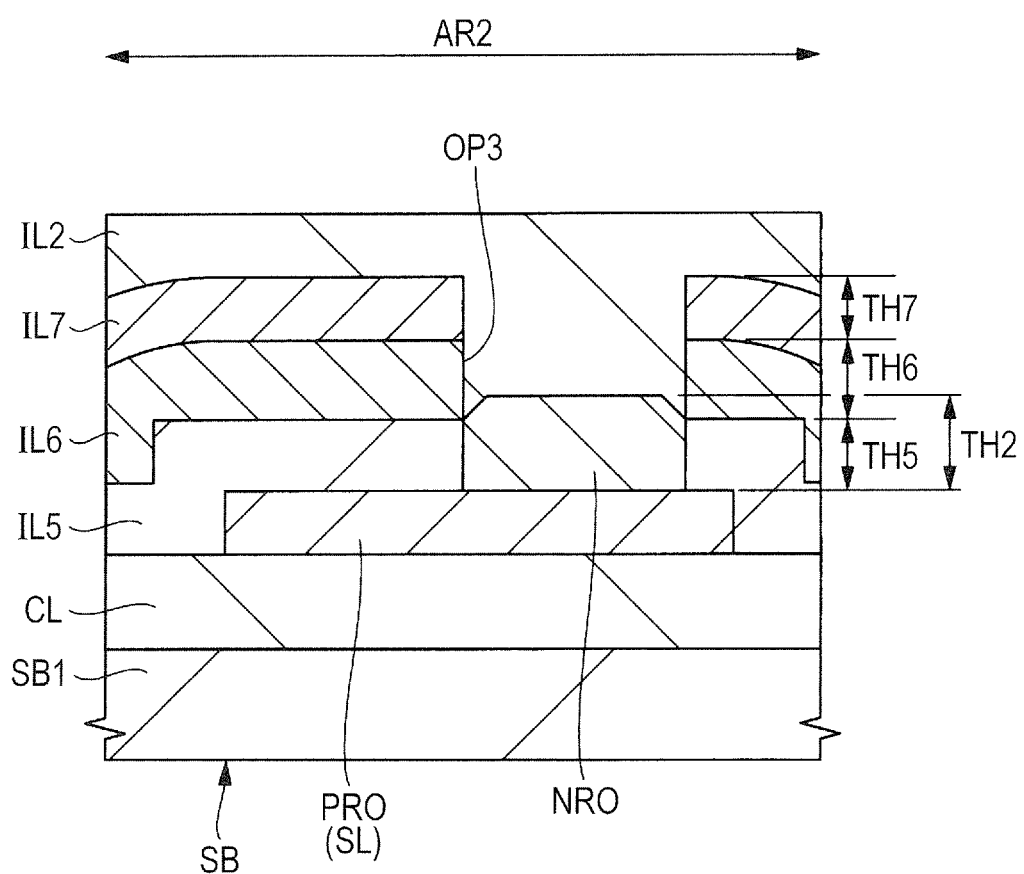
FIG. 41 is a main-portion cross-sectional view of a semiconductor device in a second embodiment.

Referring to FIG. 41, a description will be given of a semiconductor device in a second embodiment. FIG. 41 is a main-portion cross-sectional view of the semiconductor device in the present second embodiment. In the present second embodiment, a description will be given of the configuration of the germanium optical receiver formed in the area AR2 shown in FIG. 1, while a description of the other components of the semiconductor device is omitted. Accordingly, FIG. 41 shows only the cross-sectional view of the area AR2. Note that, in FIG. 41, for simpler illustration, the depiction of the contact holes CT, the plugs PG, the interlayer insulating film IL4, and the structure located thereabove which are shown in FIG. 1 described above is omitted.

The semiconductor device in the second embodiment shown in FIG. 41 includes the base SB1, the insulating layer CL formed over the base SB1, the optical waveguides WO1 and WO2 and the semiconductor portion PRO which are formed over the insulating layer CL, and the semiconductor portion NRO formed over the semiconductor portion PRO, similarly to the semiconductor device in the first embodiment described above. Note that the optical waveguide WO2 is shown in FIG. 3 described above, but is not shown in FIGS. 1 and 41 described above.

The semiconductor device in the second embodiment shown in FIG. 41 includes the base SB1, the insulating layer CL formed over the base SB1, the optical waveguides WO1 and WO2 and the semiconductor portion PRO which are formed over the insulating layer CL, and the semiconductor portion NRO formed over the semiconductor portion PRO, similarly to the semiconductor device in the first embodiment described above. Note that the depiction of the optical waveguides WO1 and WO2 is omitted.

As shown in FIG. 41, the second embodiment is different from the foregoing first embodiment in that, over the insulating layer CL, insulating films IL5, IL6, and IL7 are formed. The second semiconductor portion included in the germanium optical receiver includes the germanium layer (semiconductor portion NRO) formed over the first semiconductor portion (p-type semiconductor portion PRO), and the second embodiment is also different from the foregoing first embodiment in that the second semiconductor portion is formed in an opening OP3 of the insulating films IL5, IL6, and IL7. In particular, the thickness TH2 of the second semiconductor portion (n-type semiconductor portion NRO) is smaller than the total thickness of a thickness TH5 of the insulating film IL5, a thickness TH6 of the insulating film IL6, and a thickness TH7 of the insulating film IL7 above the first semiconductor portion (p-type semiconductor portion PRO).

Preferably, the insulating film IL5 is made of a silicon oxide film. As will be described later, the insulating film IL5 is preferably a high-quality (high-density) insulating film. More preferably, the insulating film IL5 is made of the same material as that of the insulating layer CL and has the same film quality as that of the insulating layer CL. The thickness of the insulating film IL5 is, e.g., 30 to 200 nm, and is preferably 30 to 50 nm.

Preferably, the insulating film IL6 is made of a silicon oxide film. As will be described later, the insulating film IL6 more preferably has high planarity (embeddability). The planarity mentioned herein refers to the property of an insulating film which allows, when the insulating film is formed over an uneven surface, the uneven surface to be smoothed out and planarizes the upper surface of the insulating film. The thickness of the insulating film IL6 is, e.g., 300 to 700 nm, and is preferably about 500 nm.

The insulating film IL7 is preferably made of a silicon oxide film. As will be described later, the insulating film IL7 is preferably a high-quality (high-density) silicon oxide film. The thickness of the insulating film IL7 is, e.g., 100 to 300 nm, and is preferably about 200 nm.

The contact holes, the plugs, and the wires which are formed in the semiconductor device in the second embodiment are the same as those formed in the semiconductor device in the foregoing first embodiment so that the depiction and description thereof is omitted.

Next, referring to FIGS. 42 to 51, a description will be given of a manufacturing process of the semiconductor device in the second embodiment shown in FIG. 41. FIGS. 42 to 51 are main-portion cross-sectional views of the semiconductor device in the second embodiment during the manufacturing process thereof, which show cross sections equivalent to that shown in FIG. 41 described above.

In the second embodiment, in the same manner as in the foregoing first embodiment, the semiconductor layer SL is patterned to form the semiconductor portion PRO and, using an ion implantation method or the like, a p-type impurity is introduced into the semiconductor portion PRO to change the semiconductor portion PRO into the p-type semiconductor portion PRO. In short, the manufacturing process of the semiconductor device in the second embodiment is also substantially the same as the manufacturing process in the first embodiment described above until the structure in FIG. 42 equivalent to FIG. 5 described above is obtained.

Figure 42:
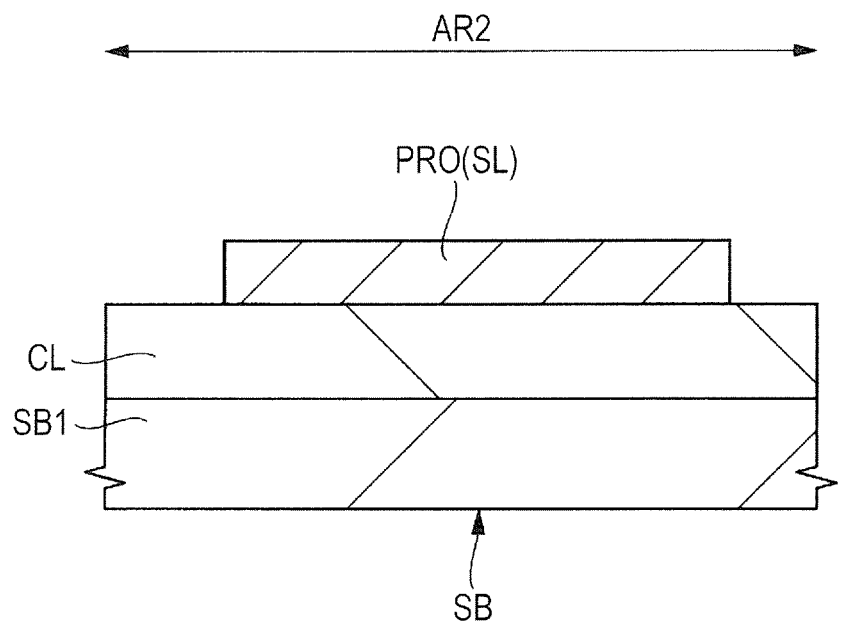
FIG. 42 is a main-portion cross-sectional view of the semiconductor device in the second embodiment during the manufacturing process thereof.
Figure 43:
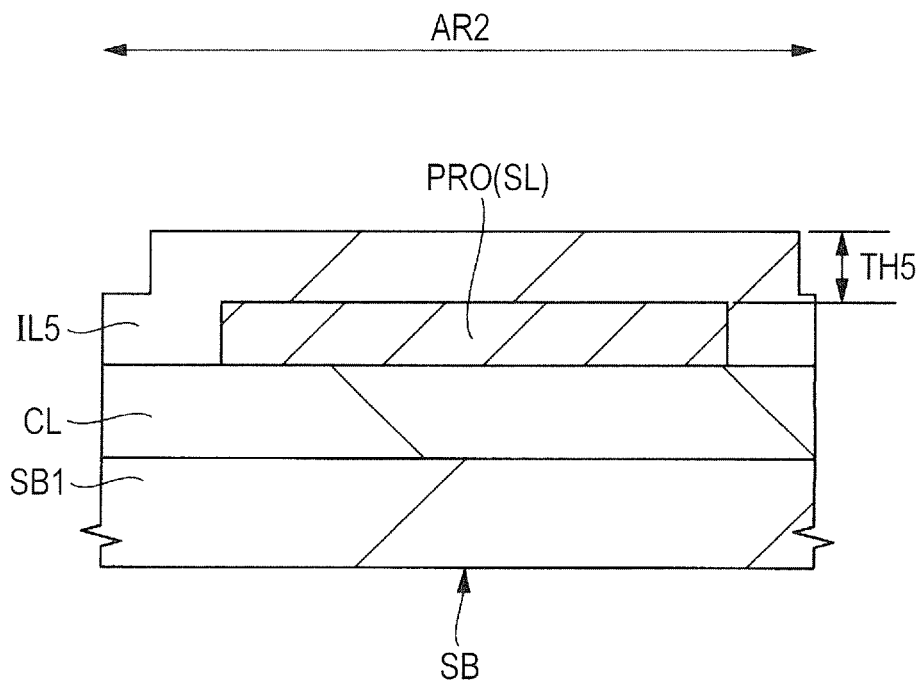
FIG. 43 is a main-portion cross-sectional view of the semiconductor device during the manufacturing process thereof, which is subsequent to FIG. 42.

In the case in the second embodiment, after the structure in FIG. 42 described above is obtained, as shown in FIG. 43, the insulating film IL5 is formed over the SOI substrate SB, i.e., over the insulating layer CL so as to cover the optical waveguides WO1 and WO2 and the semiconductor portion PRO. The insulating film IL5 is preferably made of a silicon oxide film, and is more preferably made of a high-quality (high-density) silicon oxide film. The insulating film IL5 can be formed preferably using an LPCVD method.

Figure 44:
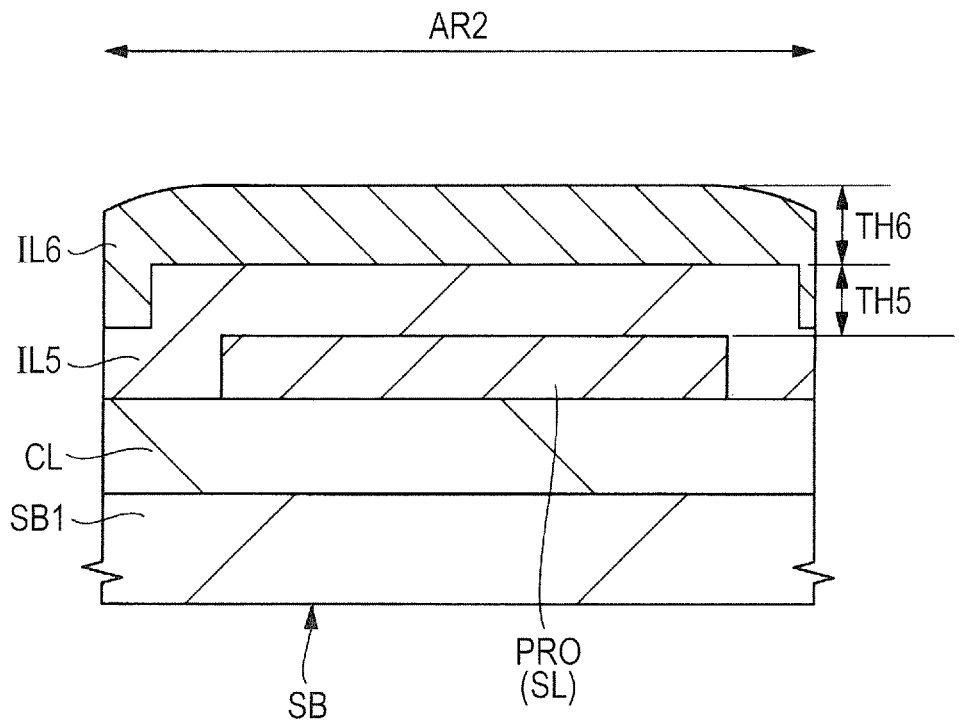
FIG. 44 is a main-portion cross-sectional view of the semiconductor device during the manufacturing process thereof, which is subsequent to FIG. 43.

Next, as shown in FIG. 44, after the formation of the insulating film IL5, the insulating film IL6 is formed over the insulating film IL5. The insulating film IL6 is preferably made of a silicon oxide film, and is more preferably made of a silicon oxide film with high planarity. Preferably, the insulating film IL6 is formed using an SACVD method using $O_3$-TEOS as a raw material gas or an SOG method. The SACVD method using $O_3$-TEOS as a raw material gas or the SOG method allows a silicon oxide film with high planarity to be formed.

Figure 45:
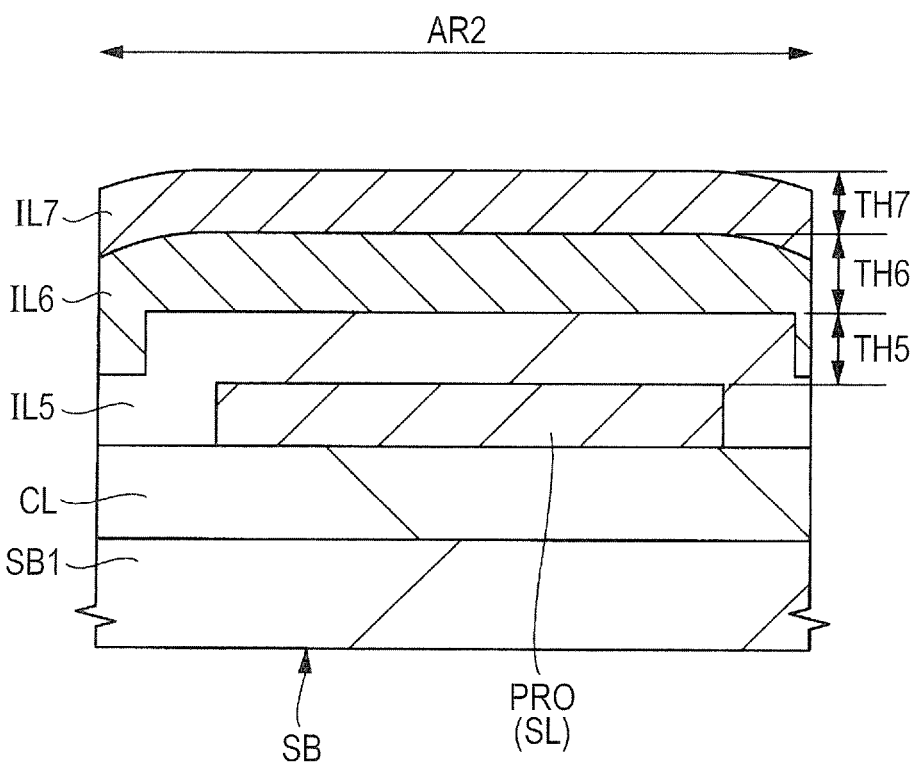
FIG. 45 is a main-portion cross-sectional view of the semiconductor device during the manufacturing process thereof, which is subsequent to FIG. 44.

Next, as shown in FIG. 45, after the formation of the insulating film IL6, the insulating film IL7 is formed over the insulating film IL6. The insulating film IL7 is preferably made of silicon oxide film, and is more preferably made of a high-quality (high-density) silicon oxide film. Preferably, the insulating film IL7 is formed using an LPCVD method or a PECVD method. The PECVD method allows a high-quality (high-density) silicon oxide film to be formed. Note that, when the speed of forming the insulating film IL7 is prioritized, the insulating film IL7 is preferably formed by the PECVD method. On the other hand, when the quality of the insulating film IL7 is prioritized, the insulating film IL7 is preferably formed by the LPCVD method.

Figure 46:
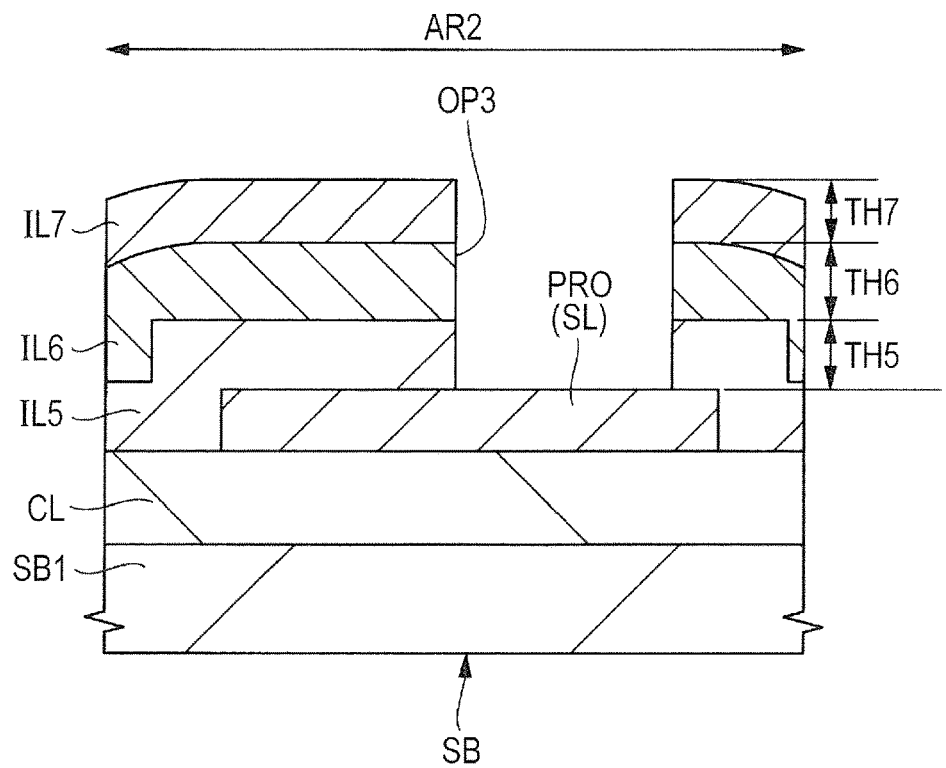
FIG. 46 is a main-portion cross-sectional view of the semiconductor device during the manufacturing process thereof, which is subsequent to FIG. 45.

Next, as shown in FIG. 46, using a photolithographic technique and an etching technique, the opening OP3 is formed in the insulating films IL5, IL6, and IL7. The two-dimensional size (area) of the opening OP3 is smaller than the two-dimensional size of the p-type semiconductor portion PRO. In plan view, the opening OP3 is included in the p-type semiconductor portion PRO. The opening OP3 extends through the insulating films IL5, IL6, and IL7 to reach the semiconductor portion PRO. At the bottom portion of the opening OP3, a portion of the upper surface of the semiconductor portion PRO is exposed. As shown in FIG. 46, the second embodiment is different from the foregoing first embodiment in that the opening OP3 is formed without planarizing the upper surface of the insulating film IL7.

Figure 47:
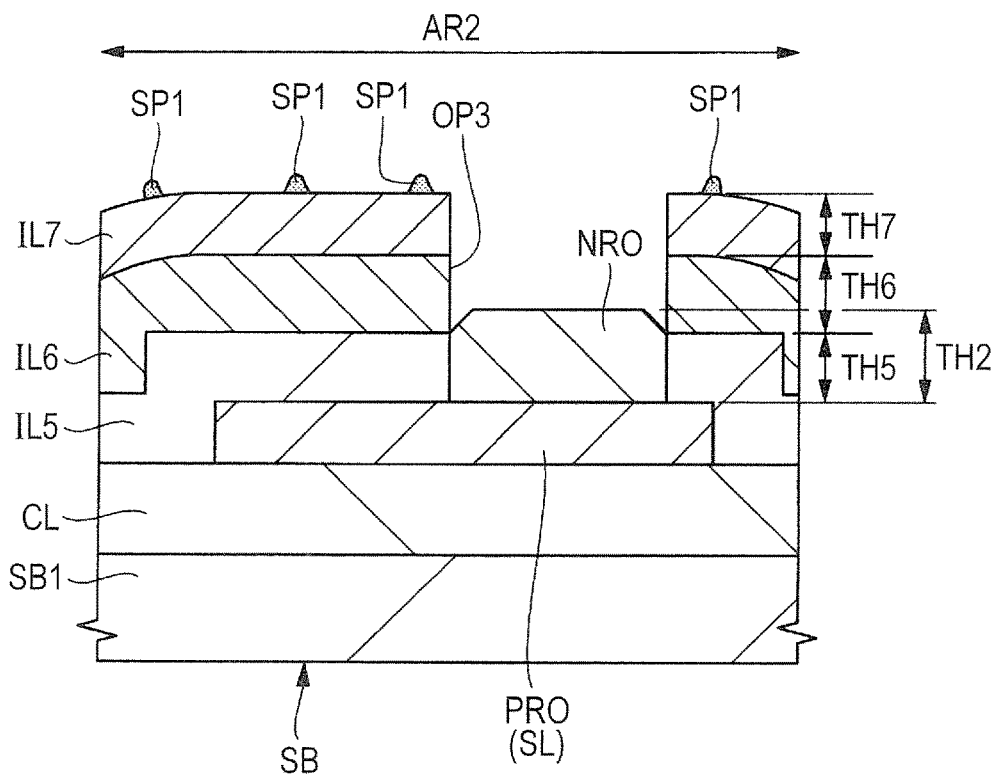
FIG. 47 is a main-portion cross-sectional view of the semiconductor device during the manufacturing process thereof, which is subsequent to FIG. 46.

Next, as shown in FIG. 47, over the p-type semiconductor portion PRO exposed at the bottom portion of the opening OP3, the n-type semiconductor portion (germanium layer) NRO made of germanium (Ge) is formed. The n-type semiconductor portion NRO can be formed using an epitaxial growth method and is selectively formed over the p-type semiconductor portion PRO in the opening OP3. As a result, an element having a pn junction structure including the p-type semiconductor portion PRO made of silicon and the n-type semiconductor portion NRO made of germanium is formed.

As shown in FIG. 47, the n-type semiconductor portion (germanium layer) NRO formed by an epitaxial growth method has a generally trapezoidal cross-sectional shape.

Note that, as shown in FIG. 47, when the n-type semiconductor portion (germanium layer) NRO is formed over the p-type semiconductor portion PRO, the selectivity of the selective epitaxial growth method collapses so that the semiconductor particles SP1 made of the same material as that of the n-type semiconductor portion NRO, i.e., germanium are formed over the insulating film IL7.

The thickness TH2 of the n-type semiconductor portion NRO is smaller herein than the total thickness of the thickness TH5 of the insulating film IL5, the thickness TH6 of the insulating film IL6, and the thickness TH7 of the insulating film IL7 above the p-type semiconductor portion PRO. In other words, the upper surface of the n-type semiconductor portion NRO is lower in level than the upper surface of the insulating film IL7. In still other words, the insulating films IL5, IL6, and IL7 are formed such that the total thickness of the thickness TH5 of the insulating film IL5, the thickness TH6 of the insulating film IL6, and the thickness TH7 of the insulating film IL7 above the p-type semiconductor portion PRO is larger than the thickness TH2 of the n-type semiconductor portion NRO.

Figure 48:
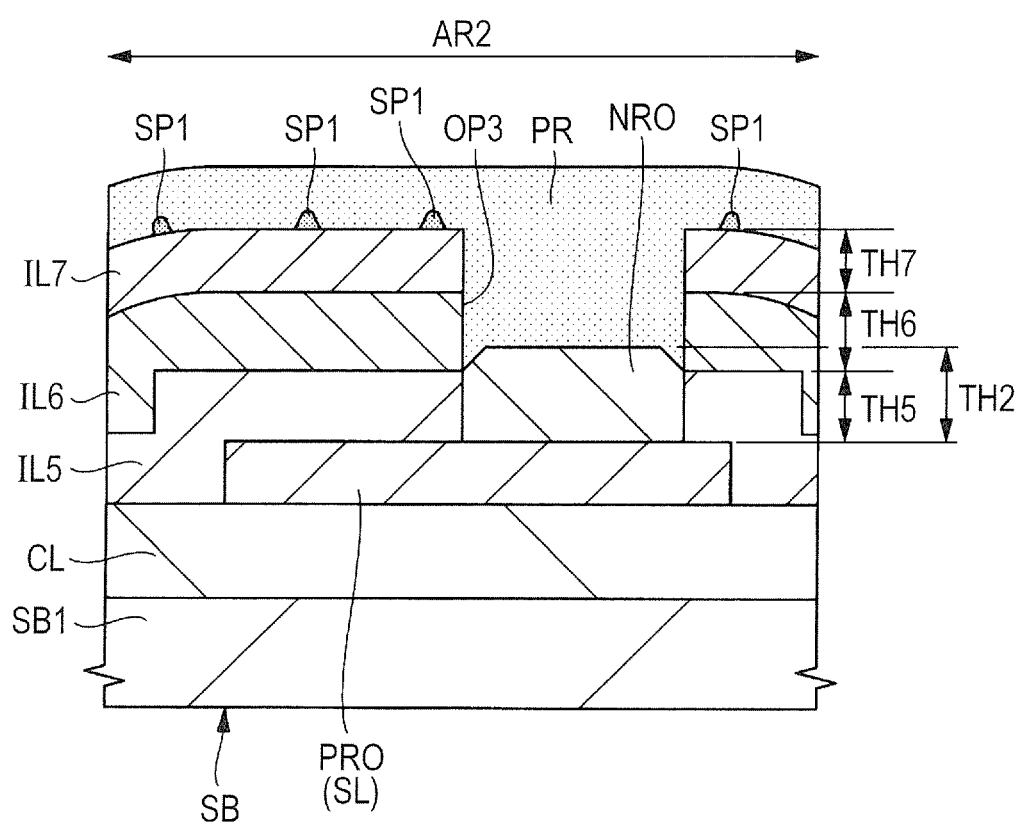
FIG. 48 is a main-portion cross-sectional view of the semiconductor device during the manufacturing process thereof, which is subsequent to FIG. 47.

Next, as shown in FIG. 48, over the insulating film IL7 including the n-type semiconductor portion NRO, the photoresist film (second insulating film) PR is formed. The photoresist film PR is embedded in the opening OP3 to overlie the n-type semiconductor portion NRO.

Figure 49:
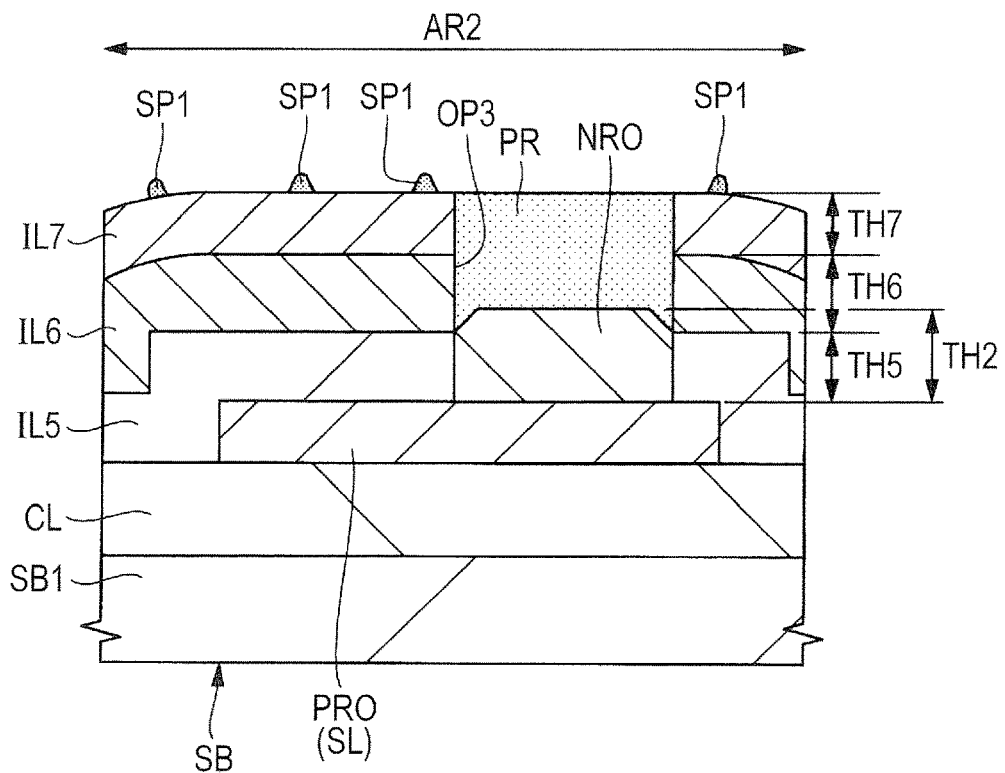
FIG. 49 is a main-portion cross-sectional view of the semiconductor device during the manufacturing process thereof, which is subsequent to FIG. 48.

Next, as shown in FIG. 49, the photoresist film PR is removed from over the insulating film IL7 to be left only over the n-type semiconductor portion NRO in the opening OP3. As a method of removing the photoresist film PR, a method which does not damage the insulating film IL7 is used preferably. For example, a resist etch-back process using an $O_2$ plasma or the like is used preferably.

Figure 50:
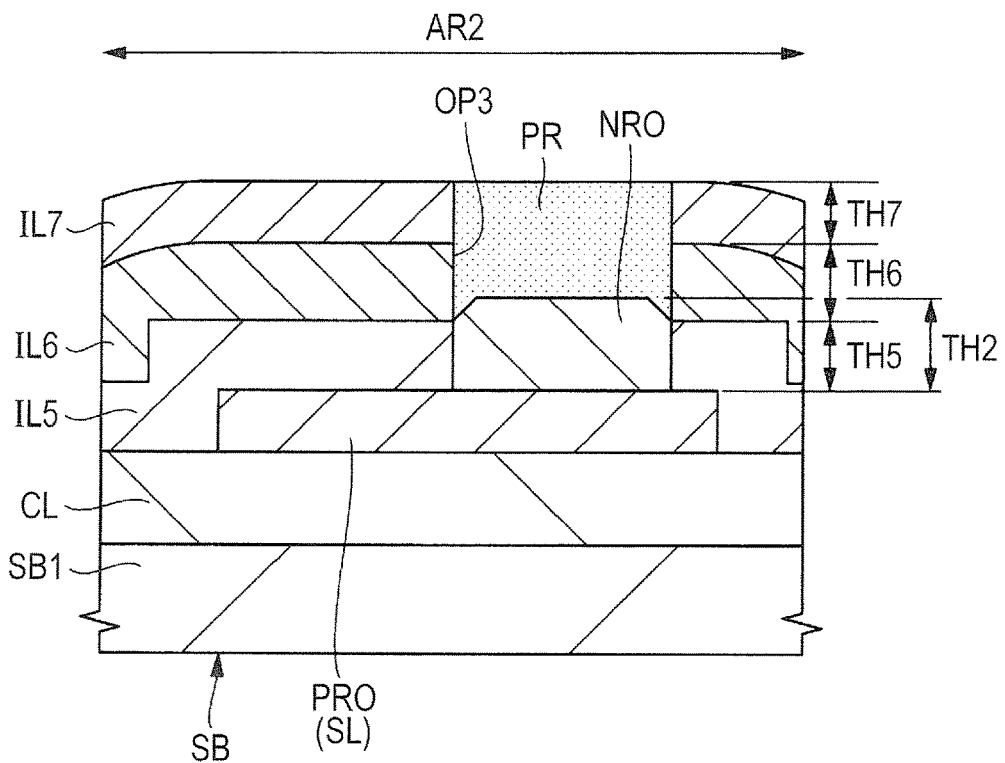
FIG. 50 is a main-portion cross-sectional view of the semiconductor device during the manufacturing process thereof, which is subsequent to FIG. 49.

Next, as shown in FIG. 50, the semiconductor particles SP1 are removed from over the insulating film IL7. The n-type semiconductor portion NRO made of the same material as that of the semiconductor particles SP1 is covered with the photoresist film PR and the insulating films IL5, IL6, and IL7, and is therefore not removed. As a method of removing the semiconductor particles SP1, a method which does not damage the photoresist film PR and the insulating films IL5, IL6, and IL7 is used preferably. For example, dry etching using a halogen-based gas is used preferably.

Figure 51:
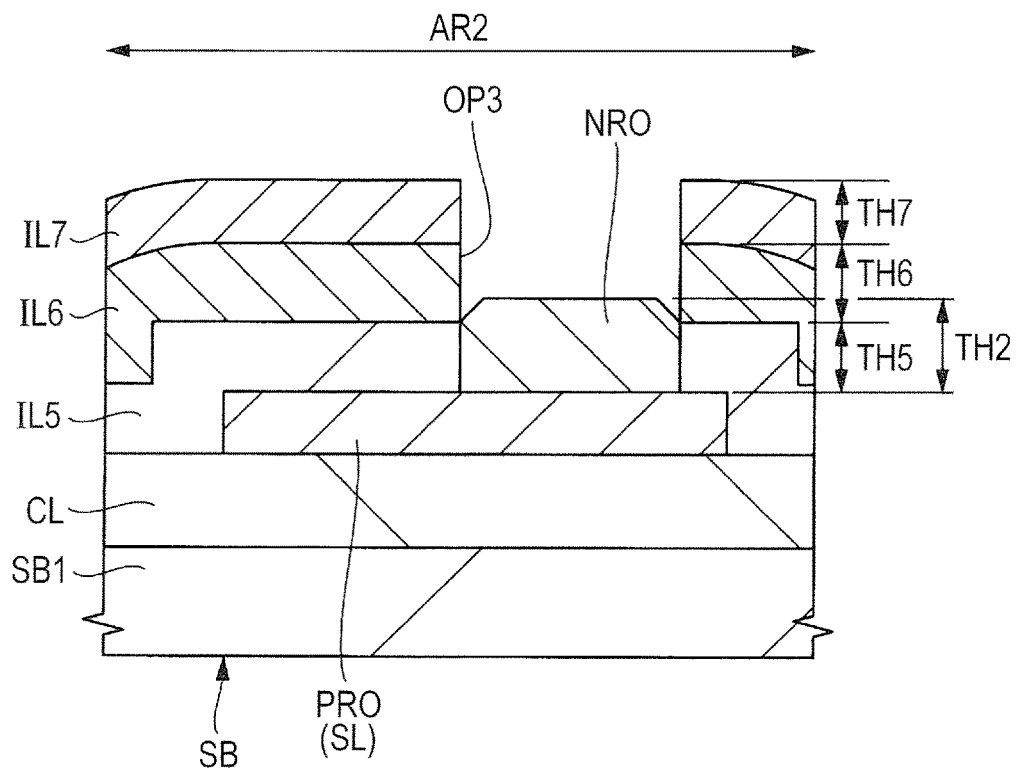
FIG. 51 is a main-portion cross-sectional view of the semiconductor device during the manufacturing process thereof, which is subsequent to FIG. 50.

Next, as shown in FIG. 51, the photoresist film PR in the opening OP3 is removed by asking or the like.

Next, as shown in FIG. 41, over the insulating film IL7 including the n-type semiconductor portion NRO, the insulating film IL2 is formed. After the formation of the insulating film IL2, the upper surface of the insulating film IL2 is subjected to polishing using a CMP method or the like to be planarized. The insulating film IL2 can be formed using, e.g., an SACVD method using $O_3$-TEOS as a raw material gas or an SOG method.

Subsequently, as necessary, the contact holes, the plugs, and the wires are formed, but the depiction and description thereof is omitted.

As shown in FIG. 41, the second embodiment is different from the foregoing first embodiment in which the insulating film IL1 is formed over the insulating layer CL in that the insulating films IL5, IL6, and IL7 are formed over the insulating layer CL. The second semiconductor portion included in the germanium optical receiver PD includes the germanium layer (semiconductor portion NRO) formed over the first semiconductor portion (p-type semiconductor portion PRO), and the second embodiment is also different from the foregoing first embodiment in that the second semiconductor portion is formed in the opening OP3 of the insulating films IL5, IL6, and IL7. In particular, the thickness TH2 of the second semiconductor portion (n-type semiconductor portion NRO) is smaller than the total thickness of the thickness TH5 of the insulating film IL5, the thickness TH6 of the insulating film IL6, and the thickness TH7 of the insulating film IL7 above the first semiconductor portion (p-type semiconductor portion PRO).

By thus setting the thickness TH2 of the n-type semiconductor portion NRO smaller than the total thickness of the thickness TH5 of the insulating film IL5, the thickness TH6 of the insulating film IL6, and the thickness TH7 of the insulating film IL7 above the first semiconductor portion (p-type semiconductor portion PRO) as shown in FIG. 47, the photoresist film PR is embedded in the opening OP3 of the insulating films IL5, IL6, and IL7 to overlie the n-type semiconductor portion NRO, as shown in FIG. 48. Subsequently, the photoresist film PR is etched (etched back) in accordance with the upper surface of the insulating film IL7. By doing so, as shown in FIG. 49, it is possible to expose the semiconductor particles SP1 over the insulating film IL7 and leave the photoresist film PR only over the n-type semiconductor portion NRO in the opening OP3 of the insulating films IL5, IL6, and IL7. The n-type semiconductor portion NRO is covered with the photoresist film PR and the insulating films IL5, IL6, and IL7. Accordingly, by etching the semiconductor particles PS1 in this state, it is possible to remove only the semiconductor particles SP1 without etching the n-type semiconductor portion NRO made of the same material as that of the semiconductor particles SP1. When the insulating film IL2 is then formed over the insulating film IL7 as shown in FIG. 41, a state is established in which, between the insulating film IL7 and the insulating film IL2, the semiconductor particles SP1 are not present. Therefore, in the semiconductor device in the second embodiment, in the same manner as in the semiconductor device in the foregoing first embodiment, it is possible to prevent a problem resulting from the presence of the semiconductor particles SP1 between the insulating film IL7 and the insulating film IL2 and improve the reliability of the semiconductor device.

As described above, in the foregoing first embodiment, as shown in FIG. 11, the amount of etching of the photoresist film PR is easily controlled and the semiconductor particles SP1 formed due to the collapsed selectivity of the epitaxial growth method are easily removed. Accordingly, as shown in FIG. 7, after the formation of the insulating film IL1, the upper surface of the insulating film IL1 is polished by a CMP method to be planarized. However, when a planarization step using the CMP method is performed, the manufacturing cost of the semiconductor device is disadvantageously increased. To avoid this, it has been attempted to form an insulating film with high planarity, instead of the insulating film IL1, over the insulating layer CL and thus omit the planarization step using the CMP method.

In the foregoing first embodiment, it is necessary to cause the insulating layer CL and the insulating film IL1 each covering the germanium optical receiver PD (the p-type semiconductor portion PRO and the n-type semiconductor portion NRO) to function as the clad layer. In an insulating film made of a silicon oxide film, the planarity and the film quality (film density) have a trade-off relationship therebetween. Accordingly, when an insulating film which merely has high planarity is formed over the insulating layer CL, it follows that the germanium optical receiver PD is covered with the insulating film which is high in planarity but is low in density. As a result, due to the insulating film, the germanium optical receiver PD may suffer an optical property loss. When an optical signal transmission line (optical waveguide WO1 shown in FIG. 1) is formed and the area AR1 and the area AR2 are adjacent to each other, though not shown, the optical waveguide WO1 is present over the insulating layer CL in the same layer as that of the p-type semiconductor portion PRO. As a result, when the insulating film which merely has high planarity is formed over the insulating layer CL, it follows that the optical waveguide WO1 is covered with the insulating film which is high in planarity but is low in density. This may undesirably increase a propagation loss in the optical waveguide WO1.

Also, as described above, the insulating film having high planarity has low density and therefore the insulating film is likely to absorb moisture. The absorbed moisture is evaporated in the subsequent heating step to cause a contact failure. To prevent this, it is necessary to protect the insulating film having high planarity from being exposed.

As a result of making such an attempt, in the second embodiment, the high-quality (high-density) insulating film IL5 is formed first over the insulating layer CL. Thus, the germanium optical receiver PD (and the optical waveguide WO1) is covered with the high-quality (high-density) insulating film. As a result, it is possible to prevent a loss in the optical property of the germanium optical receiver PD (and the optical waveguide WO1). Then, over the insulating film IL5, the insulating film IL6 with high planarity is formed. This allows the upper surface of the insulating film IL6 to be planarized. Then, over the insulating film IL6, the high-quality (high-density) insulating film IL7 is formed. Thus, the lower-density insulating film IL6 is covered with the higher-density insulating film IL7, which can prevent a situation in which the insulating film IL6 absorbs moisture.

Thus, in the second embodiment, by forming the insulating films IL5, IL6, and IL7 over the insulating layer CL, it is possible to omit the step of planarizing the insulating film using the CMP method. Accordingly, in terms of reducing the manufacturing cost of the semiconductor device, the second embodiment is advantageous over the foregoing first embodiment.

On the other hand, the insulating film IL1 in the foregoing first embodiment has planarity higher than that of the insulating film IL7 in the second embodiment. Accordingly, when a comparison is made between the step of removing the photoresist film PR from over the insulating film IL1 in the foregoing first embodiment shown in FIG. 11 and the step of removing the photoresist film PR from over the insulating film IL7 in the second embodiment shown in FIG. 49, the amount of etching of the photoresist film PR can more easily be controlled in the foregoing first embodiment. In this respect, the foregoing first embodiment is advantageous over the second embodiment.

In an epitaxial growth method, the selectivity is less likely to collapse as a silicon oxide film has higher planarity. Accordingly, it can be considered that the quantity of the semiconductor particles SP1 formed over the insulating film IL1 in the foregoing first embodiment is smaller than the quantity of the semiconductor particles SP1 formed over the insulating film IL7 in the second embodiment. Accordingly, in terms of reducing the quantity of the semiconductor particles resulting from the collapse of the selectivity of the epitaxial growth method, the foregoing first embodiment is preferred to the second embodiment.

Third Embodiment

Figure 52:
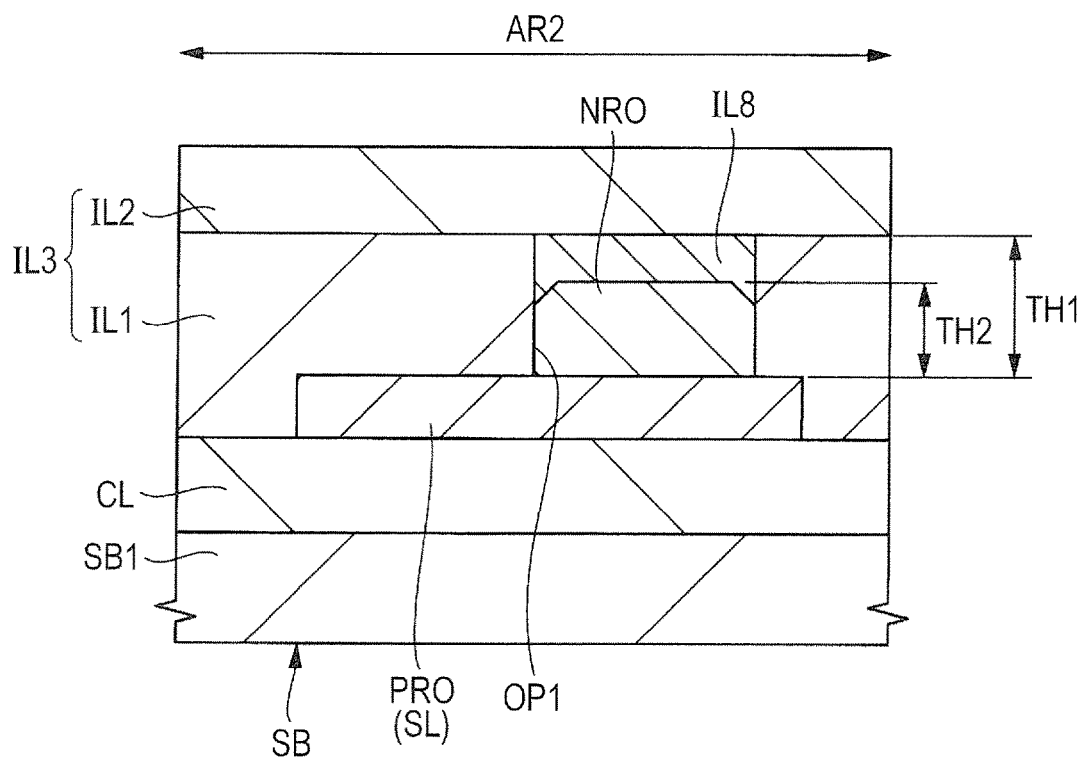
FIG. 52 is a main-portion cross-sectional view of a semiconductor device in a third embodiment.

Referring to FIG. 52, a description will be given of a semiconductor device in a third embodiment. FIG. 52 is a main-portion cross-sectional view of the semiconductor device in the present third embodiment. The semiconductor device in the third embodiment is the same as the semiconductor devices in the foregoing first and second embodiments except for the configuration of the germanium optical receiver formed in the area AR2 shown in FIG. 1. Accordingly, a repeated description thereof is omitted herein, and a description will be given of the configuration of the area AR2. For this reason, FIG. 52 shows only the cross-sectional view of the area AR2. Note that, in FIG. 52, for simpler illustration, the depiction of the contact holes CT, the plugs PG, the interlayer insulating film IL4, and the structure located thereabove which are shown in FIG. 1 described above is omitted.

The semiconductor device in the third embodiment shown in FIG. 52 includes the base SB1, the insulating layer CL formed over the base SB1, the optical waveguides WO1 and WO2 and the p-type semiconductor portion PRO which are formed over the insulating layer CL, and the n-type semiconductor portion NRO formed over the p-type semiconductor portion PRO, similarly to the semiconductor devices in the first and second embodiments described above. Note that the optical waveguide WO2 is shown in FIG. 3 described above, but is not shown in FIGS. 1 and 52 described above.

The semiconductor device in the third embodiment shown in FIG. 52 is different from the semiconductor device in the first embodiment in that, over the n-type semiconductor portion NRO, i.e., between the n-type semiconductor portion NRO and the insulating film IL2, an insulating film (second insulating film) IL8 is formed. The insulating film IL8 is preferably made of a silicon oxide film, and is more preferably made of a silicon oxide film with excellent embeddability.

The contact holes, the plugs, and the wires which are formed in the semiconductor device in the third embodiment are the same as those formed in the semiconductor device in the foregoing first embodiment so that the depiction and description thereof is omitted.

Next, referring to FIGS. 53 to 56, a description will be given of a manufacturing process of the semiconductor device in the third embodiment shown in FIG. 52. FIGS. 53 to 56 are main-portion cross-sectional views of the semiconductor device in the third embodiment during the manufacturing process thereof, which show cross sections equivalent to that shown in FIG. 52 described above. In short, similarly to FIG. 52, FIGS. 53 to 56 show only the cross-sectional views of the area AR2.

In the third embodiment, in the same manner as in the first embodiment, the semiconductor layer SL is patterned to form the semiconductor portion PRO and, using an ion implantation method or the like, a p-type impurity is introduced into the semiconductor portion PRO to change the semiconductor portion PRO into the p-type semiconductor portion PRO. Then, over the insulating layer CL, the insulating film IL1 is formed so as to cover the optical waveguides WO1 and WO2 and the semiconductor portion PRO. After the formation of the insulating film IL1, the upper surface of the insulating film IL1 is planarized, and the opening OP1 is formed in the insulating film IL1. Then, over the p-type semiconductor portion PRO in the opening OP1, the n-type semiconductor portion NRO is formed. At this time, over the insulating film IL1, the semiconductor particles SP1 are formed. In short, the manufacturing process of the semiconductor device in the third embodiment is also substantially the same as the manufacturing process of the semiconductor device in the first embodiment described above until the structure in FIG. 53 equivalent to FIG. 9 described above is obtained.

Figure 53:
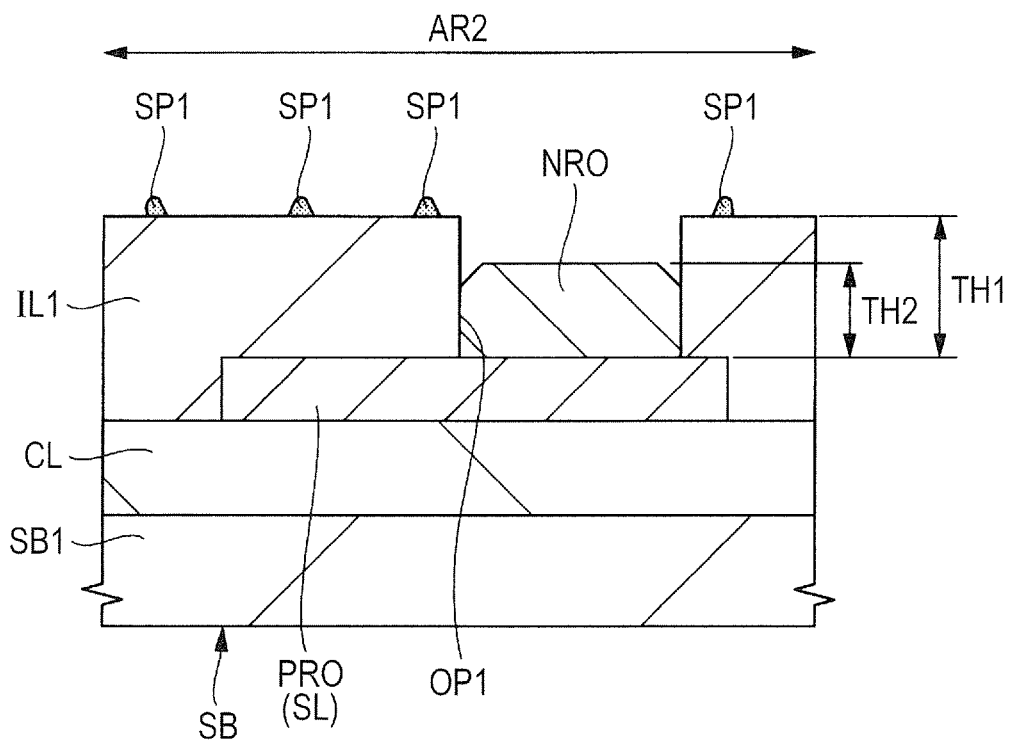
FIG. 53 is a main-portion cross-sectional view of the semiconductor device in the third embodiment during the manufacturing process thereof.

In the case in the third embodiment, after the structure in FIG. 53 described above is obtained, as shown in FIG. 54, the insulating film IL8 is formed over the insulating film IL1 including the n-type semiconductor portion NRO. The insulating film IL8 can be formed preferably using an SACVD method using $O_3$-TEOS as a raw material gas or an SOG method. As a result, the insulating film IL8 is embedded in the opening OP1 to overlie the n-type semiconductor portion NRO.

Figure 55:
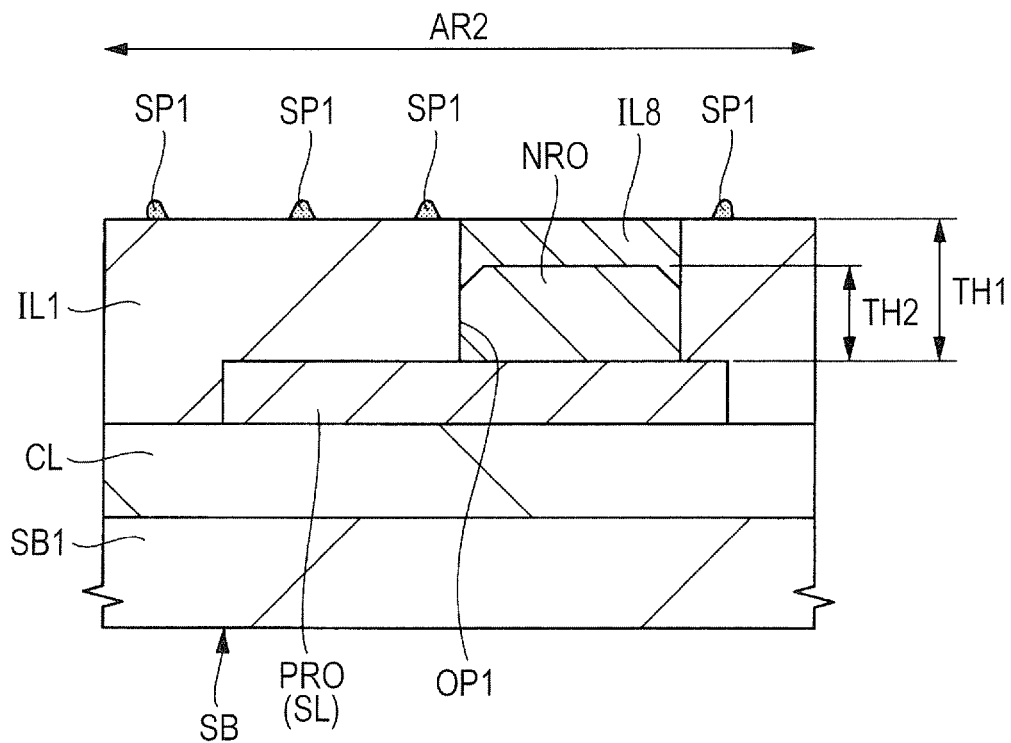
FIG. 55 is a main-portion cross-sectional view of the semiconductor device during the manufacturing process thereof, which is subsequent to FIG. 54.

Next, as shown in FIG. 55, the insulating film IL8 is removed from over the insulating film IL1 to be left only over the n-type semiconductor portion NRO in the opening OP1. As a method of removing the insulating film IL8, dry etching is preferably used and, more preferably, plasma etching using a fluorocarbon gas or the like is used. Each of the insulating film IL1 and the insulating film IL8 is a silicon oxide film. However, the insulating film IL1 is a high-quality (high-density) silicon oxide film, while the insulating film IL8 is a silicon oxide film with excellent embeddability, i.e., a low-density silicon oxide film. Accordingly, the speed of etching the insulating film IL8 is higher than the speed of etching the insulating film IL1. This allows only the insulating film IL8 to be selectively etched.

Note that the insulating film IL8 over the insulating film IL1 may also be removed by a CMP method. An example thereof will be described later in a third modification.

Figure 56:
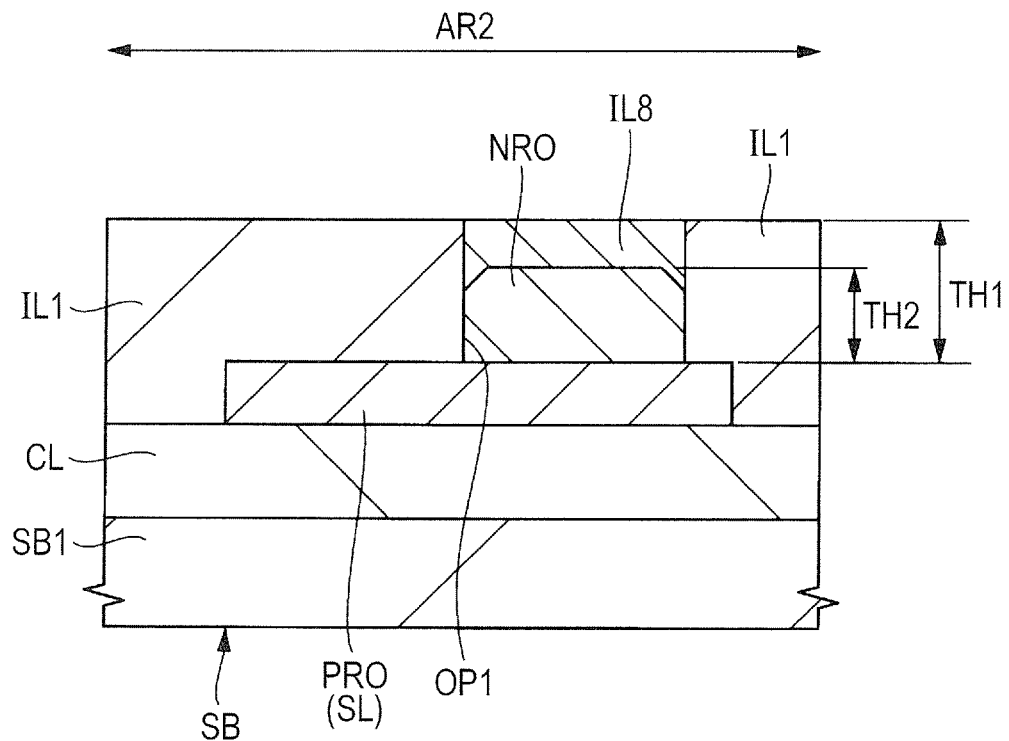
FIG. 56 is a main-portion cross-sectional view of the semiconductor device during the manufacturing process thereof, which is subsequent to FIG. 55.

Next, as shown in FIG. 56, the semiconductor particles SP1 are removed from over the insulating film IL1. The n-type semiconductor portion NRO made of the same material as that of the semiconductor particles SP1 is covered with the insulating film IL8 and the insulating film IL1, and is therefore not removed. As a method of removing the semiconductor particles SP1, a method which does not damage the insulating film IL8 and the insulating film IL1 is used preferably. For example, dry etching using a halogen-based gas is used preferably.

Next, as shown in FIG. 52, over the insulating film IL1 and the insulating film IL8, the insulating film IL2 is formed. After the formation of the insulating film IL2, the upper surface of the insulating film IL2 is subjected to polishing using a CMP method or the like to be planarized.

Subsequently, as necessary, the contact holes, the plugs, and the wires are formed, but the depiction and illustration thereof is omitted.

Figure 54:
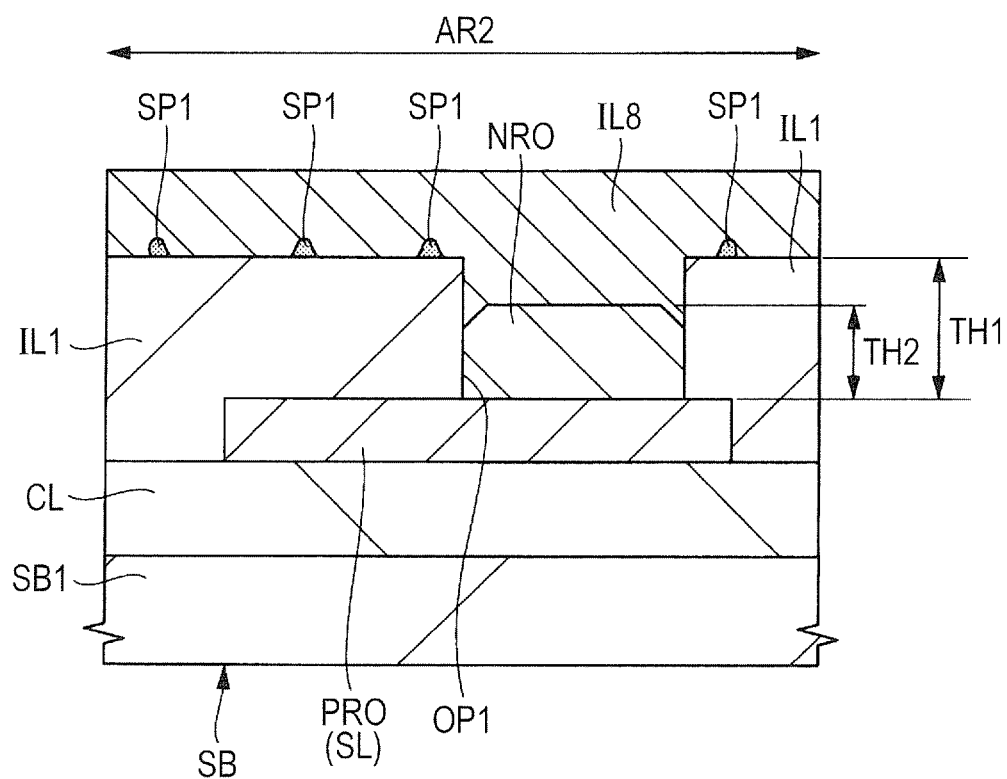
FIG. 54 is a main-portion cross-sectional view of the semiconductor device during the manufacturing process thereof, which is subsequent to FIG. 53.

In the third embodiment, as shown in FIG. 53, the thickness TH2 of the n-type semiconductor portion NRO is set smaller than the thickness TH1 of the insulating film IL1 over the first semiconductor portion (p-type semiconductor portion PRO). In other words, the upper surface of the n-type semiconductor portion NRO is set lower in level than the upper surface of the insulating film IL1. As a result, as shown in FIG. 54, the insulating film IL8 is embedded in the opening OP1 of the insulating film IL1 to overlie the n-type semiconductor portion NRO. Subsequently, the insulating film IL8 is removed in accordance with the upper surface of the insulating film IL1. By doing so, as shown in FIG. 55, it is possible to expose the semiconductor particles SP1 over the insulating film IL1 and leave the insulating film IL8 only over the n-type semiconductor portion NRO in the opening OP1 of the insulating film IL1. The n-type semiconductor portion NRO is covered with the insulating film IL8 and the insulating film IL1. Accordingly, by etching the semiconductor particles SP1 in this state, it is possible to remove only the semiconductor particles SP1 without etching the n-type semiconductor portion NRO made of the same material as that of the semiconductor particles SP1. Then, as shown in FIG. 52, when the insulating film IL2 is formed over the insulating film IL1, a state is established in which, between the insulating film IL1 and the insulating film IL2, the semiconductor particles SP1 are not present. Thus, in the semiconductor device in the third embodiment, in the same manner as in the semiconductor device in the first embodiment, it is possible to prevent a problem resulting from the presence of the semiconductor particles SP1 between the insulating film IL1 and the insulating film IL2 and improve the reliability of the semiconductor device.

In the foregoing first embodiment, after the photoresist film PR is removed from over the n-type semiconductor portion NRO as shown in FIG. 13, the insulating film IL2 is formed over the insulating film IL1 including the n-type semiconductor portion NRO, as shown in FIG. 14. By contrast, the third embodiment is different from the foregoing first embodiment in that, as shown in FIG. 52, the insulating film IL8 in the opening OP1 is not removed, and the insulating film IL2 is formed over the insulating film IL1 including the insulating film IL8. As a result, the step of removing the photoresist film PR performed in the foregoing first embodiment is unnecessary. Therefore, in the third embodiment, the manufacturing cost of the semiconductor device can be reduced compared to that in the foregoing first embodiment.

Note that, in the foregoing first embodiment, as shown in FIG. 14, to reliably embed the silicon oxide film in the gap between the n-type semiconductor portion NRO and the insulating film IL1, over the insulating film IL1 (and the insulating film IL8), the insulating film IL2 is formed of the silicon oxide film with excellent embeddability. By contrast, in the third embodiment, the insulating film IL8 is embedded in the gap between the n-type semiconductor portion NRO and the insulating film IL1. Accordingly, the insulating film IL2 formed over the insulating film IL1 (and the insulating film IL8) can also be formed of a high-quality (high-density) silicon oxide film. This allows the optical waveguides WO1 and WO2 and the germanium optical receiver PD which are located below the insulating film IL2 to be protected from moisture absorption or the like during the manufacturing process of the semiconductor device in the third embodiment.

Also, in the third embodiment, as shown in FIG. 56, the insulating film IL8 is exposed to dry etching for removing the semiconductor particles SP1. Then, as shown in FIG. 52, the insulating film IL2 is formed over the insulating film IL8. Specifically, over the n-type semiconductor portion NRO, the insulating film IL8 exposed to the dry etching remains. On the other hand, in the foregoing first embodiment, as shown in FIG. 13, the photoresist film PR exposed to the dry etching for removing the semiconductor particles SP1 is removed by asking and, as shown in FIG. 14, the insulating film IL2 is newly formed over the n-type semiconductor portion NRO. Thus, in terms of reliably preventing a loss in the optical property of the germanium optical receiver PD, the foregoing first embodiment which allows a high-quality insulating film to be formed over the n-type semiconductor portion NRO is advantageous over the third embodiment.

(Third Modification)

Figure 57:
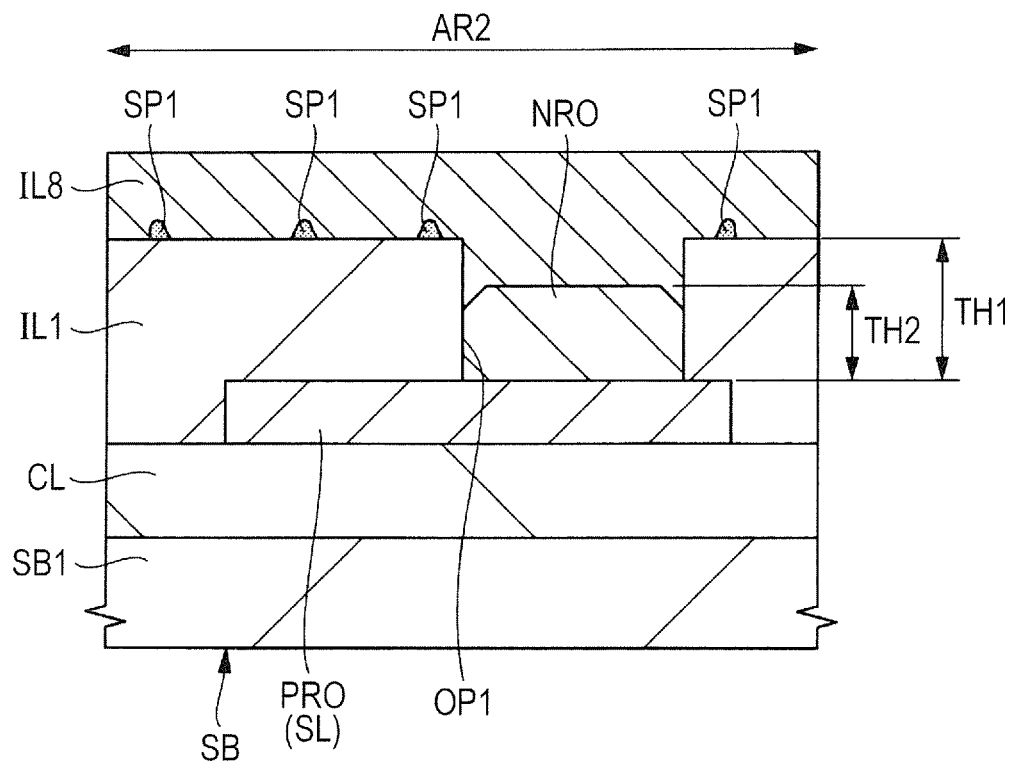
FIG. 57 is a main-portion cross-sectional view of a semiconductor device in a third modification during the manufacturing process thereof.
Figure 58:
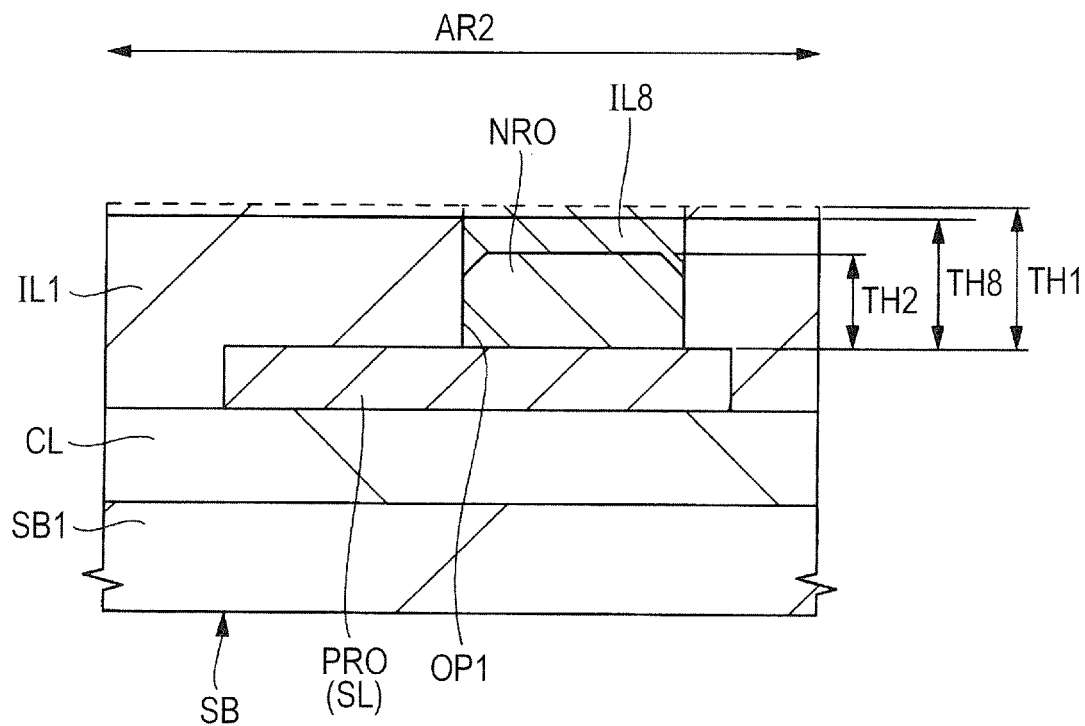
FIG. 58 is a main-portion cross-sectional view of the semiconductor device during the manufacturing process thereof, which is subsequent to FIG. 57.

Referring to FIGS. 57 and 58, a description will be given of a manufacturing process of a semiconductor device in a modification (hereinafter referred to as a third modification) of the third embodiment. FIGS. 57 and 58 are main-portion cross-sectional views of the semiconductor device in the third modification during the manufacturing process thereof, which show only the cross-sectional views of the area AR2.

In the case in the third modification, the manufacturing process of the semiconductor device is substantially the same as the manufacturing process of the semiconductor device in the third embodiment until the structure in FIG. 57 equivalent to FIG. 53 described above is obtained.

In the case in the third modification, after the structure in FIG. 57 described above is obtained, as shown in FIG. 58, the insulating film IL8 over the insulating film IL1 is polished by a CMP method to be left only over the n-type semiconductor portion NRO in the opening OP1. At this time, by further polishing the insulating film IL1 and the insulating film IL8 by a CMP method, the semiconductor particles SP1 can be removed from over the insulating film IL1. At this stage, as shown in FIG. 58, the thickness TH2 of the n-type semiconductor portion NRO formed in the opening OP1 of the insulating film IL1 is set smaller than a thickness TH8 of the insulating film IL1 over the p-type semiconductor portion PRO after the insulating film IL1 is polished by the CMP method. As a result, during the polishing using the CMP method, the insulating film IL8 is left over the n-type semiconductor portion NRO. This allows the semiconductor particles SP1 to be removed without damaging the n-type semiconductor portion NRO.

As shown in FIG. 58, the third modification is different from the foregoing third embodiment in that the step of leaving the insulating film IL8 only over the n-type semiconductor portion NRO in the opening OP1 and the step of removing the semiconductor particles SP1 are performed in one step. As a result, the step of removing the semiconductor particles SP1 performed in the foregoing third embodiment is unnecessary. Therefore, in the third modification, the manufacturing cost of the semiconductor device can be reduced compared to that in the foregoing third embodiment.

On the other hand, the third modification includes the step of removing the insulating film IL8 by the CMP method. Accordingly, the manufacturing cost of the semiconductor device may increase compared to that in the foregoing third embodiment. In addition, in the third modification, as shown in FIG. 58, when the semiconductor particles SP1 are removed from over the insulating film IL1 by the CMP method, the removed semiconductor particles SP1 may possibly act as a rough abrading agent and cause a defect over the insulating film IL1. From such a viewpoint, the foregoing third embodiment is advantageous over the third modification.

While the invention achieved by the present inventors has been specifically described heretofore on the basis of the embodiments thereof, the present invention is not limited to the embodiments described above. It will be appreciated that various changes and modifications can be made in the invention within the scope not departing from the gist thereof.

The following is provided as additional description of what corresponds to the content of the description of the foregoing embodiments or parts thereof.

(Note 1)

A semiconductor device, includes:

a substrate having a first layer made of a semiconductor layer or a conductor layer entirely or partially over a main surface thereof;

a first insulating film formed over the main surface of the substrate so as to cover the first layer;

an opening formed in the first insulating film to reach the first layer;

an epitaxial layer formed over the first layer exposed at a bottom surface of the opening to have a thickness smaller than that of the first insulating film over the first layer; and a second insulating film formed over the first insulating film so as to cover the epitaxial layer.

(Note 2)

A semiconductor device, includes:

a base;

an insulating layer formed over the base;

a first semiconductor portion formed over the insulating layer;

a first insulating film formed over the insulating layer so as to cover the first semiconductor portion;

an opening formed in the first insulating film to reach the first semiconductor portion;

a second semiconductor portion made of an epitaxial layer formed over the first semiconductor portion exposed at a bottom surface of the opening to have a thickness smaller than that of the first insulating film over the first semiconductor portion; and a second insulating film formed over the first insulating film so as to cover the second semiconductor portion.

(Note 3)

In a semiconductor device according to Note 2, the first semiconductor portion is made of silicon, the second semiconductor portion is made of a material including germanium, and the first semiconductor portion and the second semiconductor portion form a photoelectric conversion portion which converts an optical signal to an electric signal.

What is claimed is:

1. A method of manufacturing a semiconductor device, comprising: (a) providing a substrate having a first layer made of a semiconductor layer or a conductor layer entirely or partially over a main surface thereof; (b) forming a first insulating film over the substrate so as to cover the first layer therewith; (c) forming an opening extending through the first insulating film and reaching the first layer; (d) forming, over the first layer exposed at a bottom surface of the opening, a first semiconductor layer having a thickness smaller than that of the first insulating film over the first layer by a selective epitaxial growth method; (e) forming a second insulating film over the first insulating film and over the first semiconductor layer; (f) removing the second insulating film from over the first insulating film, while leaving the second insulating film over the first semiconductor layer in the opening; (g) removing a semiconductor particle formed over the first insulating film in (d); and (h) forming a third insulating film over the first insulating film.

2. The method of manufacturing the semiconductor device according to claim 1,
wherein the (a) includes:
(a1) providing the substrate including a base, an insulating layer formed over the base, and a second semiconductor layer formed over the insulating layer; and
(a2) patterning the second semiconductor layer to form a first semiconductor portion made of the second semiconductor layer over the insulating layer,
the method of manufacturing the semiconductor device further comprising, after the (b) and before the (c):
(i) planarizing an upper surface of the first insulating film.

3. The method of manufacturing the semiconductor device according to claim 1,
wherein the second insulating film is a photoresist film,
the method of manufacturing the semiconductor device further comprising, after the (g) and before the (h):
(j) removing the second insulating film covering the first semiconductor layer in the opening,
wherein, in the (h), the third insulating film is formed so as to cover the first semiconductor layer.

4. The method of manufacturing the semiconductor device according to claim 1,
wherein the second insulating film is a silicon oxide film formed by an SOG method or an SACVD method using $O_3$-TEOS as a raw material.

5. The method of manufacturing the semiconductor device according to claim 2,
wherein the first semiconductor layer and the semiconductor particle are made of a material including germanium,
wherein the second semiconductor layer is made of silicon, and
wherein the first semiconductor portion and a second semiconductor portion made of the first semiconductor layer over the first semiconductor portion form a photoelectric conversion portion which converts an optical signal to an electric signal.

6. The method of manufacturing the semiconductor device according to claim 2, further comprising, after the (d) and before the (e):
(k) forming a cap layer made of silicon or silicon germanium over the first semiconductor layer by a selective epitaxial growth method,
wherein, in the (g), the semiconductor particle formed over the first insulating film in the (d) and a silicon particle or a silicon germanium particle formed over the first insulating film in the (k) are removed.

7. The method of manufacturing the semiconductor device according to claim 1,
wherein the first insulating film and the third insulating film are made of a silicon oxide film.

8. The method of manufacturing the semiconductor device according to claim 1,
wherein the third insulating film is a silicon oxide film formed by an SOG method or an SACVD method using $O_3$-TEOS as a raw material.

9. The method of manufacturing the semiconductor device according to claim 1,
wherein, in the (g), the semiconductor particle is removed by dry etching.

* * * * *